US012759086B2

(12) United States Patent
Yamazaki et al.

(10) Patent No.: US 12,759,086 B2
(45) Date of Patent: *Oct. 13, 2026

(54) LASER PROCESSING APPARATUS

(71) Applicant: Semiconductor Energy Laboratory Co., Ltd., Atsugi (JP)

(72) Inventors: Shunpei Yamazaki, Setagaya (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 821 days.

This patent is subject to a terminal disclaimer.

(21) Appl. No.: 17/900,966

(22) Filed: Sep. 1, 2022

(65) Prior Publication Data

US 2023/0001517 A1 Jan. 5, 2023

Related U.S. Application Data

(63) Continuation of application No. 16/344,178, filed as application No. PCT/IB2017/056639 on Oct. 26, 2017, now Pat. No. 11,433,486.

(30) Foreign Application Priority Data

Nov. 3, 2016 (JP) ................................. 2016-215738
Nov. 15, 2016 (JP) ................................. 2016-222194

(51) Int. Cl.
*B23K 26/50* (2014.01)
*B23K 26/064* (2014.01)
(Continued)

(52) U.S. Cl.
CPC ............ *B23K 26/50* (2015.10); *B23K 26/064* (2015.10); *B23K 26/0738* (2013.01);
(Continued)

(58) Field of Classification Search
None
See application file for complete search history.

(56) References Cited

U.S. PATENT DOCUMENTS 3,549,733 A 12/1970 Caddell
5,128,512 A 7/1992 Seki
(Continued)

FOREIGN PATENT DOCUMENTS

CN 101331592 A 12/2008
CN 102341211 A 2/2012
(Continued)

OTHER PUBLICATIONS

International Search Report (Application No. PCT/IB2017/056639) Dated Jan. 9, 2018.
(Continued)

*Primary Examiner* — Ibrahime A Abraham
(74) *Attorney, Agent, or Firm* — Eric J. Robinson; Robinson Intellectual Property Law Office, P.C.

(57) ABSTRACT

A laser processing apparatus and a stack processing apparatus are provided. The laser processing apparatus includes a laser oscillator and an optical system for forming a linear beam and an x-y-θ or x-θ stage. With use of the x-y-θ or x-θ stage, the object to be processed can be moved and rotated in the horizontal direction. With this operation, a desired region of the object to be processed can be efficiently irradiated with laser light, and the area occupied by a chamber provided with the x-y-θ or x-θ stage can be made small.

12 Claims, 38 Drawing Sheets

(51) Int. Cl.

| | |
|---|---|
| ***B23K 26/073*** | (2006.01) |
| ***B23K 26/08*** | (2014.01) |
| ***B32B 43/00*** | (2006.01) |
| *H10P 72/00* | (2026.01) |

(52) U.S. Cl.

CPC ............ *B23K 26/08* (2013.01); *B32B 43/006* (2013.01); *H10P 72/0436* (2026.01)

(56) References Cited

U.S. PATENT DOCUMENTS

| | | | | |
|---|---|---|---|---|
| 5,432,122 | A | 7/1995 | Chae | |
| 5,948,292 | A | 9/1999 | Tanaka et al. | |
| 6,096,581 | A | 8/2000 | Zhang et al. | |
| 6,172,820 | B1 | 1/2001 | Kuwahara | |
| 6,509,212 | B1 | 1/2003 | Zhang et al. | |
| 6,723,590 | B1 | 4/2004 | Zhang et al. | |
| 7,504,288 | B1 | 3/2009 | Zhang et al. | |
| 8,455,790 | B2 | 6/2013 | Tanaka et al. | |
| 8,815,705 | B2 | 8/2014 | Kato | |
| 9,088,006 | B2 | 7/2015 | Yamazaki et al. | |
| 9,333,736 | B2 | 5/2016 | Kumakura et al. | |
| 9,437,831 | B2 | 9/2016 | Yamazaki et al. | |
| 9,559,316 | B2 | 1/2017 | Yamazaki et al. | |
| 9,559,317 | B2 | 1/2017 | Yamazaki et al. | |
| 9,627,648 | B2 | 4/2017 | Yamazaki et al. | |
| 9,682,544 | B2 | 6/2017 | Kumakura et al. | |
| 9,810,648 | B2 | 11/2017 | Takahara | |
| 10,003,047 | B2 | 6/2018 | Yamazaki et al. | |
| 10,137,533 | B2 | 11/2018 | Kim et al. | |
| 10,381,599 | B2 | 8/2019 | Yamazaki et al. | |
| 11,433,486 | B2 * | 9/2022 | Yamazaki | B23K 26/08 |
| 2003/0224587 | A1 | 12/2003 | Yamazaki et al. | |
| 2005/0162630 | A1 | 7/2005 | Novak | |
| 2005/0247684 | A1 | 11/2005 | Tanaka | |
| 2007/0195837 | A1 * | 8/2007 | Miyairi | H01S 3/005 372/55 |
| 2008/0011722 | A1 | 1/2008 | Kobayashi et al. | |
| 2008/0085377 | A1 | 4/2008 | Yamazaki et al. | |
| 2011/0285945 | A1 | 11/2011 | Aihara et al. | |
| 2011/0312115 | A1 | 12/2011 | Kato | |
| 2012/0028404 | A1 | 2/2012 | Frey | |
| 2012/0031147 | A1 | 2/2012 | Arai et al. | |
| 2013/0196455 | A1 | 8/2013 | Shen et al. | |
| 2014/0182785 | A1 | 7/2014 | Kim et al. | |
| 2015/0155505 | A1 | 6/2015 | Yamazaki et al. | |
| 2016/0020117 | A1 * | 1/2016 | Hunter | B23K 26/70 219/121.73 |
| 2016/0243647 | A1 | 8/2016 | Yamazaki et al. | |
| 2016/0247868 | A1 | 8/2016 | Yamazaki et al. | |
| 2017/0133450 | A1 | 5/2017 | Yamazaki et al. | |
| 2017/0334187 | A1 | 11/2017 | Kumakura et al. | |
| 2018/0166524 | A1 | 6/2018 | Yamazaki et al. | |
| 2019/0096977 | A1 | 3/2019 | Yamazaki et al. | |

FOREIGN PATENT DOCUMENTS

| | | | | |
|---|---|---|---|---|
| CN | 104508797 | A | 4/2015 | |
| DE | 19803795 | | 12/1998 | |
| EP | 1235260 | A2 * | 8/2002 | H10P 14/3808 |
| EP | 3026429 | A | 6/2016 | |
| JP | 07-185867 | A | 7/1995 | |
| JP | 10-328867 | A | 12/1998 | |
| JP | 2000-171421 | A | 6/2000 | |
| JP | 3054310 | | 6/2000 | |
| JP | 2000-252228 | A | 9/2000 | |
| JP | 2001-189282 | A | 7/2001 | |
| JP | 2005-000952 | A | 1/2005 | |
| JP | 2008-296269 | A | 12/2008 | |
| JP | 2010-205900 | A | 9/2010 | |
| JP | 2013-239355 | A | 11/2013 | |
| JP | 2014-187066 | A | 10/2014 | |
| JP | 2014-197522 | A | 10/2014 | |
| JP | 2015-173088 | A | 10/2015 | |
| JP | 2015-187701 | A | 10/2015 | |
| JP | 2016-181642 | A | 10/2016 | |
| JP | 2016-184166 | A | 10/2016 | |
| JP | 2016-186634 | A | 10/2016 | |
| JP | 2016-189004 | A | 11/2016 | |
| JP | 2016-189005 | A | 11/2016 | |
| JP | 2017-021355 | A | 1/2017 | |
| JP | 2017-040922 | A | 2/2017 | |
| JP | 2017-040923 | A | 2/2017 | |
| JP | 2017-040924 | A | 2/2017 | |
| KR | 2014-0085117 | A | 7/2014 | |
| KR | 2015-0133119 | A | 11/2015 | |
| WO | WO-2004/110693 | | 12/2004 | |
| WO | WO-2007/122061 | | 11/2007 | |
| WO | WO-2010/101060 | | 9/2010 | |
| WO | WO-2010/101069 | | 9/2010 | |
| WO | WO-2014065168 | A1 * | 5/2014 | B23K 26/066 |
| WO | WO-2015/083029 | | 6/2015 | |

OTHER PUBLICATIONS

Written Opinion (Application No. PCT/IB2017/056639) Dated Jan. 9, 2018.

Chinese Office Action (Application No. 201780067596.9) Dated Nov. 9, 2020.

* cited by examiner

FIG. 2A1
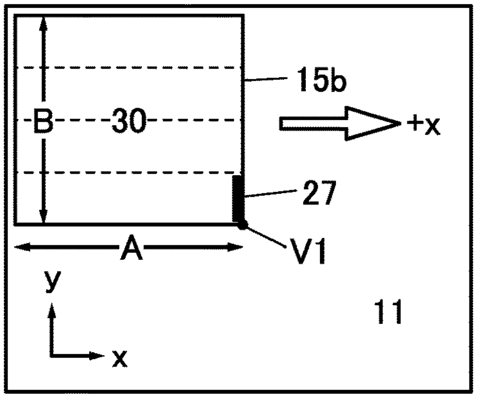
FIG. 2A2
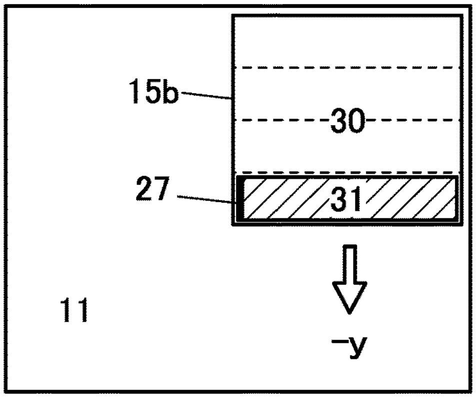
FIG. 2A3
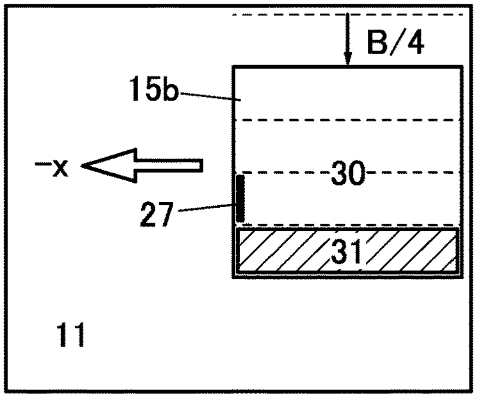
FIG. 2A4
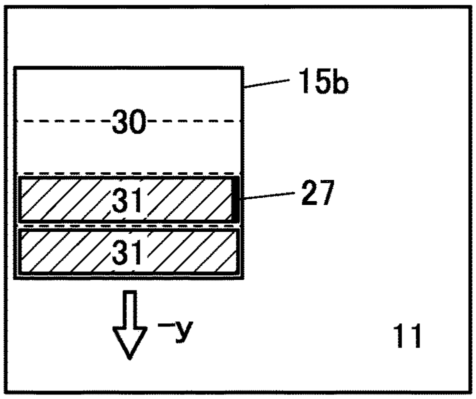
FIG. 2B1
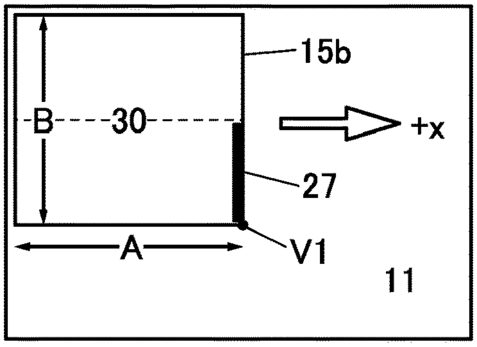
FIG. 2B2
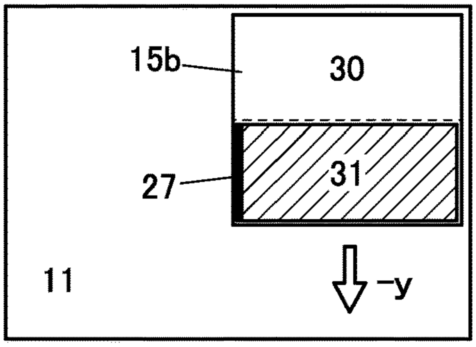
FIG. 2B3
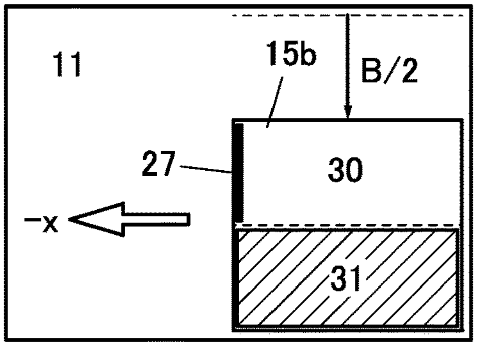
FIG. 2B4
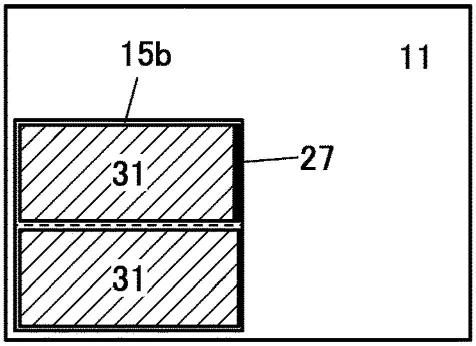

FIG. 4A
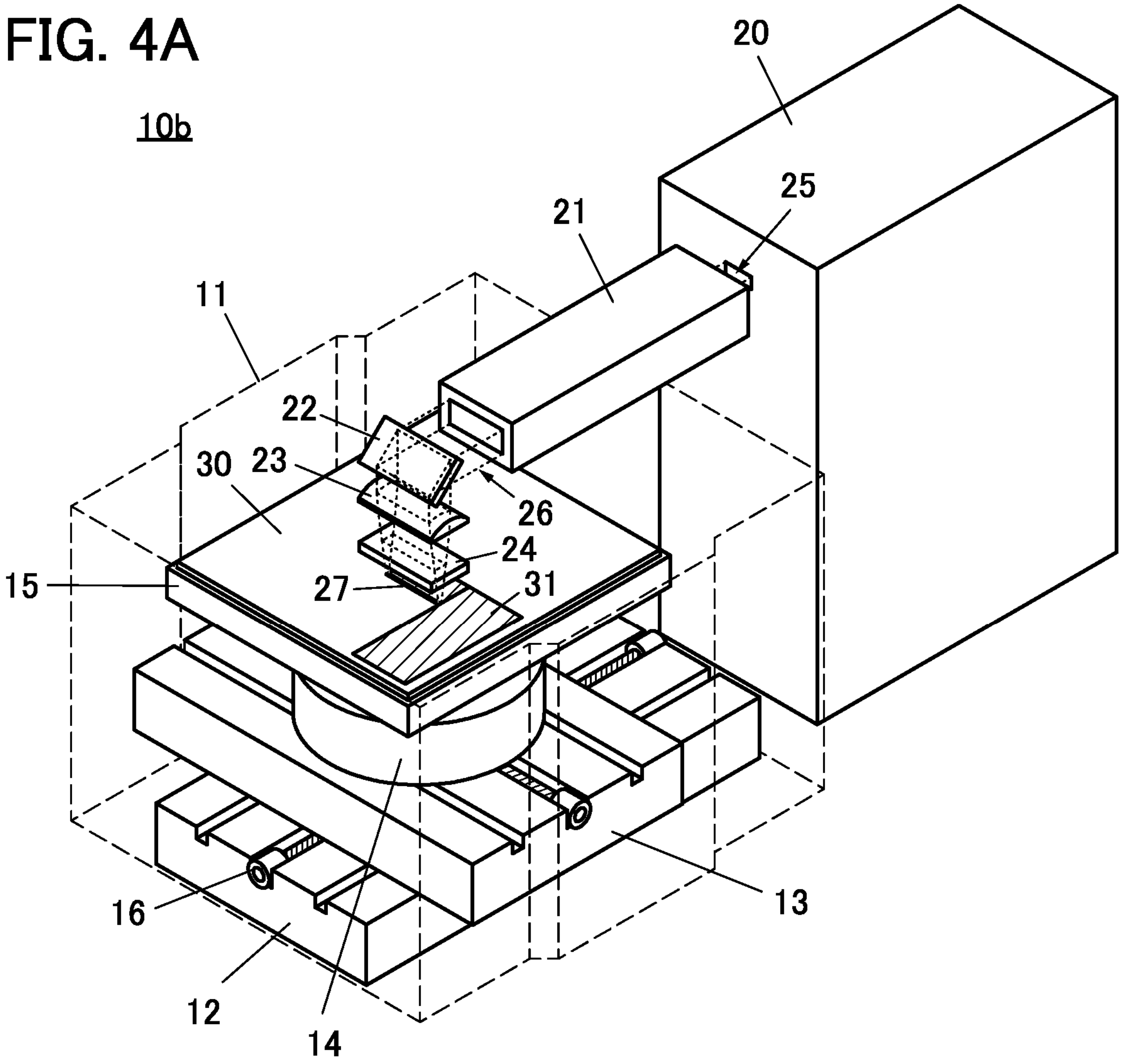
FIG. 4B1
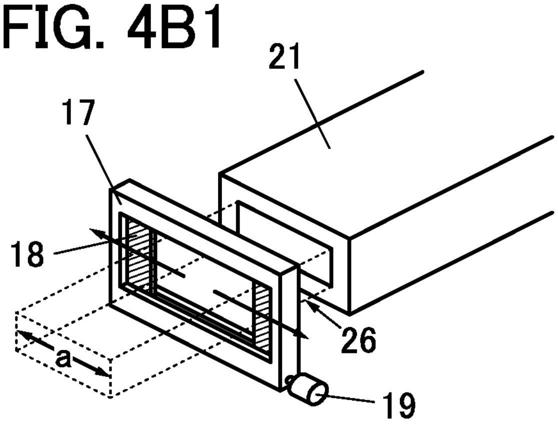
FIG. 4B2
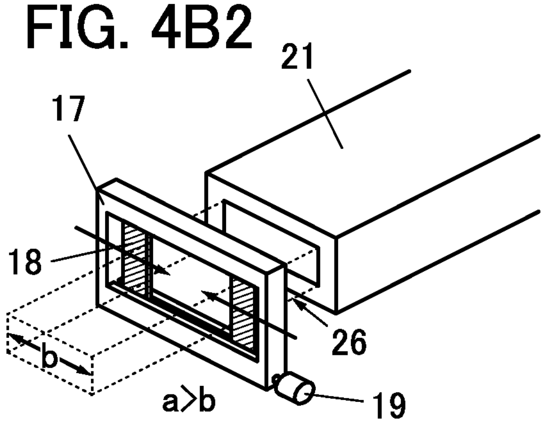

510b

FIG. 31A
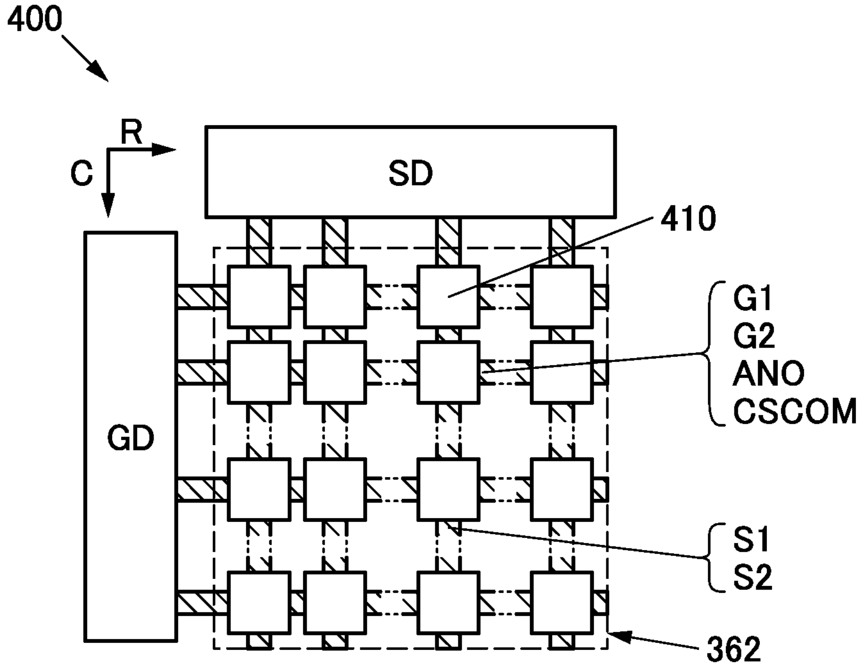
FIG. 31B1
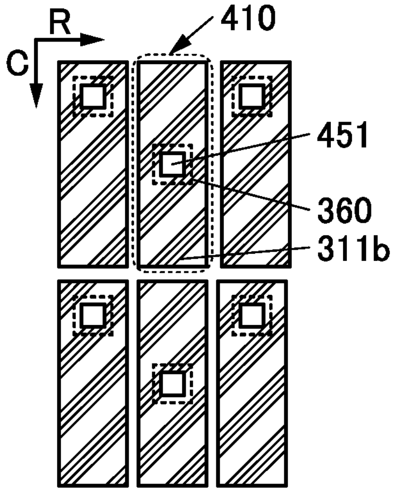
FIG. 31B2
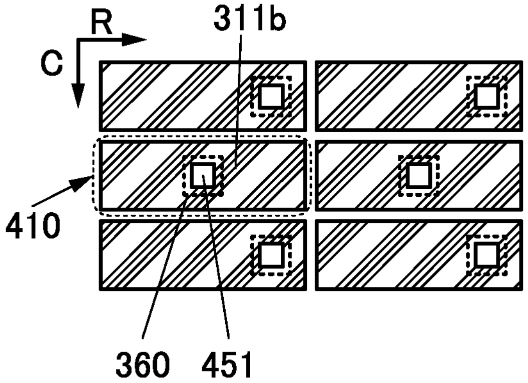

300

LASER PROCESSING APPARATUS

TECHNICAL FIELD

One embodiment of the present invention relates to a laser processing apparatus, a stack processing apparatus, and a laser processing method.

Note that one embodiment of the present invention is not limited to the above technical field. As examples of the technical field of one embodiment of the present invention, a semiconductor device, a display device, a light-emitting device, a power storage device, a memory device, an electronic device, a lighting device, an input device, an input/output device, a method for driving any of them, an apparatus for manufacturing any of them, and a method for manufacturing any of them can be given.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (including a thin film solar cell, an organic thin film solar cell, and the like), and an electronic device may each include a semiconductor device.

BACKGROUND ART

A display device including a display element using a flexible substrate as a support is used for an information terminal or the like. For example, a flexible light-emitting device using an organic EL element is disclosed in Patent Document 1.

In addition, a processing apparatus that can be used for manufacturing flexible light-emitting devices and the like is disclosed in Patent Document 2.

PRIOR ART DOCUMENT

Patent Document

[Patent Document 1] Japanese Published Patent Application No. 2014-197522

[Patent Document 2] Japanese Published Patent Application No. 2015-173088

SUMMARY OF THE INVENTION

Problems to be Solved by the Invention

When a semiconductor element such as a transistor and a display element are formed over a flexible substrate (film), a flexible device, typified by a flexible display, can be achieved. However, flexible substrates have lower heat resistance than glass substrates or the like, and thus, by a method in which transistors or the like are directly formed on flexible substrates, the electrical characteristics and reliability of the transistors cannot be improved in some cases.

Thus, as described in Patent Document 1, a method in which a semiconductor element, a light-emitting element, or the like formed over a glass substrate provided with a separation layer is separated and transferred to a flexible substrate has been considered. In this method, the formation temperature of the semiconductor element can be increased, and a highly reliable flexible device can be manufactured.

Furthermore, in the case where a resin is used for the separation layer, a step of reducing adhesion between the substrate and the resin by irradiation with laser light or the like is used. It is preferable that the laser light have a linear beam shape in view of the productivity.

However, a very expensive large optical component is needed to form a linear beam corresponding to the length of one side of a large glass substrate having the size of G10 (2880×3130 mm) or the like. Furthermore, as the linear beam becomes longer, it is more difficult to secure necessary energy density and thus, a laser oscillator with higher output is also needed. Accordingly, it is preferable that a linear beam that is shorter than the length of one side of the glass substrate be used and a desired region be subjected to laser irradiation several times.

Note that in the case where the beam length is shorter than the length of one side of the glass substrate, mechanisms for moving the linear beam or the glass substrate in the X and Y directions are needed, and thus there is a problem of an increase in the size of an apparatus.

Furthermore, in a manufacturing process of a flexible device, a support substrate such as the above glass substrate is used so that a transfer process, a deposition process, a lithography process, and the like are performed easily. Moreover, the above laser irradiation is performed from the support substrate side.

A laser processing apparatus that performs the above laser irradiation includes a laser oscillator and a moving stage for fixing an object to be processed. The object to be processed is subjected to laser irradiation from above the moving stage. For the moving stage, a linear movement mechanism or the like is used, and the object to be processed is moved while being irradiated with laser light, whereby a desired region of the object to be processed can be irradiated with the laser light.

However, in the case where a desired structure body can be formed over one support substrate, a laser processing apparatus that performs laser irradiation from above the object to be processed is unsuitable. In this case, it is necessary to provide the structure body on the moving stage with the structure body being on the underside. Accordingly, it is necessary to employ a structure of protecting the structure body by provision of another support substrate over the structure body or formation of a robust layer or the like over the structure body. Moreover, a step of removing the another support substrate or the robust layer is needed in some cases.

Accordingly, an object of one embodiment of the present invention is to provide a laser processing apparatus that occupies a small area. Alternatively, an object of one embodiment of the present invention is to provide a laser processing apparatus that occupies a small area and can process a large glass substrate.

Alternatively, an object is to provide a laser processing apparatus that can perform laser irradiation from below an object to be processed. Alternatively, an object is to provide a laser processing apparatus that is easily maintained. Alternatively, an object is to provide an inexpensive laser processing apparatus.

Alternatively, an object is to provide a stack processing apparatus including the above laser processing apparatus and an ashing unit. Alternatively, an object is to provide a novel stack processing apparatus. Alternatively, an object is to provide a laser processing method using the above laser processing apparatus or stack processing apparatus.

Note that the descriptions of these objects do not disturb the existence of other objects. Note that in one embodiment of the present invention, there is no need to achieve all the objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention relates to a laser processing apparatus or a stack processing apparatus.

One embodiment of the present invention is a laser processing apparatus including a first movement mechanism, a second movement mechanism, a rotation mechanism, a fixing mechanism for an object to be processed, and a laser irradiation mechanism, the first movement mechanism includes a first movable portion capable of performing reciprocating linear motion in the horizontal direction, the second movement mechanism includes a second movable portion capable of performing reciprocating linear motion in the horizontal direction, the rotation mechanism includes a third movable portion having a center axis of rotation, the fixing mechanism includes a stage having a flat surface on which the object to be processed is fixed, the stage has a rectangular top surface and has a first side and a second side orthogonal to each other, the laser irradiation mechanism has a function of performing irradiation with a linear beam on the stage, the second movement mechanism is fixed to the first movable portion, the rotation mechanism is fixed to the second movable portion, the fixing mechanism is fixed to the third movable portion, the movement direction of the first movable portion and the movement direction of the second movable portion are orthogonal to each other, the center axis of the third movable portion and the center of the flat surface of the stage have an overlapping region, the length of the linear beam is approximately 1/X (X is an integer of one or more) of the length of the second side, the range of movement of the first movable portion has approximately ½ of the length of the first side, and the range of movement of the second movable portion has a length shorter than the length of the second side by approximately 1/X.

Furthermore, another embodiment of the present invention is a laser processing apparatus including a first movement mechanism, a second movement mechanism, a rotation mechanism, a fixing mechanism for an object to be processed, and a laser irradiation mechanism, the first movement mechanism includes a first movable portion capable of performing reciprocating linear motion in the horizontal direction, the second movement mechanism includes a second movable portion capable of performing reciprocating linear motion in the horizontal direction, the rotation mechanism includes a third movable portion having a center axis of rotation in the perpendicular direction, the fixing mechanism includes a stage having a flat surface to which the object to be processed is fixed, the stage has a rectangular top surface and has a first side and a second side orthogonal to each other, the laser irradiation mechanism has a function of performing irradiation with a linear beam on the stage, the second movement mechanism is fixed to the first movable portion, the rotation mechanism is fixed to the second movable portion, the fixing mechanism is fixed to the center of the third movable portion, the movement direction of the first movable portion and the movement direction of the second movable portion are orthogonal to each other, the center axis of the third movable portion and the center of the flat surface of the stage have an overlapping region, the length of the linear beam is approximately ½X (X is an integer of two or more) of the length of the first side or approximately ½X of the length of the second side, the range of movement of the first movable portion has approximately ½ of the length of the first side of the stage, and the range of movement of the second movable portion has a length shorter than the length of the first side by approximately (X+1)/2X.

Furthermore, another embodiment of the present invention is a laser processing apparatus including a movement mechanism, a rotation mechanism, a fixing mechanism for an object to be processed, and a laser irradiation mechanism, the movement mechanism includes a first movable portion capable of performing reciprocating linear motion in the horizontal direction, the rotation mechanism includes a second movable portion having a center axis of rotation in the perpendicular direction, the fixing mechanism includes a stage having a flat surface to which the object to be processed is fixed, the stage has a rectangular top surface and has a first side and a second side orthogonal to each other, the laser irradiation mechanism has a function of performing irradiation with a linear beam on the stage, the rotation mechanism is fixed to the first movable portion, the fixing mechanism is fixed to the second movable portion, the center axis of the second movable portion and the center of the flat surface of the stage have an overlapping region, the length of the linear beam is approximately ½ of the length of the first side or approximately ½ of the length of the second side, and the range of movement of the first movable portion has approximately ½ of the length of the first side.

It is preferable that the laser irradiation mechanism include a laser oscillator and that the laser oscillator emit ultraviolet light.

Furthermore, another embodiment of the present invention is a laser processing method where an object to be processed which is over a rectangle which is provided over a flat surface and has a first side having a length A and a second side having a length B is irradiated with a linear beam. The laser processing method includes a first step of setting the length of the linear beam at B/X (X is an integer of one or more); a second step of starting irradiation with the linear beam with the vicinity of a first vertex of the object to be processed serving as a starting point of processing; a third step of moving the object to be processed in the direction of the short axis of the linear beam by A/2 and then terminating the irradiation with the linear beam; a fourth step of moving the object to be processed in the direction of the long axis of the linear beam by B/X and then starting the irradiation with the linear beam; and a fifth step of moving the object to be processed in the direction opposite to that in the third step by A/2 and then terminating the irradiation with the linear beam.

Moreover, the above first to fifth steps are included, and after processing of ¼ of the area of the object to be processed is terminated, the following steps may be performed: a sixth step of rotating the object to be processed by 90°; a seventh step of setting the length of the linear beam at A/X; an eighth step of starting the irradiation with the linear beam with the vicinity of a second vertex of the object to be processed serving as a starting point of processing; a ninth step of moving the object to be processed in the direction of the short axis of the linear beam by B/2 and then terminating the irradiation with the linear beam; a tenth step of moving the object to be processed in the direction of the long axis of the linear beam by A/X and then starting the irradiation with the linear beam; and an eleventh step of moving the object to be processed in the direction opposite to that in the ninth step by B/2 and then terminating the irradiation with the linear beam.

Furthermore, another embodiment of the present invention is a laser processing method where an object to be processed which is over a rectangle which is provided over a flat surface and has a first side having a length A and a second side having a length B is irradiated with a linear beam. The laser processing method includes a first step of setting the length of the linear beam at B/2; a second step of starting irradiation with the linear beam with the vicinity of a first vertex of the object to be processed serving as a starting point of processing; a third step of moving the object to be processed in the direction of the short axis of the linear beam by A/2 and then terminating the irradiation with the linear beam; a fourth step of rotating the object to be processed by 90°; a fifth step of setting the length of the linear beam at A/2; a sixth step of starting the irradiation with the linear beam with the vicinity of a second vertex of the object to be processed serving as a starting point of processing; and a seventh step of moving the object to be processed in the direction of the short axis of the linear beam by B/2 and then terminating the irradiation with the linear beam.

Furthermore, another embodiment of the present invention is a laser processing apparatus including a first roller unit, a second roller unit, and a laser irradiation mechanism. The first roller unit and the second roller unit have an overlapping region. The laser irradiation mechanism has a function of irradiating the object to be processed provided over the first roller unit with laser light from below. The first roller unit includes a first frame, a first axis, a first roller, and a first rotation mechanism. The second roller unit includes a second frame, a second axis, a second roller, a second rotation mechanism, a third axis, a third roller, a third rotation mechanism, and a raising and lowering mechanism. The first to third rollers have a circular cylindrical shape. The first frame is provided with the first rotation mechanism. The first axis is connected to the first rotation mechanism. The first axis and the first roller have a region in which their center axes overlap with each other. The second frame is provided with the second rotation mechanism. The second axis is connected to the second rotation mechanism. The second axis and the second roller have a region in which their center axes overlap with each other. The second frame is provided with the third rotation mechanism. The third axis is connected to the third rotation mechanism. The third axis and the third roller have a region in which their center axes overlap with each other. The second frame is provided with the raising and lowering mechanism. The direction of the first axis is orthogonal to the directions of the second axis and the third axis in the horizontal direction. An optical path of the laser light is provided between the second roller and the third roller.

The laser irradiation mechanism can include a laser oscillator, a first mirror, a second mirror, a third mirror, an optical system unit, and a condenser lens. The first mirror can have a function of reflecting, in a downward direction, laser light emitted from the laser oscillator. The second mirror can have a function of reflecting laser light reflected by the first mirror to introduce it into the optical system unit. The optical system unit can have a function of extending and emitting introduced laser light. The third mirror can have a function of reflecting, in an upward direction, laser light emitted from the optical system unit. The condenser lens can have a function of condensing laser light reflected by the third mirror to form a linear beam.

The first roller unit, the second roller unit, the second mirror, the third mirror, the optical system unit, and the condenser lens can be provided in a chamber. At this time, laser light reflected by the first mirror can be introduced through a quartz window provided in the chamber.

Upper portions of the second roller and the third roller can be raised to the position higher than that of an upper portion of the first roller.

Furthermore, another embodiment of the present invention is a laser processing method in which an object to be processed is irradiated with a linear beam, using a transfer mechanism for the object to be processed; a first roller unit including a first roller capable of moving the object to be processed in an X-direction (horizontal direction); and a second roller unit including a region overlapping with the first roller unit and a second roller capable of moving the object to be processed in a Y-direction (horizontal direction) and in a Z direction (perpendicular direction). The object to be processed is placed over the transfer mechanism and transferred to predetermined X and Y positions on the first and second roller units. The second roller is raised to lift the object to be processed from the transfer mechanism. The transfer mechanism is moved outside the first and second roller units. The object to be processed is moved to a desired Y position by rotation of the second roller. The object to be processed is placed over the first roller by lowering of the second roller. The object to be processed is moved to a desired X position by rotation of the first roller. Irradiation with the linear beam is started. The object to be processed is irradiated with the linear beam while being moved in a first X-direction by rotation of the first roller. The irradiation with the linear beam is terminated. The second roller is raised to lift the object to be processed from the first roller. The object to be processed is moved to a desired Y position by rotation of the second roller. The second roller is lowered to place the object to be processed over the first roller. The irradiation with the linear beam is started. The object to be processed is irradiated with the linear beam while being moved in a second X-direction opposite to the first X-direction by rotation of the first roller. The irradiation with the linear beam is terminated. The object to be processed is moved to the predetermined X and Y positions using the first and second rollers. The second roller is raised to lift the object to be processed from the first roller. The transfer mechanism is inserted between the first roller and the object to be processed. The second roller is lowered to place the object to be processed over the transfer mechanism. The transfer mechanism is moved outside the first and second roller units to carry out the object to be processed.

The above object to be processed can include a resin and a light-transmitting substrate, and the resin can be irradiated with the linear beam through the light-transmitting substrate.

Furthermore, another embodiment of the present invention is a stack processing apparatus including the above laser processing apparatus, ashing apparatus, and a transfer apparatus.

Note that in this specification and the like, ordinal numbers such as "first" and "second" are used in order to avoid confusion among components and do not limit the components numerically.

Effect of the Invention

With the use of one embodiment of the present invention, a laser processing apparatus that occupies a small area can be provided. Alternatively, one embodiment of the present invention can provide a laser processing apparatus that occupies a small area and is capable of processing a large glass substrate.

Alternatively, a laser processing apparatus that can perform laser irradiation from below an object to be processed can be provided. Alternatively, a laser processing apparatus that is easily maintained can be provided. Alternatively, an inexpensive laser processing apparatus can be provided.

Alternatively, a stack processing apparatus including the above laser processing apparatus and an ashing unit can be provided. Alternatively, a novel stack processing apparatus can be provided. Alternatively, a laser processing method using the above laser processing apparatus or stack processing apparatus can be provided.

Note that the description of these effects does not disturb the existence of other effects. Note that one embodiment of the present invention does not necessarily achieve all the effects. Note that effects other than these will be apparent from the description of the specification, the drawings, the claims, and the like and effects other than these can be derived from the description of the specification, the drawings, the claims, and the like.

BRIEF DESCRIPTION OF DRAWINGS

FIGS. 2A1-2B4 Diagrams illustrating conventional examples of a laser processing method.

FIGS. 4A-4B2 Diagrams illustrating a laser processing apparatus.

FIGS. 31A-31B2 A diagram illustrating a circuit of a display device and top views illustrating pixels.

MODE FOR CARRYING OUT THE INVENTION

Figure 1A:
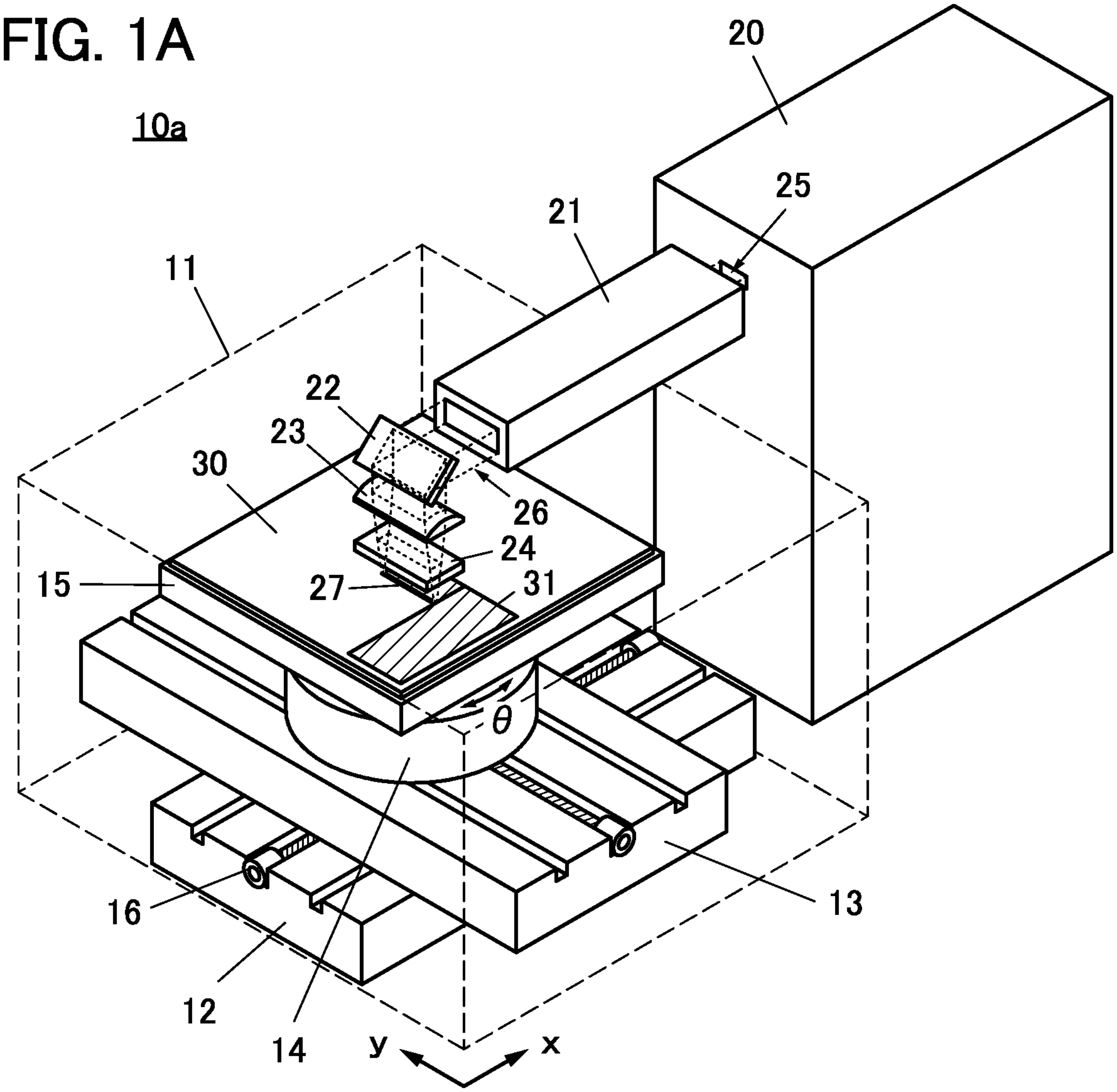
FIGS. 1A-1B Diagrams illustrating a laser processing apparatus.

Embodiments will be described in detail with reference to the drawings. However, the present invention is not limited to the following description, and it will be readily appreciated by those skilled in the art that the modes and details can be modified in various ways without departing from the spirit and the scope of the present invention. Therefore, the present invention should not be interpreted as being limited to the description of embodiments below. Note that in structures of the invention described below, the same reference numerals are used, in different drawings, for the same portions or portions having similar functions, and description thereof is not repeated in some cases.

Embodiment 1

In this embodiment, a laser processing apparatus of one embodiment of the present invention will be described. Note that there is no particular limitation on the application of the laser processing apparatus, but the laser processing apparatus is particularly useful when used in a manufacturing process of a semiconductor device, a display device, a light-emitting device, a power storage device, a power generation device, or the like.

One embodiment of the present invention is a laser processing apparatus that performs irradiation of a flat-plate-like object to be processed with laser light shaped into a linear beam. For example, the laser processing apparatus can be used for an application in which a semiconductor layer provided over a substrate is irradiated with laser light to be modified, and the like. Alternatively, it can be used for an application in which in a structure body including a resin sandwiched between two substrates, the resin is irradiated with laser light transmitted through one of the substrates to separate the one of the substrate, and the like.

The laser processing apparatus includes a laser oscillator and an optical system for forming a linear beam and an x-y-θ or x-θ stage. With the use of the x-y-θ or x-θ stage, the object to be processed can be moved and rotated in the horizontal direction. Through this operation, a desired region of the object to be processed can be efficiently irradiated with laser light, so that the area occupied by a chamber provided with the x-y-θ or x-θ stage can be made small.

FIG. 1(A) is a perspective view illustrating a laser processing apparatus of one embodiment of the present invention. A laser processing apparatus 10*a* includes a movement mechanism 12, a movement mechanism 13, a rotation mechanism 14, and a fixing mechanism 15 for forming the x-y-θ stage in a chamber 11. A laser oscillator 20 and an optical system unit 21, a mirror 22, and a lens 23 for forming a linear beam are also included.

Figure 1B:
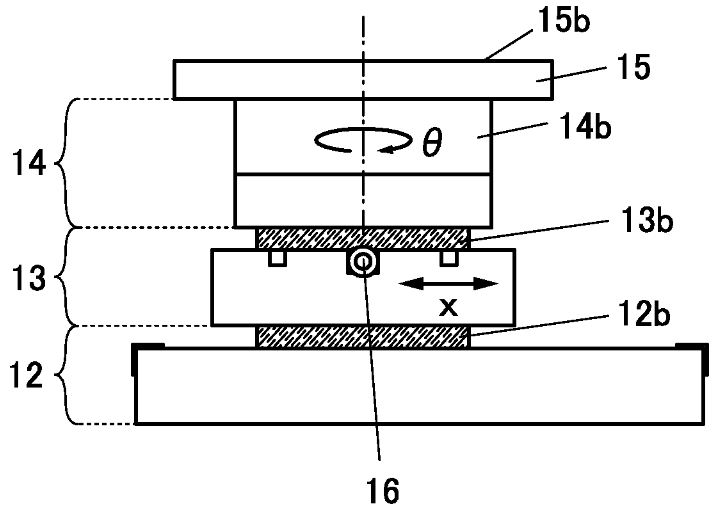

FIG. 1 (B) is a diagram of the x-y-θ stage seen from the horizontal direction. The movement mechanism 12 includes a first movable portion 12*b*, and the movement mechanism 13 includes a second movable portion 13*b*. The first movable portion 12*b* and the second movable portion 13*b* can perform reciprocating linear motion in the horizontal direction. As a mechanism for powering the first movable portion 12*b* and the second movable portion 13*b*, a ball screw mechanism 16 or the like driven by a motor can be used, for example.

The movement mechanism 13 is fixed to the first movable portion 12*b*. Thus, the movement mechanism 13 can perform reciprocating linear motion in the first direction (the x-direction) of the horizontal direction. Here, the movement direction of the first movable portion 12*b* and the movement direction of the second movable portion 13*b* are set to be orthogonal to each other in the horizontal direction. Thus, when the rotation mechanism 14 is fixed to the second movable portion 13*b*, the rotation mechanism 14 can perform a motion in the first direction and a second direction (a y-direction) orthogonal to the first direction.

The rotation mechanism 14 includes a third movable portion 14*b* having a center axis of rotation in the perpendicular direction. The fixing mechanism 15 is fixed to the third movable portion 14*b*. Thus, the fixing mechanism 15 can perform a motion in the rotation direction (θ-direction) in addition to the above-described first direction (the x-direction) and the second direction (the y-direction).

The fixing mechanism 15 includes a stage 15*b* having a flat surface to which an object to be processed 30 is fixed. Note that the object to be processed 30 can be fixed onto the stage 15*b* with a vacuum suction mechanism or the like provided for the fixing mechanism 15. Furthermore, the fixing mechanism 15 may include a heating mechanism as needed. Here, the center axis of the third movable portion 14*b* and the center of the flat surface of the stage 15*b* are fixed to overlap with each other.

The stage 15*b* has a rectangular top surface and has a first side and a second side orthogonal to each other. For example, the first side is regarded as a long side, and the second side is regarded as a short side.

Note that although not illustrated, the fixing mechanism 15 includes a pusher pin and a vertical movement mechanism thereof and thus can move the object to be processed 30 vertically when the object to be processed 30 is carried out of/in the chamber 11.

The laser oscillator 20 is preferably a pulsed laser, but may be a CW laser as long as it outputs light with a wavelength and intensity suitable for the purpose of processing. Typically, an excimer laser that emits ultraviolet light with a wavelength of 351-353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser (a YAG laser, a fiber laser, or the like) may be used. Moreover, a plurality of laser oscillators 20 may be provided.

The optical system unit 21 includes, for example, a mirror, a beam expander, a beam homogenizer, or the like, and homogenizes and expands the in-plane distribution of the energy of laser light 25 emitted from the laser oscillator 20. In one embodiment of the present invention, a beam shape on the processed surface of the object to be processed is a linear shape, and thus laser light 26 emitted from the optical system unit 21 is preferably shaped into a rectangle.

As the mirror 22, a dielectric multilayer mirror can be used, for example, and is provided so that the incident angle of the laser light is substantially 45°. As the lens 23, for example, a cylindrical lens can be used. Furthermore, a quartz window 24 is provided in an upper portion of the chamber 11.

Note that all components other than the laser oscillator 20 may be provided in the chamber 11. The atmosphere in the chamber 11 is controlled in such a structure, for example, whereby deterioration of the optical components such as the mirror or the lens can be prevented. In this case, the quartz window 24 is provided in a region where the laser light 25 enters the chamber.

Note that a glass window can be replaced with the quartz window 24 on the assumption that the linear beam 27 can have the required energy density. Moreover, the quartz window 24 is not necessary in the case of a structure without the chamber 11.

Here, laser irradiation performed on the object to be processed 30 provided on the stage 15*b* included in the fixing mechanism 15 is described.

First, the laser light 25 emitted from the laser oscillator 20 enters the optical system unit 21. Laser light 26 that is extended and shaped into a rectangle by the optical system unit 21 enters the mirror 22. At this time, the laser light 26 may be divided into a plurality of laser beams. Furthermore, although the laser light 26 emitted from the optical system unit 21 is illustrated as parallel light in FIG. 1 and the like, the laser light 26 may be light that expands in the emission direction.

The laser light 26 reflected by the mirror 22 enters the lens 23 and is condensed through the quartz window 24, and thus, a linear beam 27 is formed at a desired position of the object to be processed 30. The stage 15*b* is moved in the horizontal direction in a state where the object to be processed 30 is irradiated with the linear beam 27 as described above, whereby a desired region of the object to be processed 30 can be subjected to laser processing.

Here, the length of the linear beam 27 is ideally greater than or equal to the length of one side of the object to be processed 30. In this case, only by moving the linear beam 27 or the object to be processed 30 in one horizontal direction, the entire object to be processed 30 can be subjected to laser processing. However, a large optical component, which is very expensive, is needed to form a linear beam corresponding to the length of one side of a large glass substrate having the size of G10 or the like.

Furthermore, as the linear beam becomes longer, it is more difficult to secure necessary energy density; therefore, a laser oscillator with higher output is also needed. Accordingly, it is practical to use a linear beam that is shorter than the length of one side of the object to be processed 30 and perform laser irradiation on a desired region several times. For example, as illustrated in FIG. 1, the length of the linear beam 27 can be approximately ¼ of the length of one side of the object to be processed 30.

Note that in the case where the beam length is shorter than the length of one side of the object to be processed 30, a mechanism for moving the linear beam or the object to be processed in the x and y directions is needed, and thus there is a problem that the apparatus becomes larger.

FIGS. 2(A1) to 2(A4) and 2(B1) to 2(B4) are conventional examples, and are diagrams illustrating methods in which the object to be processed 30 is irradiated with the linear beam 27 to form a processed region 31 on the entire surface (effective region). The linear beam 27 shows an irradiation position, and the linear beam 27 is fixed in the vicinity of the center of the chamber 11. Furthermore, the object to be processed 30 can be moved by the movement mechanisms in the x and y directions.

Note that a method for irradiation of the surface of the object to be processed 30 with a linear beam a plurality of times will be described below. Only a desired region of the object to be processed 30 can be irradiated with the linear beam 27 in accordance with the purposes. Alternatively, irradiation of the entire surface of the object to be processed 30 is possible. That is, the processed regions 31 may be formed at intervals, and irradiation with the linear beam 27 may be performed to overlap with part of the processed region 31.

Furthermore, the description is made on the assumption that the size of the stage 15*b* onto which the object to be processed 30 is fixed is the same as the size of the object to be processed 30. Note that the size of the object to be processed 30 may be smaller than that of the stage 15*b*.

FIGS. 2(A1) to 2(A4) illustrate an example of a case in which the linear beam 27 has approximately ¼ of the length of one side of the stage 15*b* (the object to be processed 30).

First, the stage 15*b* is moved in +x direction while irradiation with the linear beam 27 is performed with the vicinity of a first vertex V1 id of the stage 15*b* serving as a starting point of processing (see FIG. 2(A1)).

Next, the stage 15*b* is moved by a distance A corresponding to the length of the first side, and then the irradiation with the linear beam 27 is terminated. Then, the stage 15*b* is moved in −y direction (see FIG. 2(A2)).

The stage 15*b* is moved only by ¼ of a distance B corresponding to the length of the second side, and then the irradiation with the linear beam 27 is started. Then, the stage 15*b* is moved in −x direction (see FIG. 2(A3)).

Next, the stage 15*b* is moved by the distance A, and then the irradiation with the linear beam 27 is terminated (see FIG. 2(A4)). After that, operations similar to the above are performed, and the entire surface of the object to be processed 30 is irradiated with the linear beam 27.

FIGS. 2(B1) to 2(B4) illustrate an example of a case in which the linear beam 27 has approximately ½ of the length of the one side of the stage 15*b*. Although the description of the basic operation is the same as the description of FIGS. 2(A1) to 2(A4), the length of the linear beam 27 is approximately ½ of the length of the one side of the stage 15*b*; therefore, movement in the −y direction is needed only once, and the distance is ½ of the distance B (see FIG. 2(B3)).

In the above conventional examples, the movement range of the first movable portion 12*b* has the length of the first side of the stage 15*b* regardless of the length of the linear beam.

As described above, in the conventional examples, the entire surface of the object to be processed 30 is irradiated with the linear beam 27 by moving the stage 15*b* in the x and y directions; therefore, the area occupied by the chamber 11 needs to be relatively large. In the example illustrated in FIGS. 2(A1) to 2(A4), as for the inside dimension of a floor of the chamber 11, the short side is approximately 7/4 times as long as the second side, the long side is approximately twice as long as the first side, and the area of the floor of the chamber 11 is approximately 3.8 times as large as the area of the stage 15*b*. In the example illustrated in FIGS. 2(B1) to 2(B4), as for the inside dimension of a floor of the chamber 11, the short side is approximately 3/2 times as long as the second side, the long side is approximately twice as long as the first side, and the area of the floor of the chamber 11 is approximately 3.2 times as large as the area of the stage 15*b*.

In one embodiment of the present invention, the movement direction of the stage 15*b* can be not only the conventional x and y directions but also the rotation direction (θ-direction), and the area occupied by the chamber 11 is made small by making one processing distance approximately ½ of the one side of the stage 15*b*.

FIGS. 3(A) to 3(K) are diagrams illustrating operations of the laser processing apparatus 10*a* of one embodiment of the present invention. FIGS. 3(A) to 3(K) illustrate an example of a case in which the linear beam 27 has approximately ¼ of the length of the one side of the stage 15*b*.

FIGS. 3(A) to 3(K) illustrate a method in which one half surface of the object to be processed 30 is irradiated with laser, the object to be processed 30 is rotated by 180°, and the other half surface of the object to be processed 30 is irradiated with the laser.

Figure 3A:
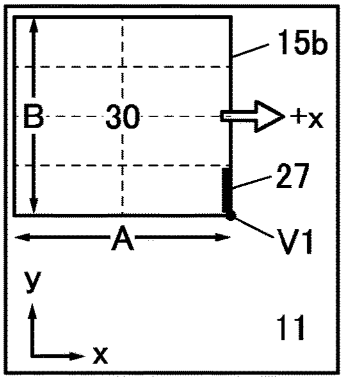
FIGS. 3A-3K Diagrams illustrating a laser processing method.
Figure 3B:
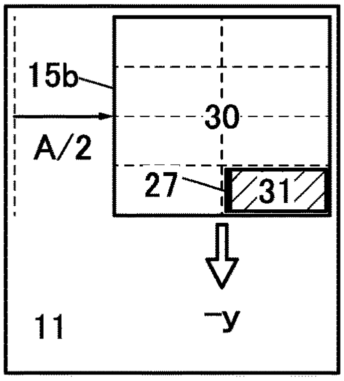
Figure 3C:
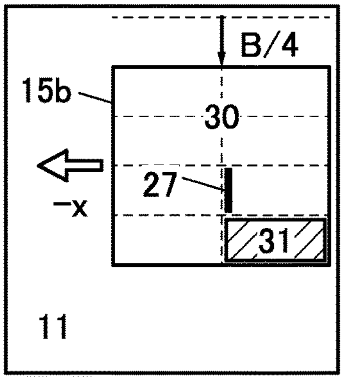
Figure 3D:
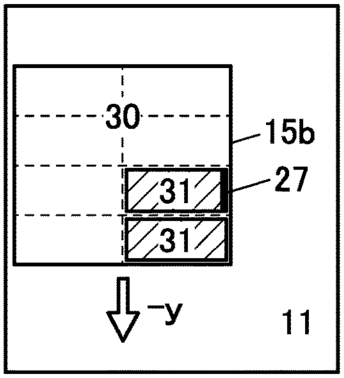
Figure 3E:
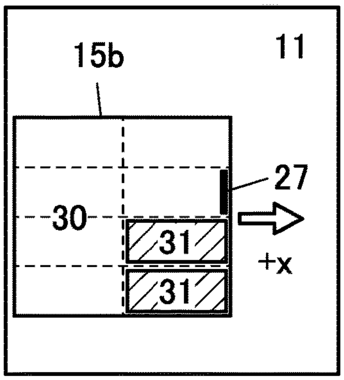
Figure 3F:
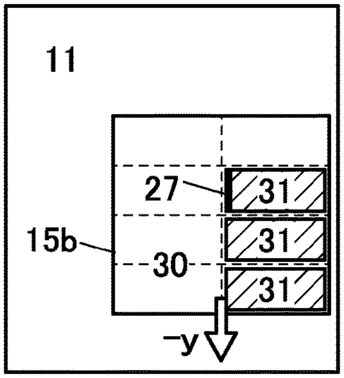
Figure 3G:
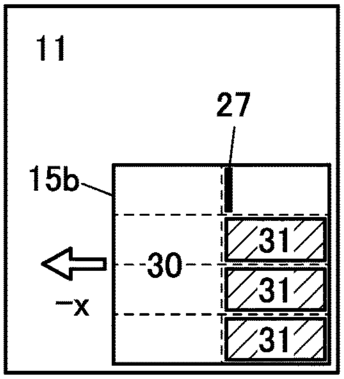

First, the stage 15*b* is moved in the +x direction while irradiation with the linear beam 27 is performed with the vicinity of the first vertex V1 of the stage 15*b* serving as a starting point of processing (see FIG. 3(A)).

Next, the stage 15*b* is moved by approximately ½ of the distance A corresponding to the length of the first side, and then the irradiation with the linear beam 27 is terminated. Then, the stage 15*b* is moved in the −y direction (see FIG. 3(B)).

The stage 15*b* is moved only by ¼ of the distance B corresponding to the length of the second side, and then the irradiation with the linear beam 27 is started. Then, the stage 15*b* is moved in the −x direction (see FIG. 3(C)).

Next, the stage 15*b* is moved by approximately ½ of the distance A corresponding to the length of the first side, and then the irradiation with the linear beam 27 is terminated. Then, the stage 15*b* is moved in the −y direction (see FIG. 3(D)).

Next, the stage 15*b* is moved only by ¼ of the distance B corresponding to the length of the second side, and then the irradiation with the linear beam 27 is started. Then, the stage 15*b* is moved in the +x direction (see FIG. 3(E)).

Next, the stage 15*b* is moved by approximately ½ of the distance A corresponding to the length of the first side, and then the irradiation with the linear beam 27 is terminated. Then, the stage 15*b* is moved in the −y direction (see FIG. 3(F)).

Next, the stage 15*b* is moved only by ¼ of the distance B corresponding to the length of the second side, and then the irradiation with the linear beam 27 is started. Then, the stage 15*b* is moved in the −x direction (see FIG. 3(G)).

Next, the stage 15*b* is moved by approximately ½ of the distance A corresponding to the length of the first side, and then the irradiation with the linear beam 27 is terminated. Then, the stage 15*b* is moved to the center of the chamber 11 (see FIG. 3(H)).

Figure 3H:
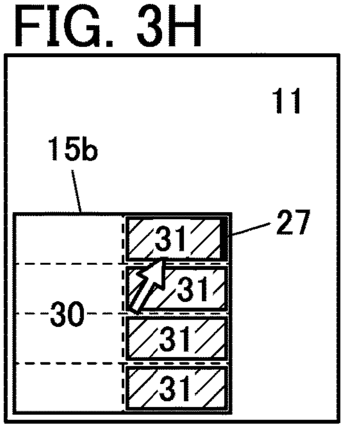
Figure 3I:
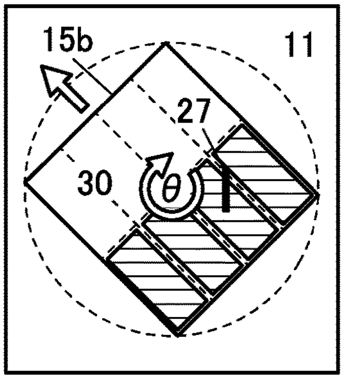
Figure 3J:
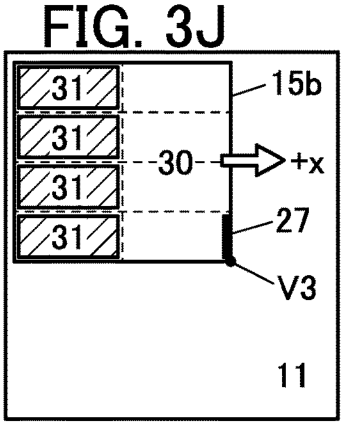
Figure 3K:
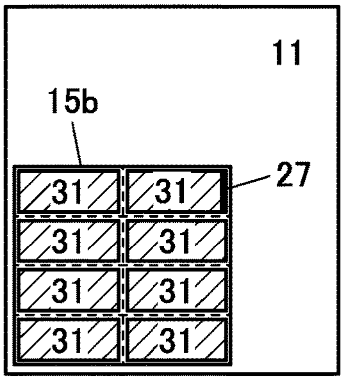

Then, the stage 15*b* is rotated by 180°, and the stage 15*b* is moved to the same position as that in FIG. 3(A) (see FIGS. 3(H) and 3(I)). Hereinafter, with the vicinity of a third vertex V3 of the stage 15*b* serving as a starting point of processing, operations similar to those in FIGS. 3(A) to 3(H) are repeated, and thus the entire surface of the object to be processed 30 is irradiated with the linear beam 27 (see FIGS. 3(J) and 3(K)).

Thus, when the length of the linear beam is ¼ of the second side of the stage 15*b*, the movement range of the first movable portion 12*b* is set to ½ of the length of the first side, and the movement range of the second movable portion 13*b* is set to a length shorter than the length of the second side only by ¼, whereby the entire surface of the object to be processed 30 can be subjected to laser processing. In other words, when the length of the linear beam is 1/X of the second side of the stage 15*b*, the movement range of the second movable portion 13*b* is set to a length shorter than the length of the second side only by 1/X.

Note that each of the above movement range of the first movable portion 12*b* and the above movement range of the second movable portion 13*b* is a minimum value, and the movement ranges may be expanded in a range of 2% or more and 20% or less than the above, preferably in a range of 5% or more and 10% or less than the above, in consideration of maintainability or a reduction in a mechanical load.

On the assumption that operations are performed in the above manner, as for the inside dimension of the floor of the chamber 11, the short side can be at least approximately 3/2 times as long as the first side, and the long side can be at least approximately 7/4 times as long as the second side. At this time, the area of the floor in the chamber 11 is approximately 2.8 times as large as the area of the stage 15*b*. In the conventional examples, the area of the floor in the chamber 11 is approximately 3.8 times. Thus, the occupation area can be significantly reduced.

Furthermore, the laser processing apparatus of one embodiment of the present invention may have a structure illustrated in FIG. 4(A). A laser processing apparatus 10*b* illustrated in FIG. 4(A) includes the same components as the laser processing apparatus 10*a*. Note that as an operation method different from that in the laser processing apparatus 10*a* is assumed, the movement range of the second movable portion 13*b* included in the movement mechanism 13 can be made smaller than that in the laser processing apparatus 10*a*. Accordingly, the inside dimension of the floor of the chamber 11 can be further reduced.

Moreover, as illustrated in FIGS. 4(B1) and 4(B2), a variable light-blocking mechanism 17 that controls the length of the beam is provided in an optical path of the laser light 26. Making the length of the beam variable by the light-blocking mechanism 17 makes it possible to deal with a case where irradiation with the linear beam 27 is performed in a position parallel to the first side of the object to be processed 30 and a case where irradiation with the linear beam 27 is performed in a position parallel to the second side of the object to be processed 30.

The light-blocking mechanism 17 includes one shielding plate 18 on each of the right and left and can adjust the length of an opening at the center by sliding the shielding plates using a motor 19 as power. FIG. 4(B1) is a diagram illustrating a state where the shielding plates are slid in a direction in which the beam length is increased, and the beam length is represented as a. FIG. 4(B1) is a diagram illustrating a state where the shielding plates are slid in a direction in which the beam length is reduced, and the beam length is represented as b (a>b).

Note that although FIGS. 4(B1) and 4(B2) each illustrate an example where the light-blocking mechanism 17 is provided between the optical system unit 21 and the mirror 22 (not illustrated), there is no such limitation. The light-blocking mechanism 17 may be provided in any region between the mirror 22 and the fixing mechanism 15.

Note that the light-blocking mechanism 17 is not necessarily used in the case where laser irradiation performed to overlap with the processed region 31 does not cause a problem or in the case where irradiation of the outside of the object to be processed 30 with part of the linear beam 27 does not cause a problem.

FIGS. 5(A) to 5(L) are diagrams illustrating operations of the laser processing apparatus 10*b* which is one embodiment of the present invention and illustrated in FIGS. 4(A) and 4(B). FIGS. 5(A) to 5(L) illustrate an example of a case in which the linear beam 27 has approximately ¼ of the length of the one side of the stage 15*b*.

FIGS. 5(A) to 5(L) illustrate a method in which a first region that is ¼ of the object to be processed 30 is subjected to laser irradiation, the object to be processed 30 is rotated by 90°, and a second region that is ¼ of the object to be processed 30 is subjected to laser irradiation. In the method, by repetition of rotation and laser irradiation, the entire surface of the object to be processed 30 can be subjected to laser irradiation.

Figure 5A:
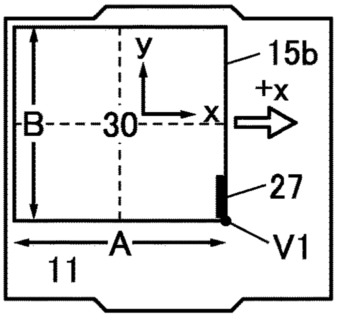
FIGS. 5A-5L Diagrams illustrating a laser processing method.
Figure 5B:
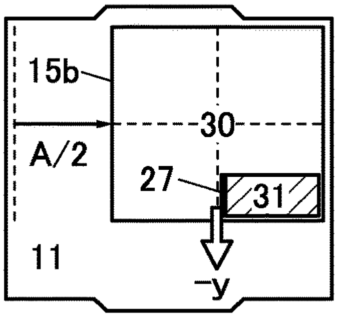
Figure 5C:
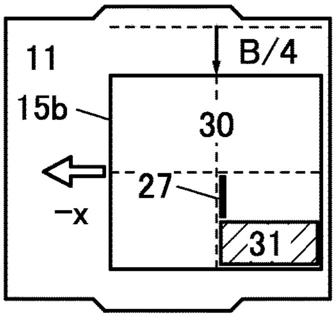
Figure 5D:
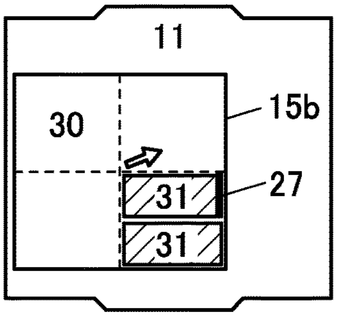

First, the stage 15*b* is moved in the +x direction while irradiation with the linear beam 27 is performed with the vicinity of the first vertex V1 serving as a starting point of processing (see FIG. 5(A)). Moreover, at this time, the light-blocking mechanism 17 is operated such that the length of the linear beam 27 is approximately ¼ of a length B of the second side (see FIG. 4(B2)).

Next, the stage 15*b* is moved by approximately ½ of the distance A corresponding to the length of the first side, and then the irradiation with the linear beam 27 is terminated. Then, the stage 15*b* is moved in the −y direction (see FIG. 5(B)).

Next, the stage 15*b* is moved only by ¼ of the distance B corresponding to the length of the second side, and then the irradiation with the linear beam 27 is started. Then, the stage 15*b* is moved in the −x direction (see FIG. 5(C)).

Next, the stage 15*b* is moved by approximately ½ of the distance A corresponding to the length of the first side, and then the irradiation with the linear beam 27 is terminated. Then, the stage 15*b* is moved to the center of the chamber 11 (see FIG. 5(D)).

Figure 5E:
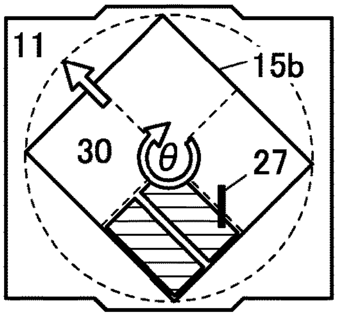
Figure 5F:
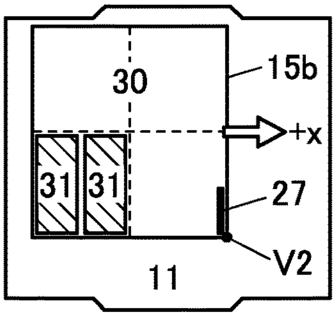
Figure 5G:
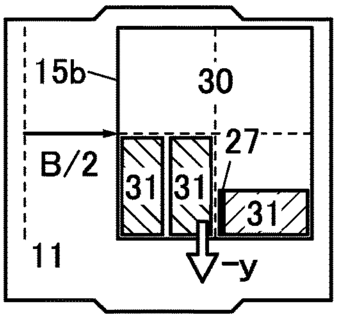
Figure 5H:
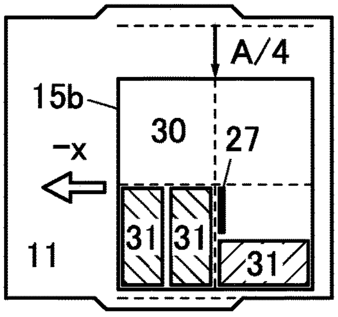
Figure 5I:
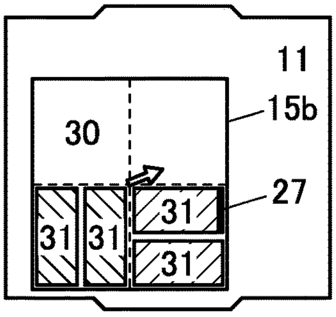

Then, the stage 15*b* is rotated by 90°, and the stage 15*b* is moved in the −x and +y directions such that the vicinity of a second vertex V2 of the stage 15*b* serves as a starting point of processing (see FIGS. 5(E) and 5(F)). Moreover, at this time, the light-blocking mechanism 17 is operated such that the length of the linear beam 27 is approximately ¼ of a length A of the first side (see FIG. 4(B1)).

Next, the stage 15*b* is moved by approximately ½ of a distance B corresponding to the length of the second side, and then the irradiation with the linear beam 27 is started. Then, the stage 15*b* is moved in the −y direction (see FIG. 5 (G)).

Next, the stage 15*b* is moved only by ¼ of the distance A corresponding to the length of the first side, and then the irradiation with the linear beam 27 is started. Then, the stage 15*b* is moved in the −x direction (see FIG. 5(H)).

Next, the stage 15*b* is moved by approximately ½ of the distance B corresponding to the length of the first side, and then the irradiation with the linear beam 27 is terminated. Then, the stage 15*b* is moved to the center of the chamber 11 (see FIG. 5(I)).

Figure 5J:
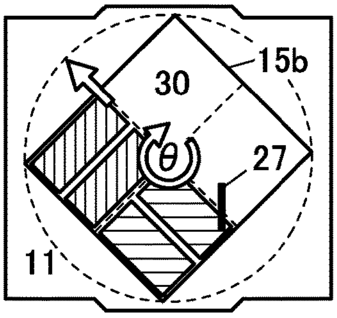
Figure 5K:
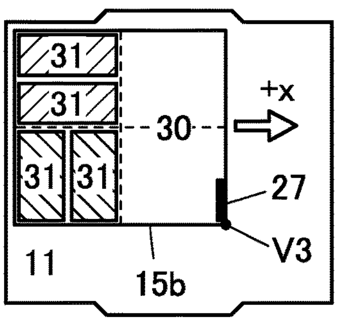

Then, the stage 15*b* is rotated by 90°, and the stage 15*b* is moved in the −x and +y directions such that the vicinity of the third vertex of the stage 15*b* serves as a starting point of processing (see FIGS. 5(J) and 5(K)). Moreover, at this time, the light-blocking mechanism 17 is operated such that the length of the linear beam 27 is approximately ¼ of the length B of the second side (see FIG. 4(B2)).

Figure 5L:
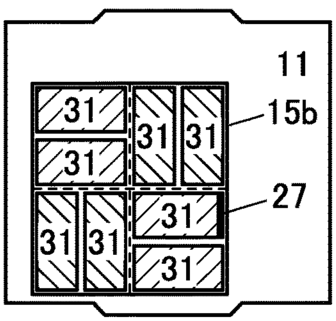

Hereinafter, with the vicinity of the third vertex V3 of the stage 15*b* serving as a starting point of processing, operations similar to those in FIGS. 5(A) to 5(I) are repeated, and thus the entire surface of the object to be processed 30 is irradiated with the linear beam 27 (see FIG. 5(L)).

Thus, when the length of the linear beam is ¼ of the first side of the stage 15*b*, the movement range of the first movable portion 12*b* is set to ½ of the length of the first side, and the movement range of the second movable portion 13*b* is set to ¼ of the length of the first side, whereby the entire surface of the object to be processed 30 can be subjected to laser processing. In other words, when the length of the linear beam is ½X (X is an integer of two or more) of the first side of the stage 15*b*, the movement range of the second movable portion 13*b* is set to a length shorter than the length of the first side by (X+1)/2X.

Note that each of the above movement range of the first movable portion 12*b* and the above movement range of the second movable portion 13*b* is a minimum value, and the movement ranges may be expanded in a range of 2% or more and 20% or less than the above, preferably in a range of 5% or more and 10% or less than the above, in consideration of maintainability or a reduction in a mechanical load.

On the assumption that operations are performed in the above manner, as for the inside dimension of the floor of the chamber 11, the short axis can have at least a length substantially the same as that of a diagonal line of the stage 15*b*, and the long side can have at least a length approximately 3/2 times as long as that of the first side. At this time, the area of the floor in the chamber 11 is approximately 2.3 times as large as the area of the stage 15*b*. In the conventional examples, the area is approximately 3.8 times. Thus, the occupation area can be significantly reduced.

Figure 6:
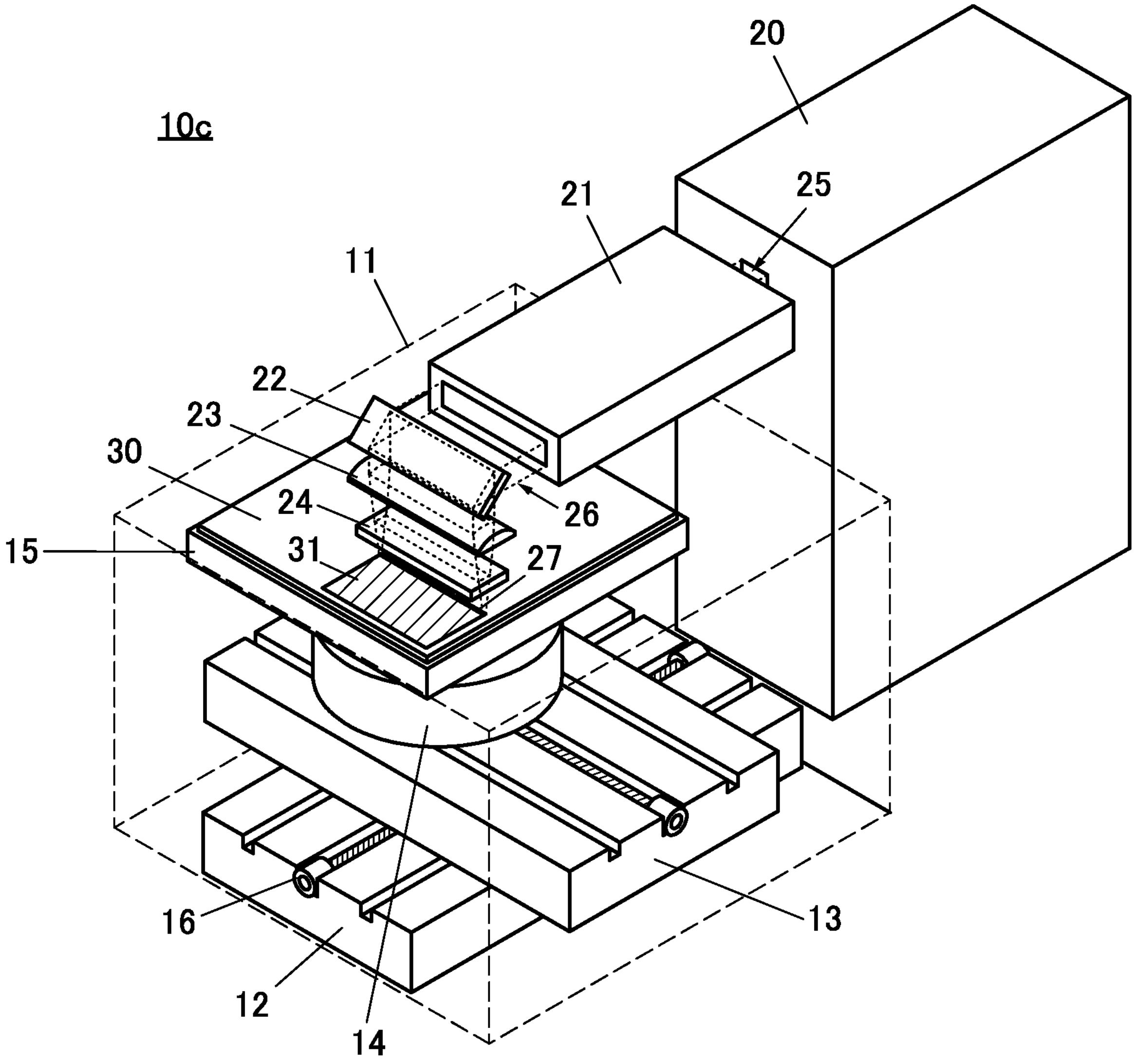
FIG. 6 A diagram illustrating a laser processing apparatus.

The laser processing apparatus of one embodiment of the present invention may have a structure illustrated in FIG. 6. A laser processing apparatus 10*c* illustrated in FIG. 6 has a structure based on that of the laser processing apparatus 10*a* in the case where the beam length is approximately ½ of the stage 15*b*. As an operation method different from that in the laser processing apparatus 10*a* is assumed, the movement range of the second movable portion included in the movement mechanism 13 can be made smaller than that in the laser processing apparatus 10*a*. Accordingly, the inside dimension of the floor of the chamber 11 can be further reduced.

FIGS. 7(A) to 7(J) are diagrams illustrating operations of the laser processing apparatus 10*c* which is one embodiment of the present invention and illustrated in FIGS. 6(A) and 6(B). FIGS. 7(A) to 7(J) illustrate an example of a case in which the linear beam 27 has approximately ½ of the length of the one side of the stage 15*b*.

FIGS. 7(A) to 7(J) illustrate a method in which the first region that is ¼ of the object to be processed 30 is subjected to laser irradiation, the object to be processed 30 is rotated by 90°, and the second region that is ¼ of the object to be processed 30 is subjected to laser irradiation. In the method, by repetition of rotation and laser irradiation, the entire surface of the object to be processed 30 can be subjected to laser irradiation.

Figure 7A:
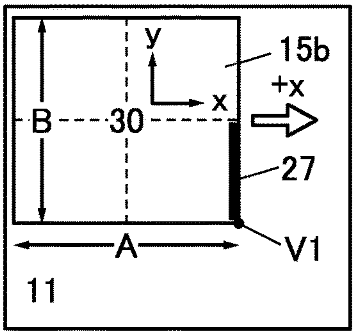
FIGS. 7A-7J Diagrams illustrating a laser processing method.
Figure 7B:
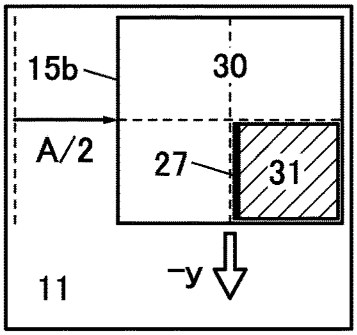
Figure 7C:
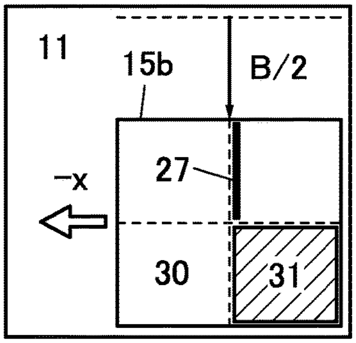
Figure 7D:
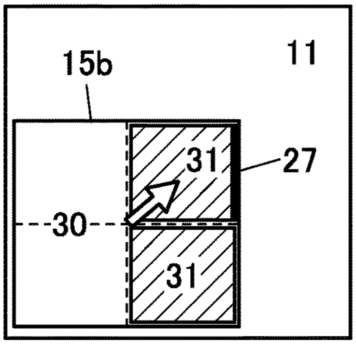

First, the stage 15*b* is moved in the +x direction while irradiation with the linear beam 27 is performed with the vicinity of the first vertex V1 of the stage 15*b* serving as a starting point of processing (see FIG. 7(A)).

Next, the stage 15*b* is moved by approximately ½ of the distance A corresponding to the length of the first side, and then the irradiation with the linear beam 27 is terminated. Then, the stage 15*b* is moved in the −y direction (see FIG. 7(B)).

Next, the stage 15*b* is moved only by ½ of the distance B corresponding to the length of the second side, and then the irradiation with the linear beam 27 is started. Then, the stage 15*b* is moved in the −x direction (see FIG. 7(C)).

Next, the stage 15*b* is moved by approximately ½ of the distance A corresponding to the length of the first side, and then the irradiation with the linear beam 27 is terminated. Then, the stage 15*b* is moved to the center of the chamber 11 (see FIG. 7(D)).

Figure 7E:
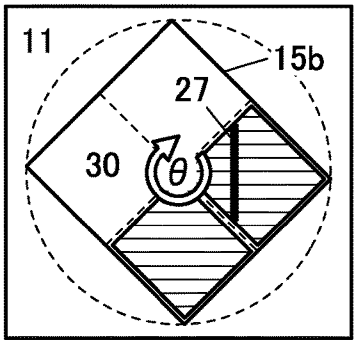
Figure 7F:
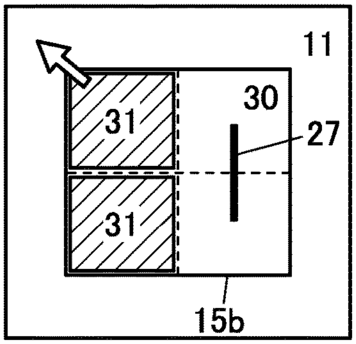
Figure 7G:
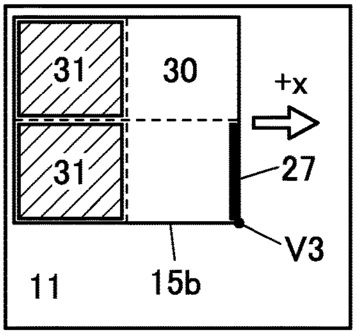
Figure 7H:
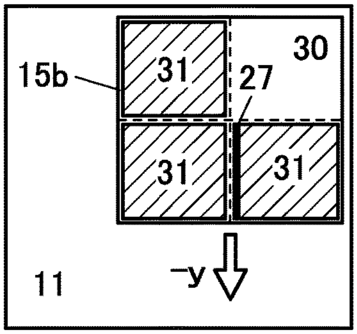
Figure 7I:
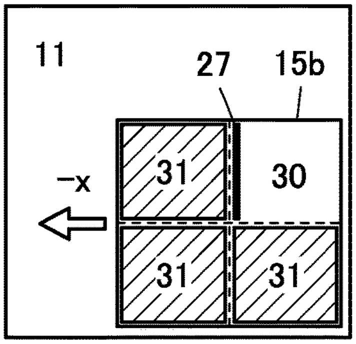
Figure 7J:
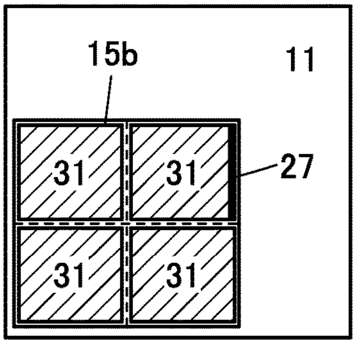

Then, the stage 15*b* is rotated by 180°, and the stage 15*b* is moved in the −x and +y directions such that the vicinity of the third vertex V3 of the stage 15*b* serves as a starting point of processing (see FIGS. 7(E) and 7(F)).

Hereinafter, operations similar to those in FIGS. 7(A) to 7(D) are repeated, and thus the entire surface of the object to be processed 30 is irradiated with the linear beam 27 (see FIGS. 7(G) to 7(J)).

Thus, when the length of the linear beam is ½ of the second side of the stage 15*b*, the movement range of the first movable portion 12*b* is set to ½ of the length of the first side, and the movement range of the second movable portion 13*b* is set to the length shorter than the length of the second side by ½, whereby the entire surface of the object to be processed 30 can be subjected to laser processing. In other words, when the length of the linear beam is 1/X of the second side of the stage 15*b*, the movement range of the second movable portion 13*b* is set to a length shorter than the length of the second side by 1/X.

Note that each of the above movement range of the first movable portion 12*b* and the above movement range of the second movable portion 13*b* is a minimum value, and the movement ranges may be expanded in a range of 2% or more and 20% or less than the above, preferably in a range of 5% or more and 10% or less than the above, in consideration of maintainability or a reduction in a mechanical load.

On the assumption that operations are performed in the above manner, as for the inside dimension of the floor of the chamber 11, the short side can be at least approximately 3/2 times as long as the second side, and the long side can be at least approximately 3/2 times as long as the first side. At this time, the area of the floor in the chamber 11 is approximately 2.4 times as large as the area of the stage 15*b*. In the conventional example where the length of the linear beam is ½ of the second side of the stage 15*b* (no rotation), the area of the floor in the chamber 11 is approximately 3.2 times. Thus, the occupation area can be significantly reduced.

Figure 8A:
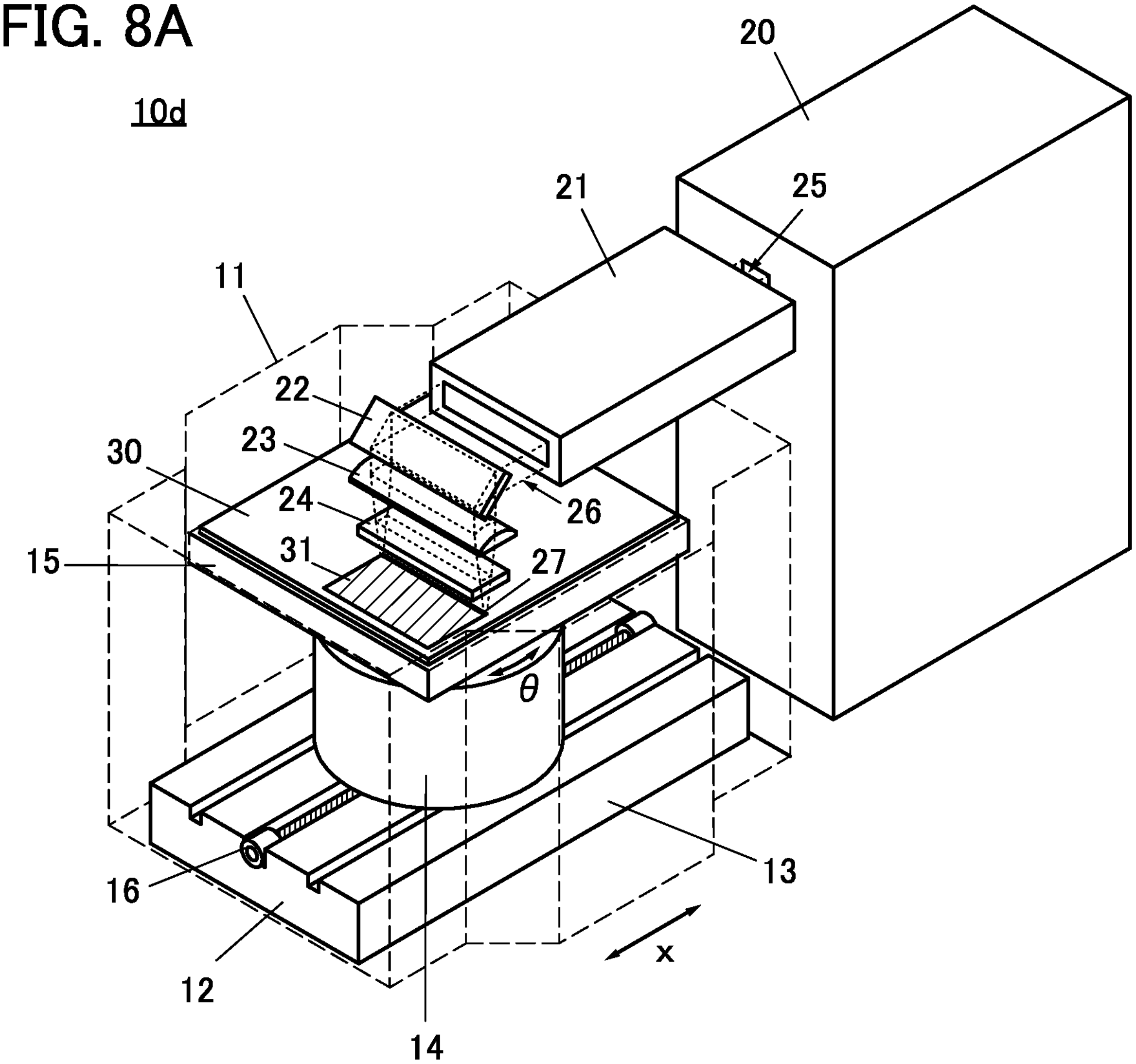
FIGS. 8A-8B Diagrams illustrating a laser processing apparatus.

Furthermore, the laser processing apparatus of one embodiment of the present invention may have a structure illustrated in FIG. 8(A). A laser processing apparatus 10*d* illustrated in FIG. 8(A) has a structure based on that of the laser processing apparatus 10*b* in the case where the beam length is approximately ½ of the stage 15*b*. As an operation method different from that in the laser processing apparatus 10*b* is assumed, a structure without the movement mechanism 13 can be employed. Accordingly, the inside dimension of the floor of the chamber 11 can be further reduced. Note that as illustrated in FIG. 8(B), the rotation mechanism 14 is fixed to the first movable portion 12*b*.

Moreover, as in the laser processing apparatus **10*b*, the light-blocking mechanism 17 illustrated in FIGS. 4(B1) and 4(B2) is provided for the optical path of the laser light 26**.

Figure 8B:
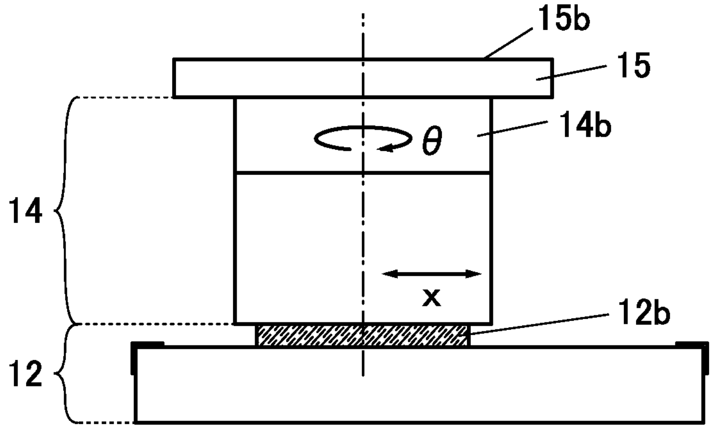

FIGS. 9(A) to 9(K) are diagrams illustrating operations of the laser processing apparatus **10*d* which is one embodiment of the present invention and illustrated in FIGS. 8(A) and 8(B). FIGS. 9(A) to 9(K) illustrate an example of a case in which the linear beam 27 is approximately ½ of the length of the one side of the stage 15*b***.

FIGS. 9(A) to 9(K) illustrate a method in which the first region that is ¼ of the object to be processed 30 is subjected to laser irradiation, the object to be processed 30 is rotated by 90°, and the second region that is ¼ of the object to be processed 30 is subjected to laser irradiation. In the method, by repetition of rotation and laser irradiation, the entire surface of the object to be processed 30 can be subjected to laser irradiation.

Figure 9A:
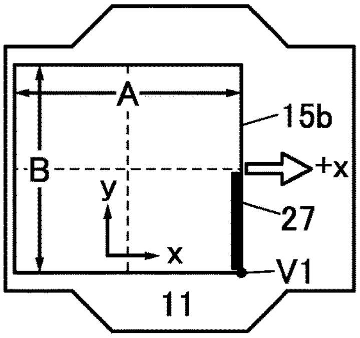
FIGS. 9A-9K Diagrams illustrating a laser processing method.
Figure 9B:
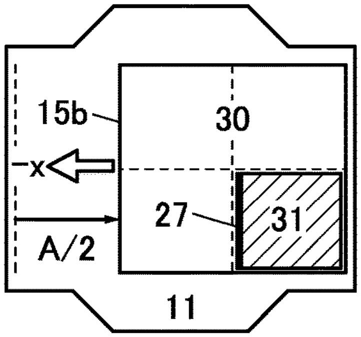

First, the stage **15*b* is moved in the +x direction while irradiation with the linear beam 27 is performed with the vicinity of the first vertex V1 of the stage 15*b* serving as a starting point of processing (see FIG. 9(A)). Moreover, at this time, the light-blocking mechanism 17 is operated such that the length of the linear beam 27** is approximately ½ of the length B of the second side.

Next, the stage **15*b* is moved by approximately ½ of the distance A corresponding to the length of the first side, and then the irradiation with the linear beam 27 is terminated. Then, the stage 15*b* is moved to the center of the chamber 11 (see FIG. 9**(B)).

Figure 9C:
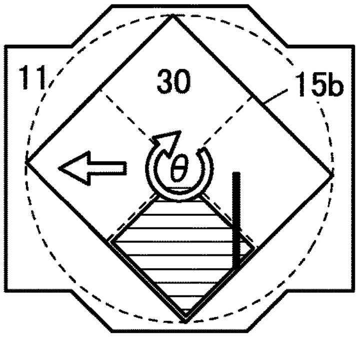
Figure 9D:
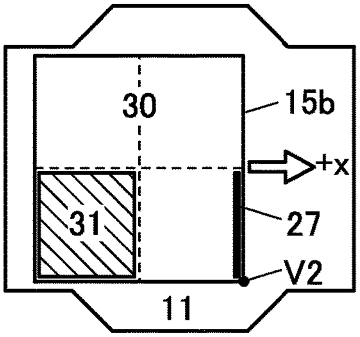
Figure 9E:
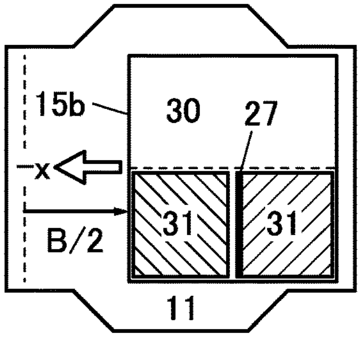

Then, the stage **15*b* is rotated by 90°, and the stage 15*b* is moved in the −x direction such that the vicinity of the second vertex V2 of the stage 15*b* serves as a starting point of processing (see FIGS. 9(C) and 9(D)). Moreover, at this time, the light-blocking mechanism 17 is operated such that the length of the linear beam 27** is approximately ½ of the length A of the first side.

Next, the stage **15*b* is moved by approximately ½ of the distance B corresponding to the length of the first side, and then the irradiation with the linear beam 27 is terminated. Then, the stage 15*b* is moved to the center of the chamber 11 (see FIG. 9**(E)).

Figure 9F:
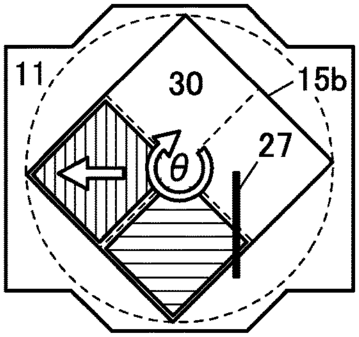
Figure 9G:
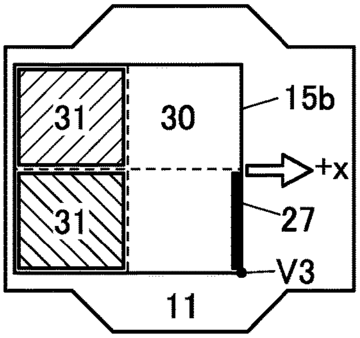

Then, the stage **15*b* is rotated by 90°, and the stage 15*b* is moved in the −x direction such that the vicinity of the third vertex V3 of the stage 15*b* serves as a starting point of processing (see FIGS. 9(F) and 9(G)). Moreover, at this time, the light-blocking mechanism 17 is operated such that the length of the linear beam 27** is approximately ½ of the length B of the second side.

Figure 9H:
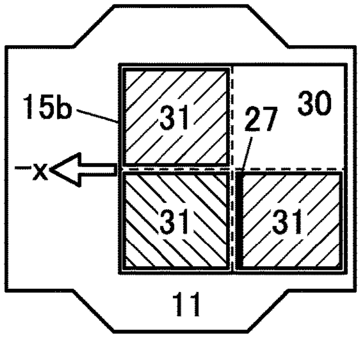
Figure 9I:
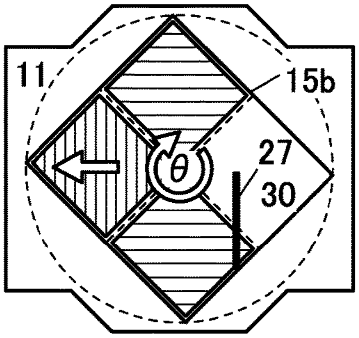
Figure 9J:
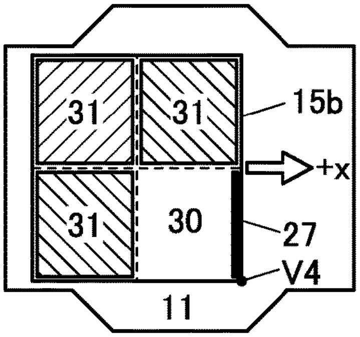
Figure 9K:
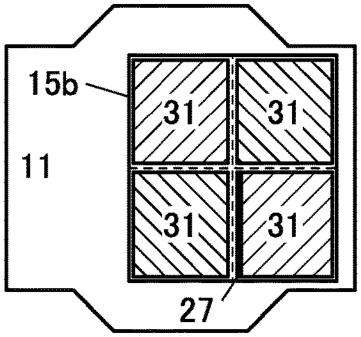

Hereinafter, operations similar to those in FIGS. 9(A) to 9(E) are repeated such that the vicinity of the third vertex V3 of the stage **15*b* and the vicinity of a fourth vertex V4 of the stage 15*b* serve as starting points of processing, and thus the entire surface of the object to be processed 30 is irradiated with the linear beam 27 (see FIGS. 9(H) to 9**(K)).

Accordingly, when the length of the linear beam is ½ of the first side of the stage **15*b*, the movement range of the first movable portion 12*b* is ½ of the length of the first side, so that the entire surface of the stage 15*b*** can be subjected to laser processing.

Note that the above movement range of the first movable portion **12*b*** is a minimum value, and the movement range may be expanded in a range of 2% or more and 20% or less than the above, preferably in a range of 5% or more and 10% or less than the above, in consideration of maintainability or a reduction in a mechanical load.

On the assumption that operations are performed in the above manner, as for the inside dimension of the floor of the chamber 11, the short axis can have at least a length substantially the same as that of a diagonal line of the stage **15*b*, and the long side can have at least a length approximately 3/2 times as long as that of the first side. At this time, the area of the floor in the chamber 11 is approximately 2.1 times as large as the area of the stage 15*b*. In the conventional example where the length of the linear beam is ½ of the second side of the stage 15*b* (no rotation), the area of the floor in the chamber 11** is approximately 3.2 times. Thus, the occupation area can be significantly reduced.

Figure 10A:
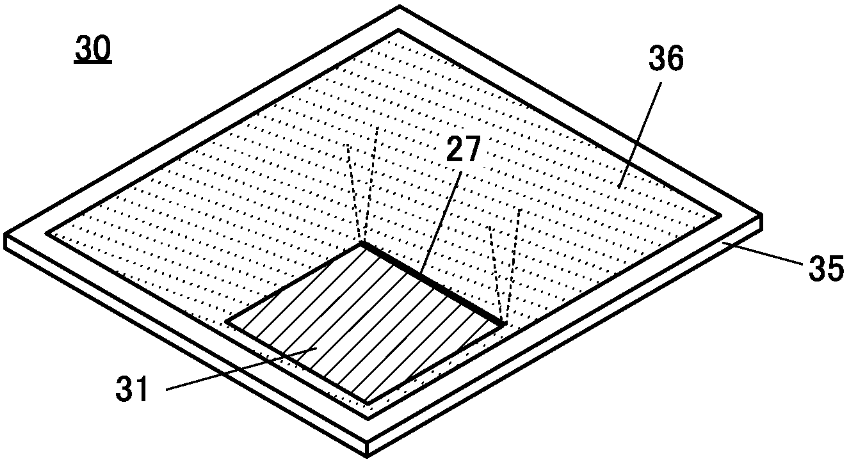
FIGS. 10A-10C Diagrams illustrating structures of an object to be processed.

Here, the object to be processed 30 will be described. As illustrated in FIG. 10(A), the object to be processed 30 can comprise a plate-like substrate 35 and a structure body 36 provided over the substrate 35. The structure body 36 can be directly irradiated with the linear beam 27. The structure body 36 can be a thin film or a stack body including the thin film, for example. Specifically, as the thin film, a semiconductor film to be a semiconductor layer of a transistor and the like can be given.

Figure 10B:
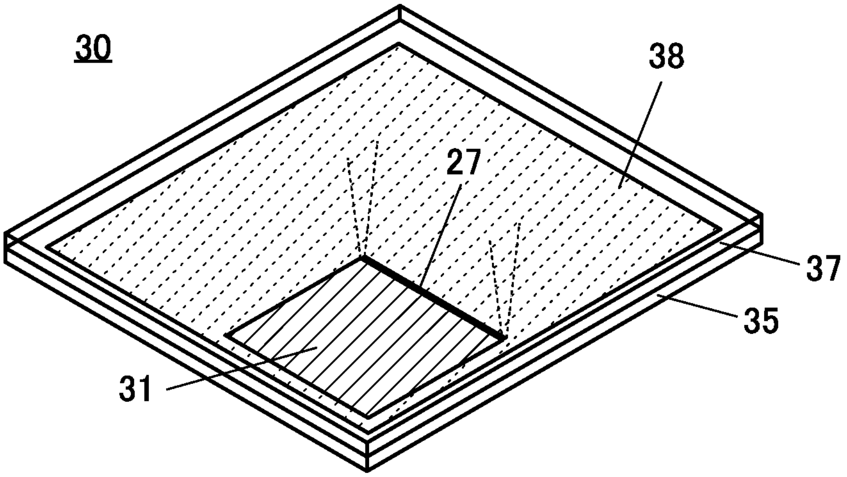

Alternatively, as illustrated in FIG. 10(B), a structure including the substrate 35, a substrate 37, and a layer 38 sandwiched between the two substrates is employed. The substrate 37 at least laser light enter is a glass substrate or the like and is formed of a material that enables the layer 38 to be irradiated with the linear beam 27 having necessary energy density. In addition, the layer 38 is a layer which includes a resin layer of polyimide or the like, for example, and in which the resin layer can be processed by being irradiated with the linear beam 27 having a given intensity or higher.

The resin layer is provided in contact with an entire surface of the substrate 37. Alternatively, it may be provided partly in contact with the substrate 37. By laser processing of the resin layer, the adhesion between the resin layer and the substrate 37 is decreased, so that the layer 38 and the substrate 37 which are supported by the substrate 35 can be separated from each other.

Figure 10C:
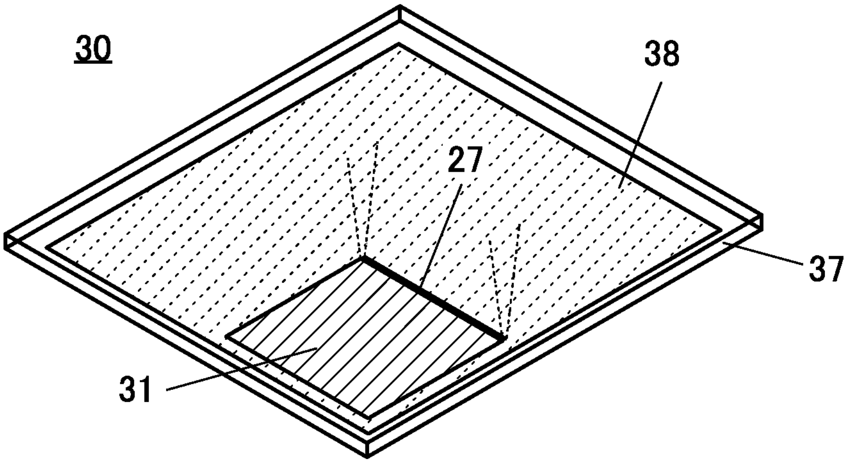

Alternatively, as illustrated in FIG. 10(C), the object to be processed 30 can have a structure excluding the substrate 35 from the structure in FIG. 10(B). In this case, the layer 38 loses the support substrate after processing of the object to be processed 30, and therefore, it is preferable to use an auxiliary jig 40 illustrated in FIG. 11(A).

The auxiliary jig 40 includes a frame 41 and a suction portion 42. A notch for mounting the object to be processed 30 is provided in the frame 41. The frame 41 can be formed using, for example, a metal or a composite material of a metal and a ceramic, and the suction portion 42 can be formed using a breathable porous ceramic or the like. Note that although FIG. 11(A) illustrates an example where four suction portions 42 are provided in the notch, the number of the suction portions 42 is not limited.

Figure 11A:
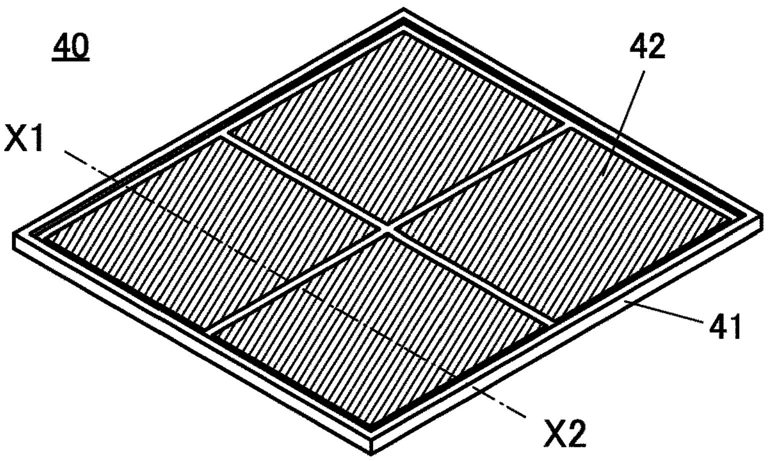
FIGS. 11A-11D Diagrams illustrating an auxiliary jig.
Figure 11B:
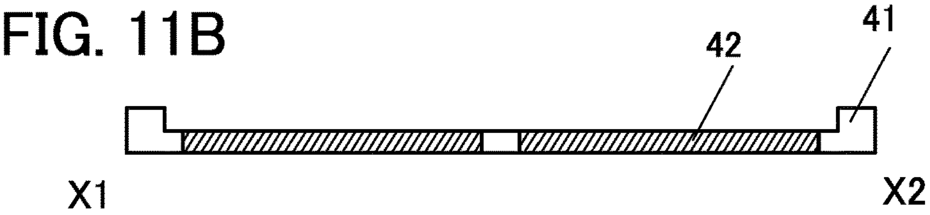

FIG. 11(B) is a cross-sectional view taken along X1-X2 illustrated in FIG. 11(A). In the notch of the auxiliary jig 40, a structure without a step between the frame 41 and the suction portions 42 on both of the front and back is employed.

Figure 11C:
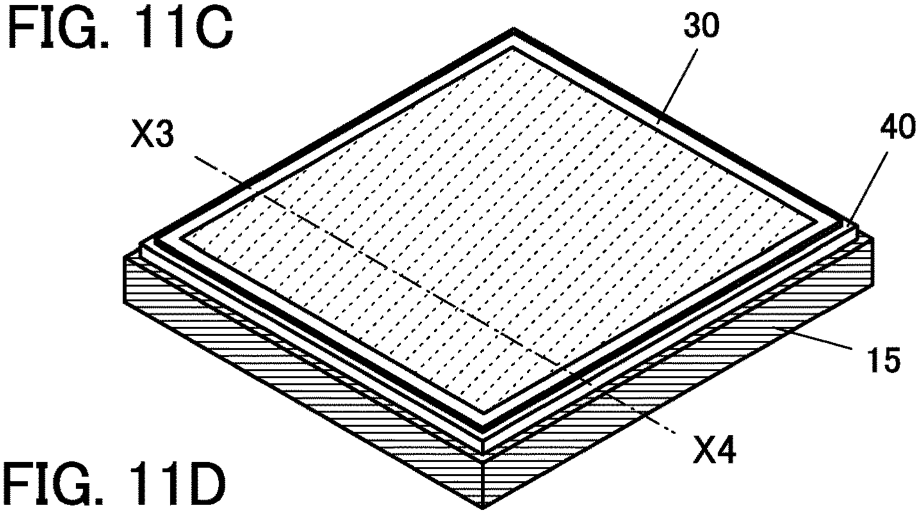
Figure 11D:
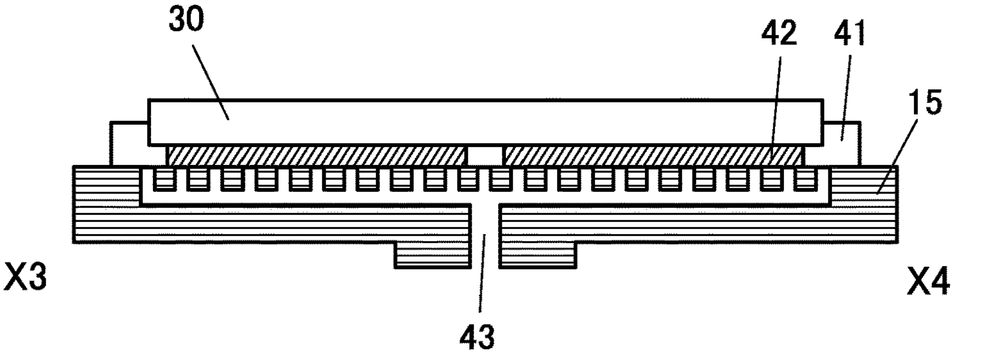

FIG. 11(C) is a diagram illustrating a state in which the auxiliary jig 40 on which the object to be processed 30 is mounted is fixed to the fixing mechanism 15. Moreover, FIG. 11(D) is a cross-sectional view taken along X3-X4 illustrated in FIG. 11(C).

An opening 43 reaching the surface of the stage **15*b* is provided in the fixing mechanism 15 and a vacuum pump or the like is connected to the opening 43, whereby an object in contact with the surface of the stage 15*b* can be subjected to vacuum suction. Here, the auxiliary jig 40 is provided over the stage 15***b* so that the opening 43 is in contact with the suction portion 42 and the frame 41. When the auxiliary jig 40 is provided in this manner, the object to be processed 30 can be vacuum-sucked through the suction portion 42 together with the auxiliary jig.

With the use of the auxiliary jig 40, laser processing can be performed without detachment of the layer 38 even when the object to be processed 30 has a mode illustrated in FIG. 10(C).

Figure 12A:
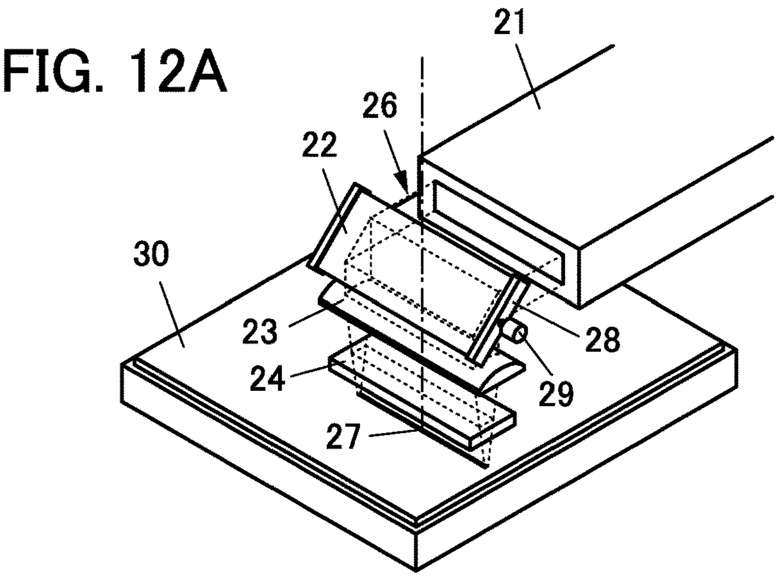
FIGS. 12A-12C Diagrams illustrating modes of laser irradiation.
Figure 12B:
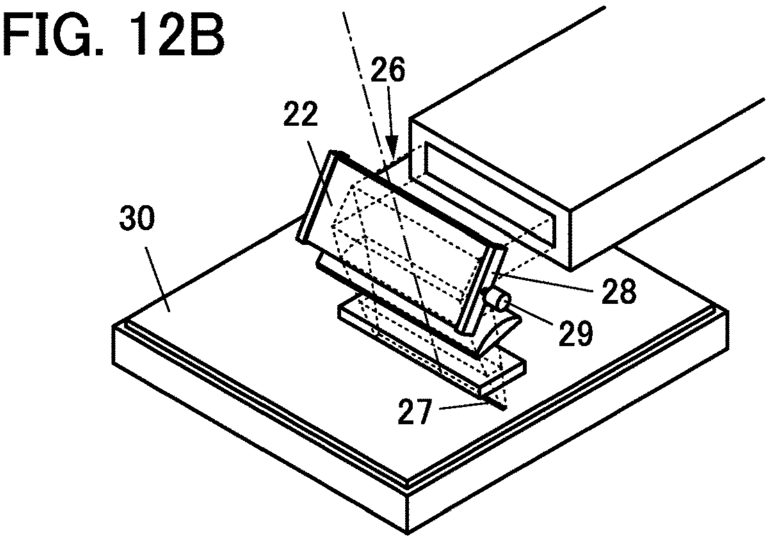

Furthermore, although FIG. 1 and the like illustrate an example in which the mirror 22 is provided so that an incident angle of the laser light 26 is approximately 450 as illustrated in FIG. 12(A), the incident angle of the laser light 26 with respect to the mirror 22 may be an angle smaller than 450 as illustrated in FIG. 12(B). For example, the incident angle is larger than or equal to 200 and smaller than or equal to 45°, preferably larger than or equal to 250 and smaller than or equal to 40, further preferably larger than or equal to 300 and smaller than or equal to 40.

Figure 12C:
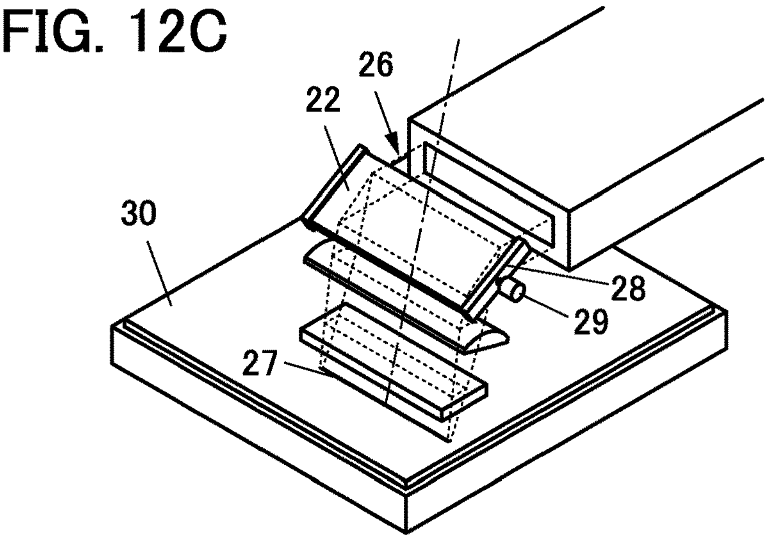

Alternatively, as illustrated in FIG. 12(C), the incident angle of the laser light 26 with respect to the mirror 22 may be an angle larger than 45°. For example, the incident angle is larger than 450 and smaller than or equal to 70°, preferably larger than or equal to 500 and smaller than or equal to 65°, further preferably larger than or equal to 500 and smaller than or equal to 60°.

The incident angle of the laser light 26 with respect to the mirror 22 is changed as illustrated in FIGS. 12(A) to 12(C), whereby the object to be processed 30 can be obliquely irradiated with the linear beam 27. Therefore, when the object to be processed 30 has a structure illustrated in FIG. 10(B), and the layer 38 is irradiated with the linear beam through the substrate 37, for example, processing defect due to a foreign substance over the substrate 37 can be suppressed. Furthermore, it is more effective to perform processing at the above angle.

As a laser irradiation method in this case, the object to be processed 30 is irradiated with the linear beam in any two of the modes illustrated in FIGS. 12(A) to 12(C). For example, any one of the modes illustrated in FIGS. 12(A) to 12(C) is selected to perform first laser irradiation on the object to be processed 30, and the mode other than the mode selected for the first laser irradiation is selected to perform second laser irradiation on the region that has been irradiated.

Note that the incident angle of the laser light 26 with respect to the mirror 22 can be easily changed by change of the angle of the mirror 22. For example, as illustrated in FIGS. 12(A) to 12(C), a jig 28 provided for the mirror 22 may be rotated with a motor 29. At this time, a mechanism for vertical moving of the object to be processed 30 may be used such that a focal point of the linear beam 27 is formed in a desired region.

In the case where the object to be processed 30 has the mode illustrated in FIG. 10(B) or FIG. 10(C) and the resin is subjected to laser processing, a step of removing the resin is included in the subsequent process in many cases. In such a case, it is preferable to use a stack processing apparatus in which the laser processing apparatus of one embodiment of the present invention and a plasma treatment apparatus for removing a resin (e.g., an ashing apparatus) are combined.

Figure 13:
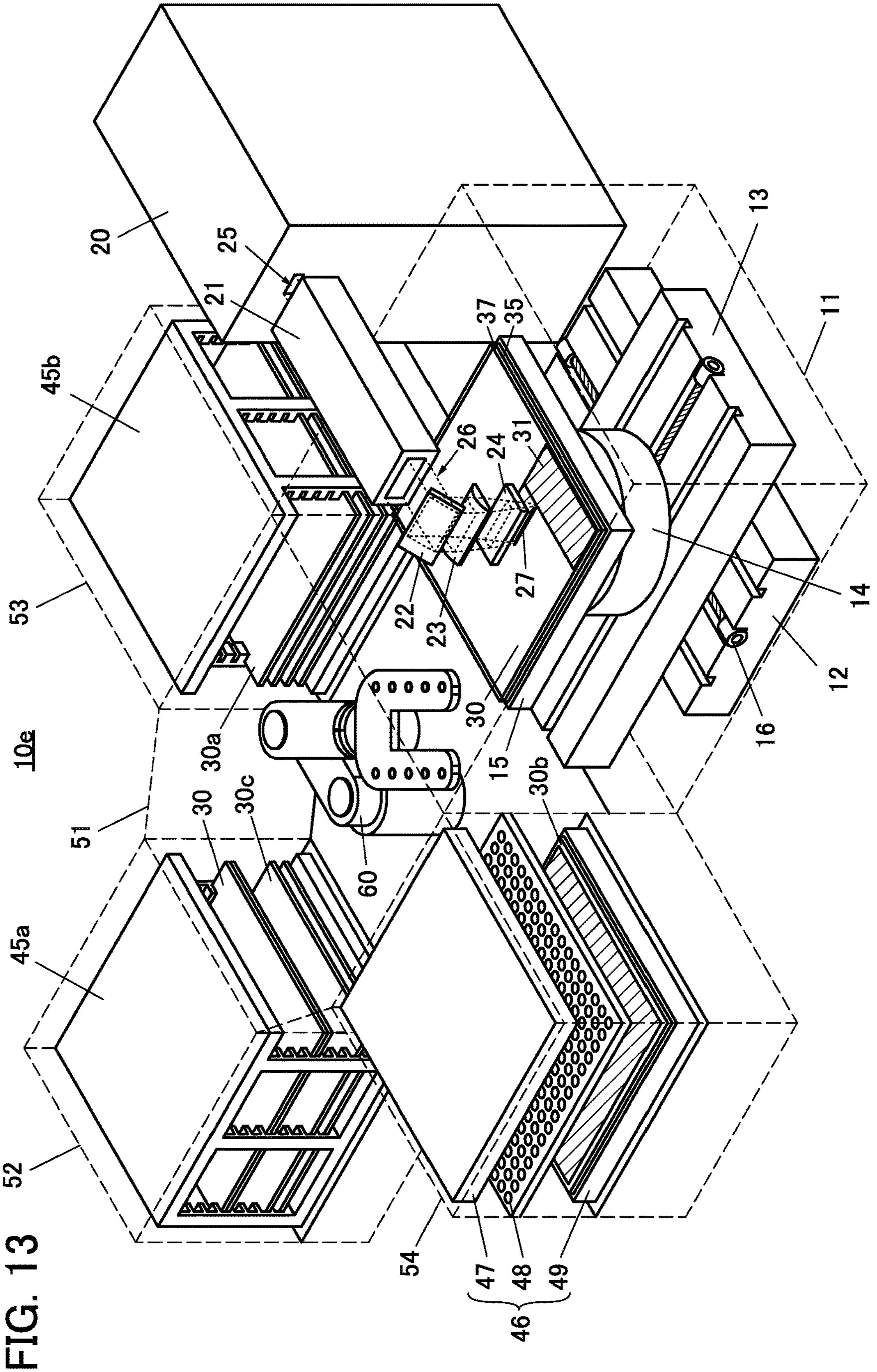
FIG. 13 A diagram illustrating a stack processing apparatus.

FIG. 13 is a diagram illustrating an example of the above stack processing apparatus.

A stack processing apparatus 10*e* includes a laser processing apparatus, a transfer chamber 51, a load/unload chamber 52, an unload chamber 53, and a plasma treatment chamber 54. Note that each chamber is simply illustrated with a gate valve and the like omitted in FIG. 13.

Although FIG. 13 exemplifies the structure illustrated in FIG. 1 as a laser processing apparatus, a structure in FIG. 4, FIG. 6, or FIG. 8 may be employed. Note that a structure excluding the plasma treatment chamber 54 from the structure illustrated in FIG. 13 can be also employed as the stack processing apparatus 10*e*. Alternatively, a structure excluding the unload chamber 53 from the stack processing apparatus 10*e* can be also employed.

The transfer chamber 51 includes a transfer mechanism 60 and a member can be carried out of/in each chamber before and after processing.

Figure 14A:
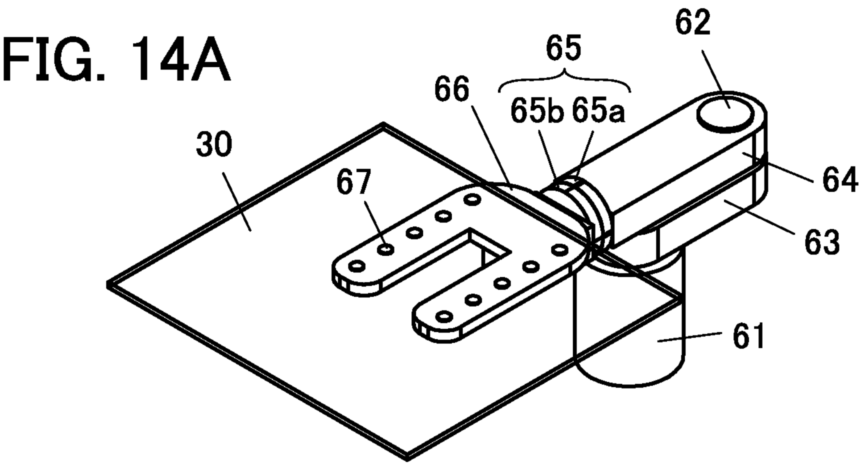
FIGS. 14A-14C Diagrams illustrating a transfer mechanism.

As illustrated in FIG. 14(A), the transfer mechanism 60 is an arm-type robot and includes a raising and lowering mechanism 61, a joint mechanism 62, arms 63 and 64, a reversal mechanism 65, a fork 66, and the like. The object to be processed 30 and the like can be transferred by a telescopic operation of the arms 63 and 64 using the joint mechanism 62 or the like as an axis, an upward/downward operation of the raising and lowering mechanism 61, and the like.

Figure 14B:
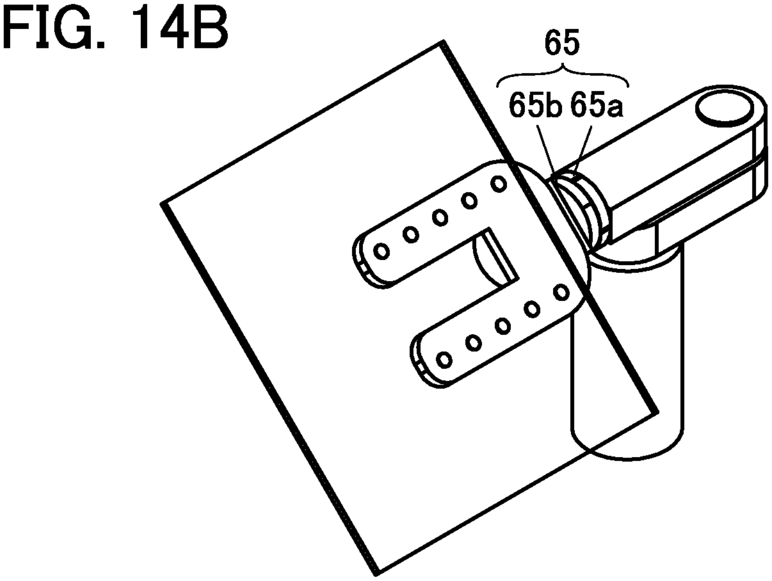

The reversal mechanism 65 includes a support portion 65*a* and a rotation portion 65*b*. As illustrated in FIG. 14(B), the fork 66 can be rotated by rotation of the rotation portion 65*b*.

Figure 14C:
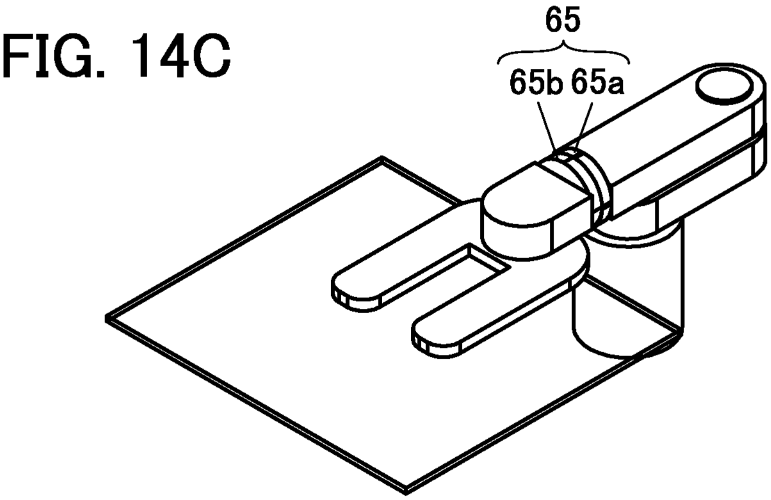

Furthermore, the object to be processed 30 or the like is supported by the fork 66 with an adsorption mechanism 67. Thus, as illustrated in FIGS. 14(B) and 14(C), the object to be processed 30 and the like can be supported even in a state where the fork 66 is inclined and reversed. Note that as the adsorption mechanism 67, a vacuum suction mechanism can be used, for example. Furthermore, the adsorption mechanism 67 may have a sucker.

The load/unload chamber 52 includes a cassette 45*a* and can store the object to be processed 30. In addition, a member 30*c* that has been processed and has been carried out of the plasma treatment chamber 54 can be stored in the cassette 45*a*.

The unload chamber 53 includes a cassette 45*b* and can store a member 30*a* that has been processed and has been carried out of the chamber 11 of the laser processing apparatus. Note that the member 30*a* may be stored in the cassette 45*a*, and the member 30*c* may be stored in the cassette 45*b*.

The plasma treatment chamber 54 is provided with a down-flow ashing unit including a plasma generation mechanism 47, a shower plate 48, and a stage 49, and the like. A gas line for supplying oxygen, a rare gas, and the like, a high-frequency power source, and the like are connected to the plasma generation mechanism 47, and an oxygen radical can be generated.

For example, the object to be processed 30 with the resin exposed on its surface is set on the stage 49, and an oxygen radical and carbon included in the resin are reacted with each other, whereby the resin can be vaporized and removed.

The shower plate 48 can suppress spread of plasma by being supplied with a ground potential. With the use of the shower plate 48, plasma damage to the object to be processed 30 can be suppressed without disruption of useful supply of an oxygen radical. The stage 49 may be provided with a heater for promoting the above reaction.

Here, an example of a process using the stack processing apparatus 10*e* will be briefly described. Note that the object to be processed 30 has the mode illustrated in FIG. 10(B), and the purpose is laser processing of the resin sandwiched between the substrate 35 and the substrate 37 and removal thereof by ashing.

First, the cassette 45*a* where the object to be processed 30 is stored is set in the load/unload chamber 52, and the object to be processed 30 is transferred to the chamber 11 of the laser processing apparatus by the transfer mechanism 60.

After termination of the laser processing, the member 30*a* (e.g., the substrate 37 or the like illustrated in FIG. 10(B)) separated from the object to be processed 30 is carried out of the chamber 11 by the transfer mechanism 60 and stored in the cassette 45*b* of the unload chamber 53. Note that the member 30*a* can be separated from the object to be processed 30 in the following manner: the fork 66 of the transfer mechanism 60 is reversed, a surface of the member 30*a* is adsorbed by the adsorption mechanism 67, and the member 30*a* is lifted above by the raising and lowering mechanism 61.

Next, the member 30*b* obtained by separation of the member 30*a* from the object to be processed 30 is carried out of the chamber 11 by the transfer mechanism 60 and transferred to the plasma treatment chamber 54. Then, ashing treatment is started. A multitasking operation in which a new object to be processed 30 is subjected to laser processing treatment during the ashing treatment may be performed.

After the termination of the ashing treatment, the member 30*c* that has been subjected to treatment is carried out of the plasma treatment chamber 54 by the transfer mechanism 60 and stored in the cassette 45*a* of the load/unload chamber 52.

As described above, the object to be processed 30 can be subjected to the laser processing and the ashing treatment successively. Furthermore, the treatment time can be shortened by the multitasking operation.

At least part of this embodiment can be implemented in combination with any of the other embodiments described in this specification as appropriate.

Embodiment 2

In this embodiment, a laser processing apparatus different from that in Embodiment 1 will be described. Note that although there is no limitation on the usage of the laser processing apparatus, the laser processing apparatus is particularly useful in a manufacturing process of a semiconductor device, a display device, a light-emitting device, a power storage device, a power generation device, or the like.

One embodiment of the present invention is a laser processing apparatus that performs irradiation of a flat-plate-like object to be processed with laser light shaped into a linear beam.

For example, the laser processing apparatus can be used for an application in which a semiconductor layer provided over a support substrate is irradiated with laser light to be modified, and the like. Alternatively, it can be used for an application in which in a structure body including a resin formed over a support substrate, the resin is irradiated with laser light transmitted through the support substrate and processed to separate the support substrate, and the like.

The laser processing apparatus includes a laser oscillator and an optical system for forming a linear beam, a first roller unit, and a second roller unit.

The first roller unit has a function of moving the object to be processed in a first horizontal direction (X-direction). The second roller unit has a function of moving the object to be processed in a second horizontal direction (Y-direction) and a perpendicular direction (Z-direction). Moreover, the laser irradiation mechanism has a function of irradiating the object to be processed provided over the first roller unit with laser light from below.

Therefore, in the laser processing apparatus of one embodiment of the present invention, laser irradiation of the structure body formed over the support substrate from the support substrate side can be easily performed. In the conventional laser processing apparatus that performs laser irradiation from above the object to be processed, another support substrate or the like needs to be provided over the structure body. Furthermore, a step of removing the another support substrate or the like is also necessary.

Figure 15A:
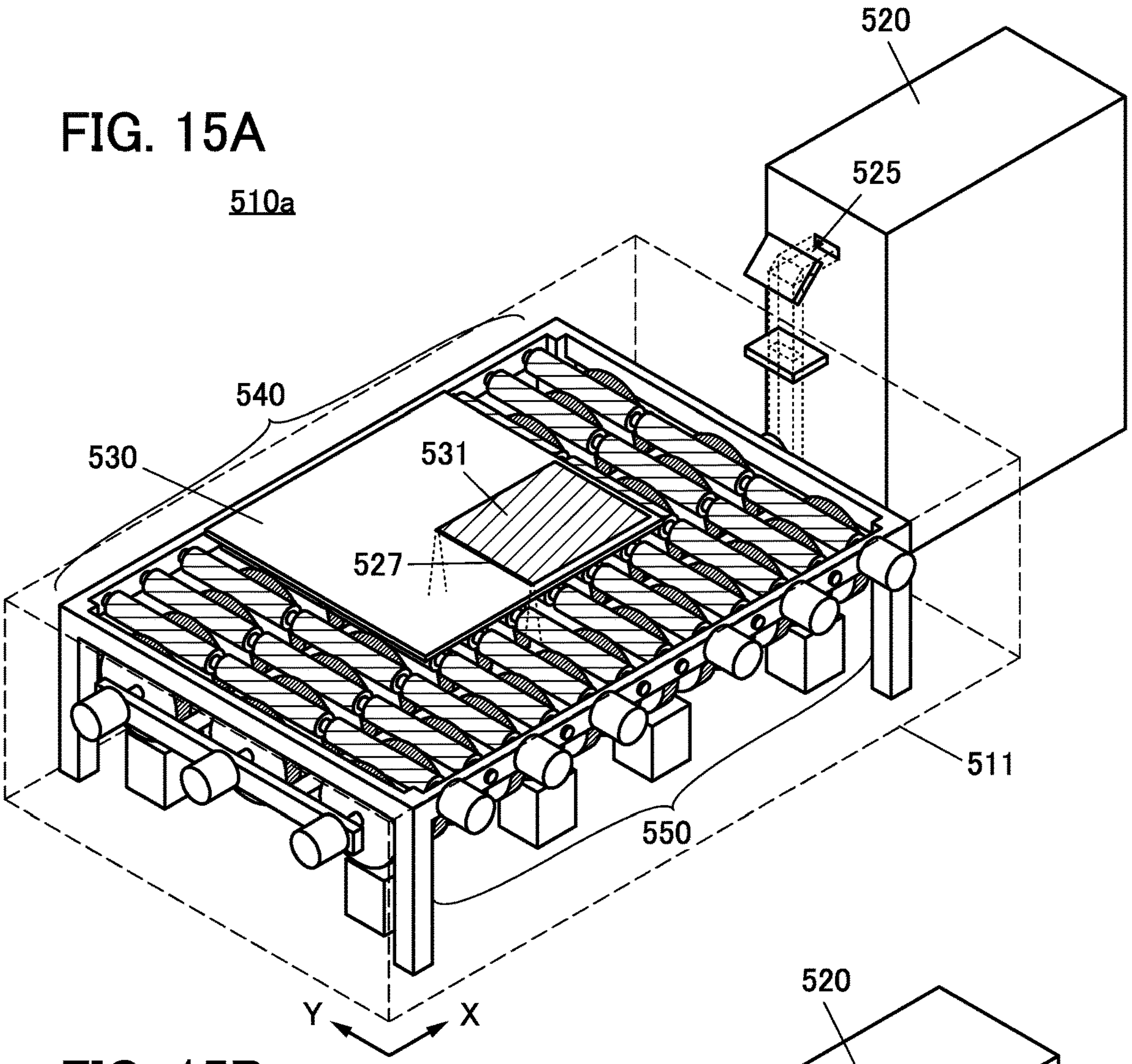
FIGS. 15A-15B Diagrams illustrating a laser processing apparatus.

FIG. 15(A) is a perspective view illustrating a laser processing apparatus of one embodiment of the present invention. The laser processing apparatus 510*a* includes a laser irradiation mechanism for forming a linear beam. Furthermore, a first roller unit 540 and a second roller unit 550 are included in a chamber 511, and the both are provided to have an overlapping region. An object to be processed 530 is provided over the first roller unit 540.

Figure 15B:
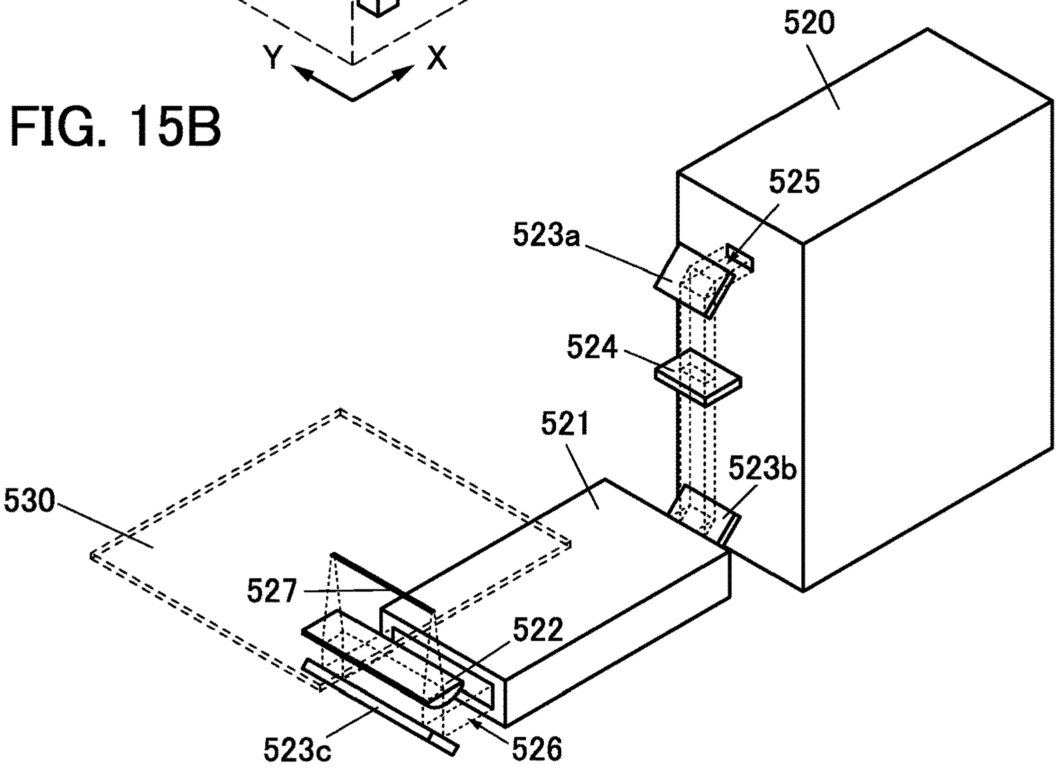

FIG. 15(B) is a diagram illustrating the laser irradiation mechanism. The laser irradiation mechanism includes a laser oscillator 520, a mirror 523*a*, a mirror 523*b*, a mirror 523*c*, an optical system unit 521, and a lens 522.

The laser oscillator 520 is preferably a pulsed laser, but may be a CW laser as long as it outputs light with a wavelength and intensity suitable for the purpose of processing. Typically, an excimer laser that emits ultraviolet light with a wavelength of 351-353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser (a YAG laser, a fiber laser, or the like) may be used. Moreover, a plurality of laser oscillators 520 may be provided.

As each of the mirror 523*a*, the mirror 523*b*, and the mirror 523*c*, a dielectric multilayer mirror can be used, for example, and is provided so that the incident angle of the laser light entering each mirror is substantially 45°.

The optical system unit 521 includes, for example, a mirror, a beam expander, a beam homogenizer, and the like, and homogenizes and expands the in-plane distribution of the energy of laser light 525 emitted from the laser oscillator 520. In one embodiment of the present invention, a beam shape on the processed surface of the object to be processed is a linear shape, and thus laser light 526 emitted from the optical system unit 521 is preferably shaped into a rectangle.

The lens 522 is a condensing lens, and a cylindrical lens can be used, for example.

As illustrated in FIG. 15(A), all the components excluding the laser oscillator 520 and the mirror 523*a* are preferably provided in the chamber 511. The atmosphere in the chamber 511 is controlled in such a structure, for example, whereby deterioration of the optical components such as the mirror or the lens can be prevented, leading to easy maintenance. In this case, a quartz window 524 is provided in a region where the laser light 525 enters the chamber 511.

Note that a glass window can be replaced with the quartz window 524 on the assumption that the linear beam 527 can have the required energy density. Moreover, the quartz window 524 is not necessary in the case of a structure without the chamber 511.

Here, laser irradiation of the object to be processed 530 provided over the first roller unit 540 will be described.

First, the laser light 525 output from the laser oscillator 520 in the horizontal direction enters the mirror 523*a* and is reflected in the downward direction. Then, the laser light 525 is reflected by the mirror 523*b* and enters the optical system unit 521.

The laser light 526 that is extended and shaped into a rectangle by the optical system unit 521 enters the mirror 523*c*. At this time, the laser light 526 may be divided into a plurality of laser beams. Furthermore, although the laser light 526 emitted from the optical system unit 521 is illustrated as parallel light in FIG. 15(B), the laser light 526 may be light that expands in the emission direction.

The laser light 526 reflected by the mirror 523*c* enters the lens 522, and thus the linear beam 527 is formed at a desired position of the object to be processed 530. The object to be processed 530 is moved in the horizontal direction while being irradiated with the linear beam 527 formed in this manner, whereby a desired region of the object to be processed 530 can be subjected to laser processing.

Figure 16A:
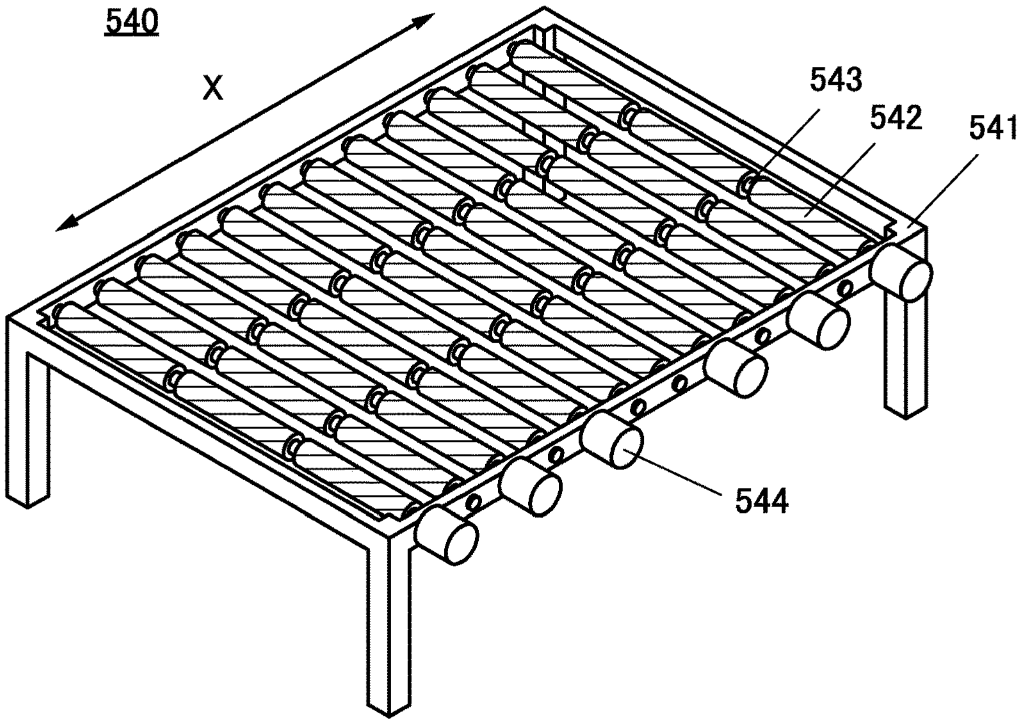
FIGS. 16A-16B Diagrams illustrating a roller unit.
Figure 16B:
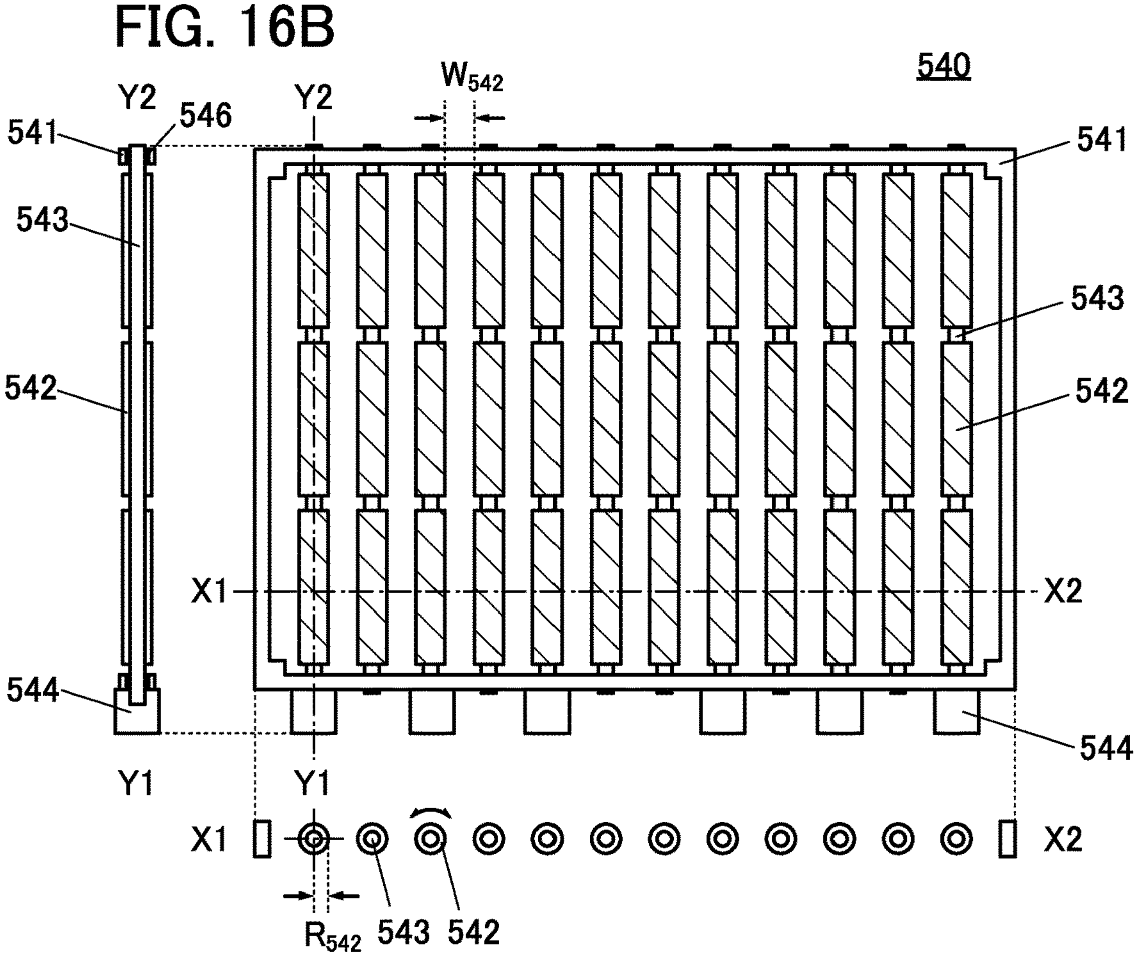

FIG. 16(A) is a perspective view illustrating the first roller unit 540. Furthermore, FIG. 16(B) is a top view of the first roller unit 540, a cross-sectional view taken along X1-X2 in the top view, and a cross-sectional view taken along Y1-Y2 in the top view. The first roller unit 540 includes a plurality of frames 541, a plurality of rollers 542, a plurality of rotation axes 543, and a plurality of rotation mechanisms 544. In the laser processing apparatus 510*a*, the object to be processed 530 is provided over the rollers 542.

The frame 541 is provided with the rotation mechanisms 544. One of end portions of the rotation axis 543 is connected to the rotation mechanism 544, and the other of the end portions of the rotation axis 543 is connected to the frame 541. Alternatively, the both end portions of the rotation axis 543 are connected to the frame 541. Note that a bearing 546 is provided between the frame 541 and the rotation axis 543.

The cylindrical rollers 542 are fixed to the rotation axis 543. The center axis of the roller 542 preferably has a region overlapping with the center axis of the rotation axis 543.

When the rotation mechanism 544 and the rotation axis 543 are connected to each other, the rollers 542 can be rotated, so that the object to be processed 530 over the rollers 542 can be moved in the first horizontal direction (X-direction).

Figure 17A:
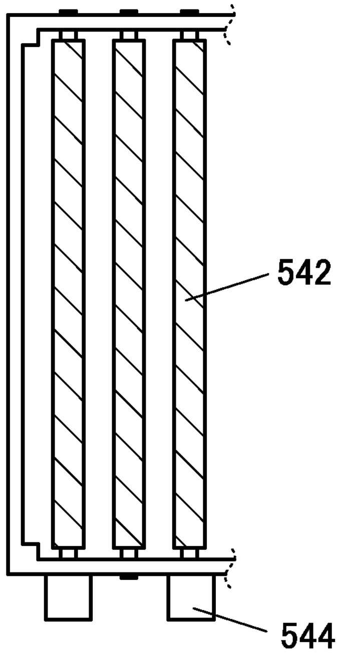
FIGS. 17A-17E Diagrams illustrating roller units.
Figure 17B:
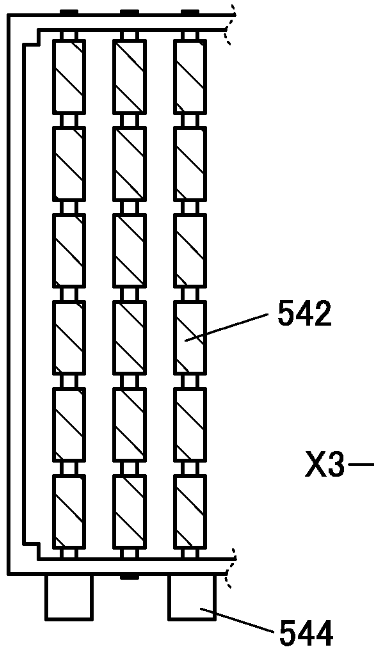

Note that although not limited thereto, a mode where three rollers 542 are fixed to one rotation axis 543 is illustrated in FIGS. 16(A) and 16(B), there is no such limitation. For example, as illustrated in FIG. 17(A), one long roller 542 may be fixed to the rotation axis 543. Alternatively, as illustrated in FIG. 17(B), more rollers than those in FIGS. 16(A) and 16(B) may be fixed to the rotation axis 543.

These may be used as appropriate depending on the weight of the object to be processed 530 in order to suppress idling of the rollers 542. In the case where the weight of the object to be processed 530 is large, it is preferable that the number of the rollers 542 be small so that the contact area with the object to be processed 530 becomes large and the load applied to the rollers 542 per unit area becomes small. Furthermore, in the case where the weight of the object to be processed 530 is small, it is preferable that the number of the rollers 542 be large so that the contact area with the object to be processed 530 becomes small and the load applied to the rollers 542 per unit area becomes large.

Figure 17C:
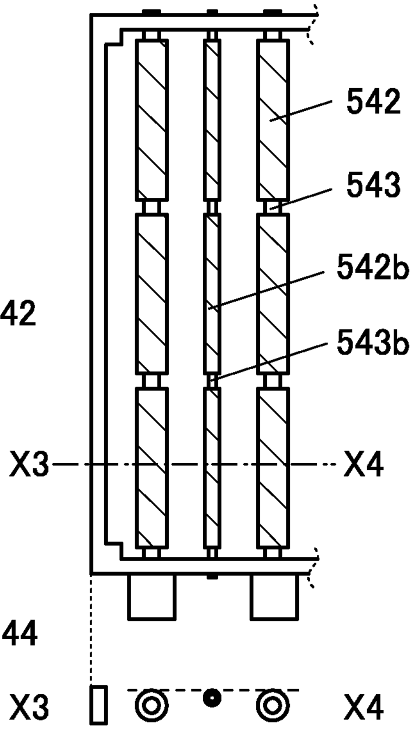

Alternatively, as illustrated in FIG. 17(C), a roller 542*b* whose diameter is smaller than that of the roller 542 and a rotation axis 543*b* whose diameter is smaller than that of the rotation axis 543 may be included. These are not connected to the rotation mechanism 544 and are connected to the frame 541. When the roller and the rotation axis are small as described above, the weight can be reduced, leading to a reduction in the resistance of rotation. Thus, a load on the rotation mechanism 544 can be made small.

Figure 17D:
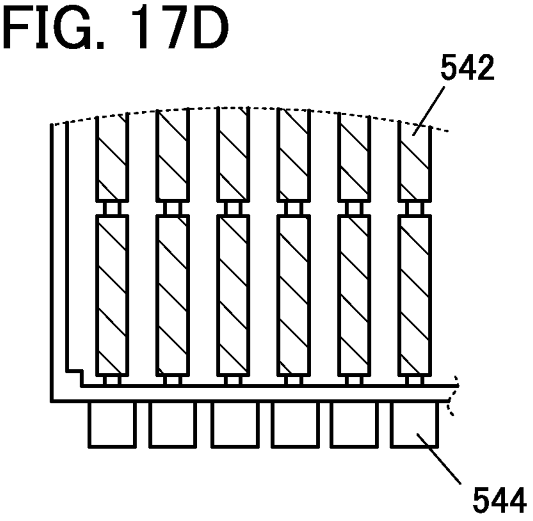

Although FIGS. 16(A) and 16(B) illustrate an example including a set of the rotation axis 543 and the rollers 542 which is not connected to the rotation mechanism 544, the rotation mechanism 544 may be connected to all sets of the rotation axes 543 and the rollers 542 as illustrated in FIG. 17(D).

Figure 17E:
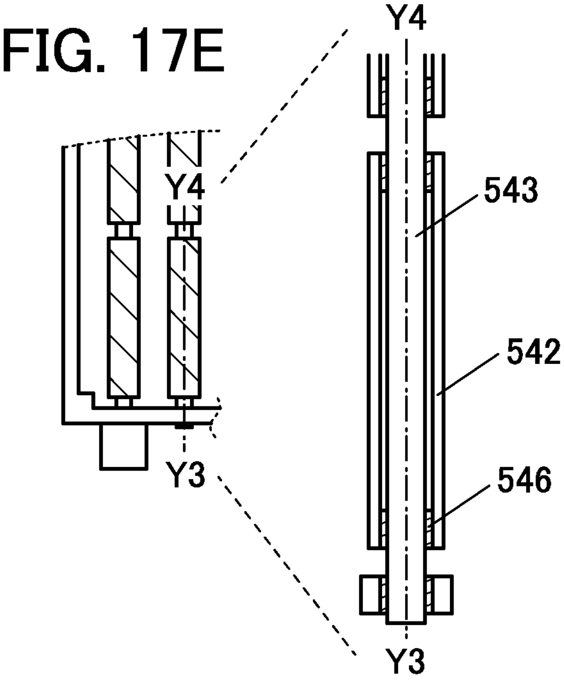

Moreover, FIG. 17(E) is part of a top view of the first roller unit 540 and a cross-sectional view (Y3-Y4 position) of a set of the roller 542 and the rotation axis 543 which is not connected to the rotation mechanism 544. As illustrated above, in the set of the rollers 542 and the rotation axis 543 which is not connected to the rotation mechanism 544, a bearing 546 may be provided between the rollers 542 and the rotation axis 543 in order to reduce the resistance of rotation.

The laser processing must be controlled so that the position of the object to be processed in the height direction is not changed in order to prevent a variation in the energy density of laser light on the irradiation surface.

In the structure using the X-Y stage, the position of the stage and the position of laser irradiation are always changed; therefore, the levelness of the stage and the planarity of the stage surface are important. In the case of using a large substrate, in particular, a large stage having high planarity is necessary, and thus the manufacturing cost becomes high. In addition, a sensor for keeping the levelness of the large stage including a movement mechanism and frequent maintenance are necessary.

On the other hand, the structure of one embodiment of the present invention in which the object to be processed is mounted over the rollers is a structure in which the position of the rollers and the position of laser irradiation are not changed. A mechanism for moving a large stage is not necessary, and thus there is less vibration, and tilt of the rollers due to a change over time is unlikely to be generated. Accordingly, it can be said that it is an apparatus that excels in maintainability. Furthermore, a small number of large components are used, an small motor or the like can be used as power, so that the manufacturing cost can be suppressed low.

Figure 18A:
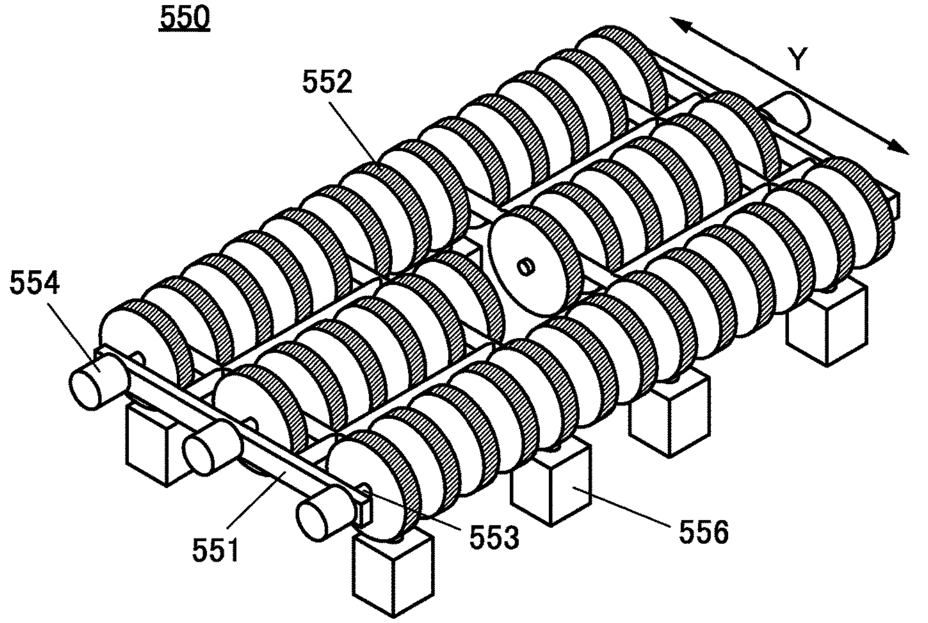
FIGS. 18A-18B Diagrams illustrating a roller unit.
Figure 18B:
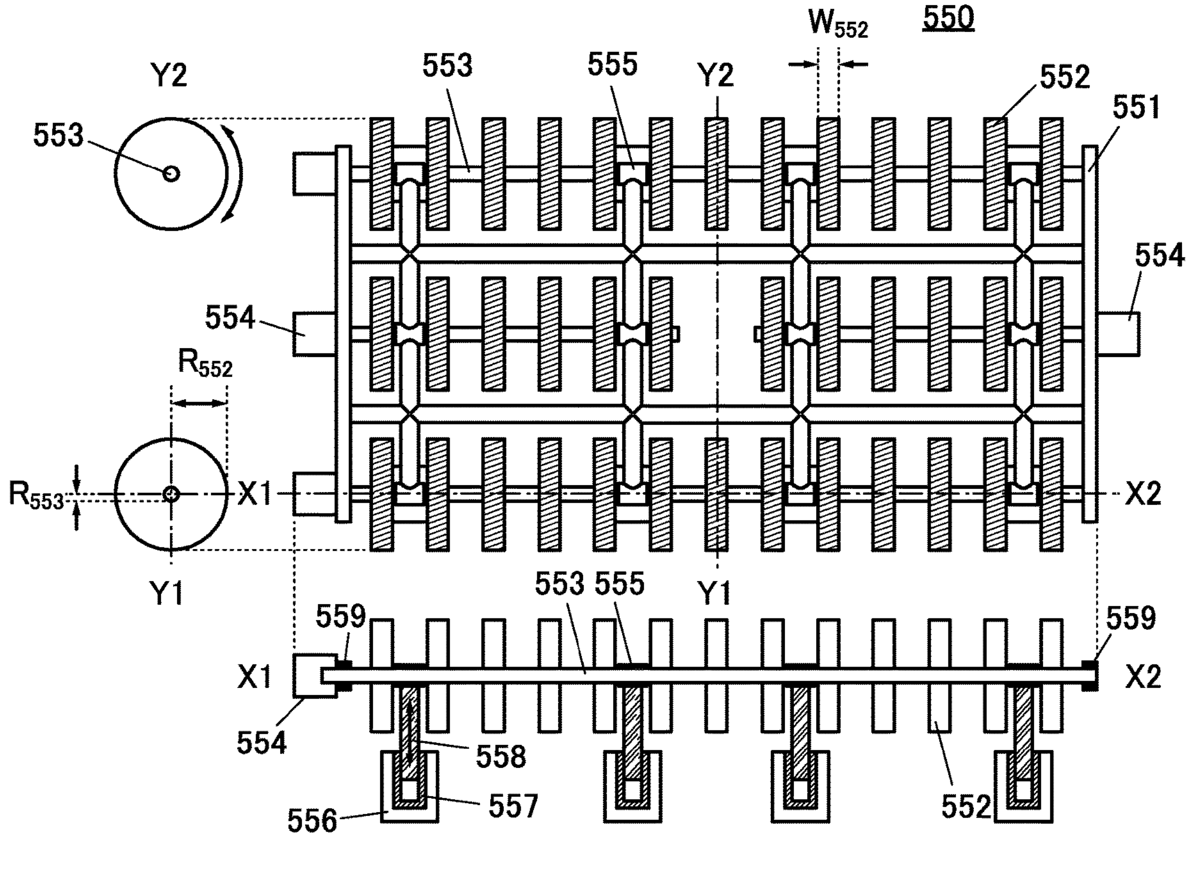
Figure 19A:
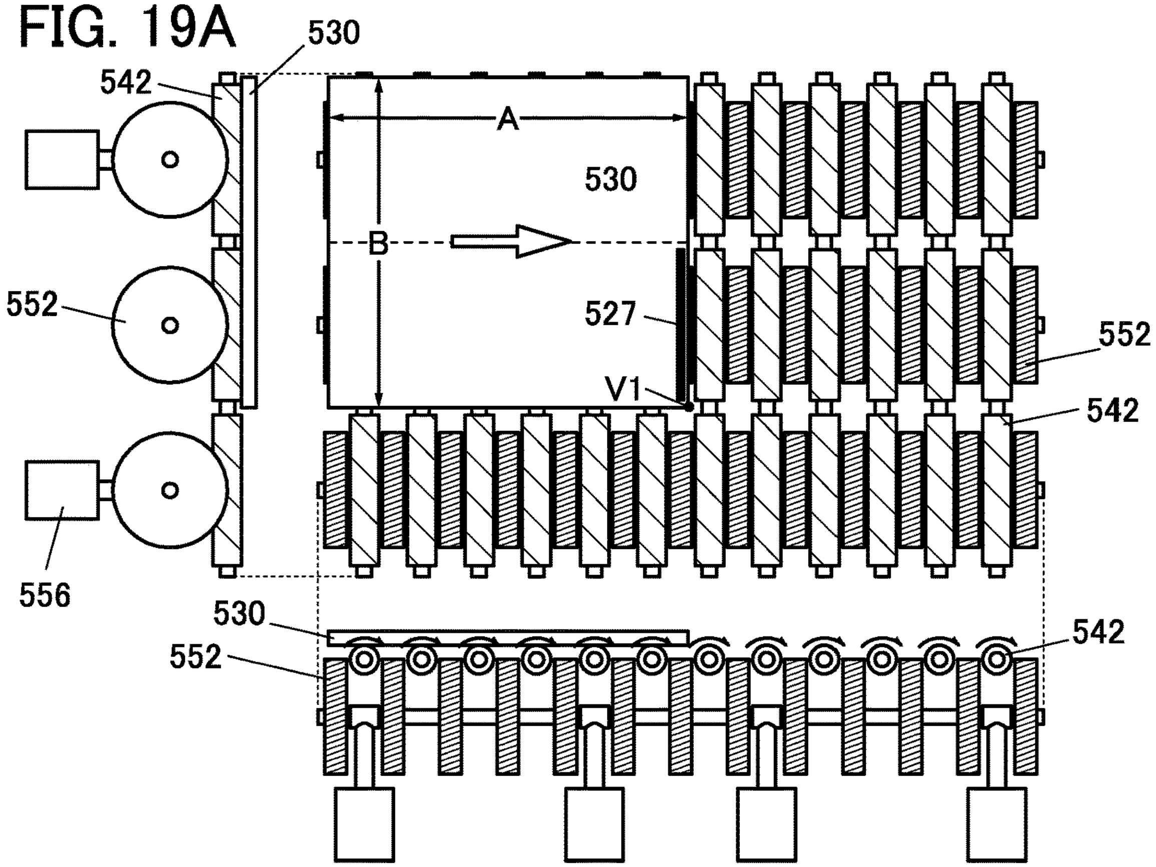
FIGS. 19A-19B Diagrams illustrating a laser processing method.
Figure 19B:
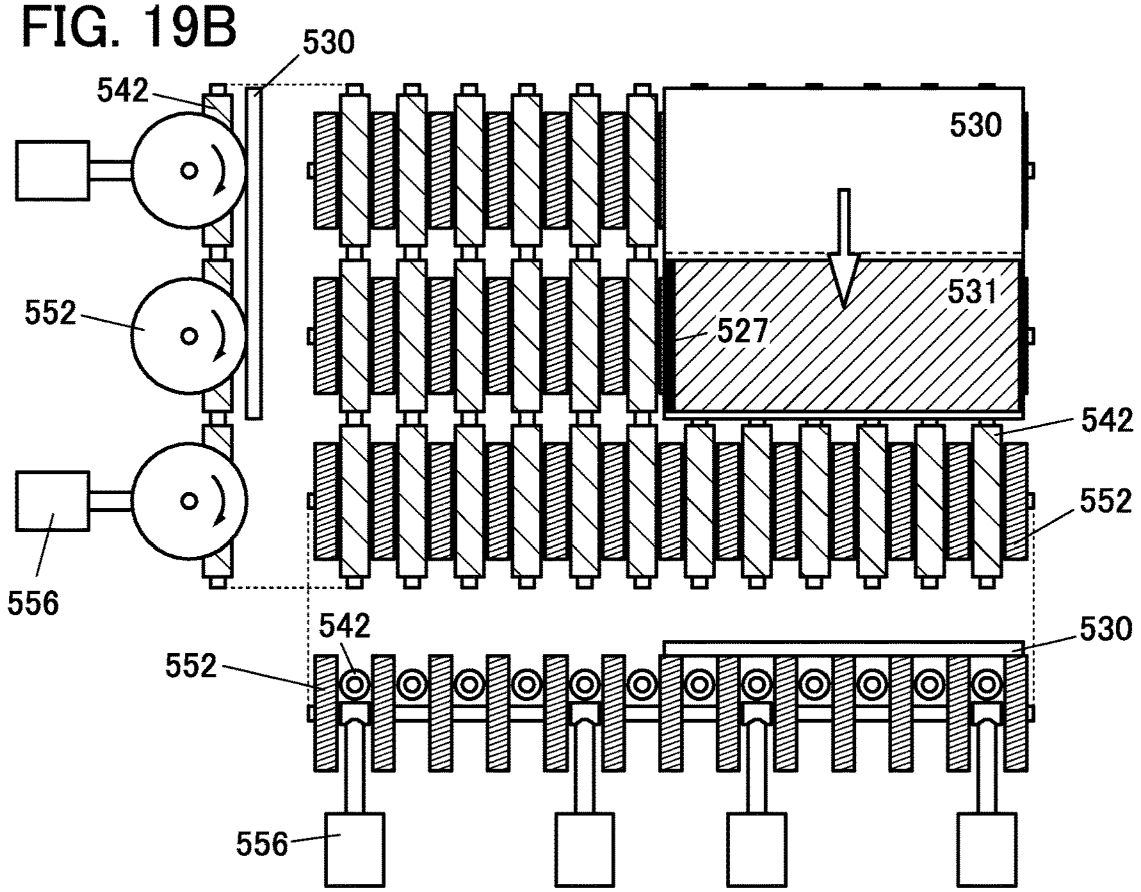

FIG. 18(A) is a perspective view illustrating the second roller unit 550. Furthermore, FIG. 18(B) is a top view of the second roller unit 550, a cross-sectional view taken along X1-X2 in the top view, and a cross-sectional view taken along Y1-Y2 in the top view. The second roller unit 550 includes a plurality of frames 551, a plurality of rollers 552, a plurality of rotation axes 553, a plurality of rotation mechanisms 554, a plurality of bearings 555, and a plurality of raising and lowering mechanisms 556.

The frame 551 is provided with the rotation mechanisms 554. One of end portions of the rotation axis 553 is connected to the rotation mechanism 554, and the other of the end portions of the rotation axis 553 is connected to the frame 551. Note that a bearing 559 is provided between the frame 551 and the rotation axis 553. Moreover, the frame 551 is provided with a plurality of bearings 555 that support the rotation axes 553.

The cylindrical rollers 552 are fixed to the rotation axis 553. The center axis of the roller 552 preferably has a region overlapping with the center axis of the rotation axis 553.

When the rotation mechanism 554 and the rotation axis 553 are connected to each other, the rollers 552 can be rotated, so that the object to be processed 530 can be mounted over the rollers 552 and moved in the second horizontal direction (Y-direction).

The raising and lowering mechanisms 556 includes a cylinder portion 557 and a rod portion 558 and can raise and lower the rod portion 558 by controlling power.

The frame 551 is connected to the rod portions 558. Accordingly, the frame 551 and the rollers 552 can be raised and lowered by operations of the raising and lowering mechanisms 556. Note that although FIGS. 18(A) and 18(B) illustrate a mode in which the rod portion 558 and the bearing 555 are connected to each other, it is acceptable as long as the rod portion 558 is connected to any of parts of the frame 551.

Note that in the central portion of the second roller unit 550, which is an optical path of laser light, the roller 552 and the rotation axis 553 are not provided. Therefore, in the central row in FIG. 18(B), one set of the roller 552, the rotation axis 553, and the rotation mechanism 554 is provided on each of right and left.

Although FIGS. 18(A) and 18(B) illustrate an example in which sets of the rollers 552, the rotation axes 553, and the rotation mechanisms 554 are provided in three rows, it is acceptable as long as the sets are provided in at least two rows in order to move the object to be processed 530.

Furthermore, when the first roller unit 540 and the second roller unit 550 are provided to overlap with each other, the roller 552 is raised and lowered in a region of the first roller unit 540 where the roller 542 is not provided. Accordingly, a width $W_{552}$ of the roller 552 (which corresponds to the height of the cylinder) is made smaller than a distance $W_{542}$ (see FIG. 16(B)) between the adjacent rollers 542, whereby raising and lowering becomes possible.

Moreover, in order to mount the object to be processed 530 on the rollers 552 and move it, the heads need to be raised to a positon higher than the heads of the rollers 542. Accordingly, when the radius of the roller 542 is $R_{42}$ and the radius of the rotation axis 553 right under the roller 542 is $R_{553}$, the radius $R_{553}$ of the roller 552 is made larger than $2R_{542}+R_{553}$, whereby the roller 552 can be raised to a desired height. Note that in the case where the radius $R_{553}$ of the roller 552 is smaller than or equal to $2R_{542}+R_{553}$, the rotation axis 553 may collide with the roller 542 when the roller 552 is raised.

For the roller 542 and the roller 552, for example, a cylinder of a metal, a resin, or the like, a cylinder of an elastic body such as rubber, a member provided with an elastic body such as rubber on a surface of a cylinder of a metal or a resin, and the like can be used. Note that in order to prevent deterioration due to electrification of a device included in the object to be processed 530, the above resin or elastic body preferably has conductivity.

As the rotation mechanism 544 and the rotation mechanism 554, a motor can be used, for example. A motor with high positional accuracy, such as a stepping motor, is preferable in order that the object to be processed 530 is subjected to laser processing at a desired position thereof. Furthermore, a sensor that detects the position of the object to be processed 530 may be provided to prevent misalignment due to the influence of a backlash or the like.

As the raising and lowering mechanisms 556, an electric cylinder, a hydraulic cylinder, an air cylinder, or the like, using a ball screw or the like can be used.

Note that there is no limitation on the number of components in the first roller unit 540 and the second roller unit 550, and an appropriate number may be selected in accordance with the size or the weight of the object to be processed 530.

Here, laser irradiation of the object to be processed 530 provided over the first roller unit 540 will be described.

FIGS. 19(A) and 19(B) and FIGS. 20(A) and 20(B) are top views, front views, and side views illustrating a method in which the object to be processed 530 is irradiated with the linear beam 527 to form a processed region 531 in the entire surface (effective region). Note that for simplification of the drawings, the frame 541 and the rotation mechanism 544 of the first roller unit 540 and the frame 551 and the rotation mechanism 554 of the second roller unit 550 are not illustrated. Furthermore, the linear beam 527 shows an irradiation position, and the linear beam 527 is fixed in the vicinity of the center of the chamber 511.

The length of the linear beam 527 is ideally greater than or equal to the length of one side of the object to be processed 530. In this case, only by moving the linear beam 527 or the object to be processed 530 in one horizontal direction, the entire object to be processed 530 can be subjected to laser processing. However, a large optical component, which is very expensive, is needed to form a linear beam corresponding to the length of one side of a large glass substrate having the size of G10 (2880×3130 mm) or the like used for manufacture of a display device.

Furthermore, as the linear beam becomes longer, it is more difficult to secure necessary energy density; therefore, a laser oscillator with higher output is also needed. Accordingly, it is practical to use a linear beam that is shorter than the length of the one side of the object to be processed 530 and perform laser irradiation on a desired region several times.

A method for irradiation of the surface of the object to be processed 530 with the linear beam 527 having a length of approximately ½ of the length of the one side of the object to be processed 530 a plurality of times will be described below. Only a desired region of the object to be processed 530 can be irradiated with the linear beam 527 in accordance with the purposes. Alternatively, the entire surface of the object to be processed 530 can be subjected to irradiation. That is, the processed regions 531 may be formed at intervals, and irradiation with the linear beam 527 may be performed to overlap with part of the processed region 531.

First, the object to be processed 530 is placed at a predetermined position over the roller 542. At this time, the raising and lowering mechanism 556 of the second roller unit 550 is in a state of being lowered, and at least the head of the roller 552 is at a position lower than that of the head of the roller 542. Then, with the vicinity of the first vertex V1 of the object to be processed 530 serving as a starting point of processing, the rollers 542 are rotated while irradiation with the linear beam 527 is performed, the object to be processed 530 is moved in the +X direction (see FIG. 19(A)).

Next, the object to be processed 530 is moved by the distance A corresponding to the length of the first side, and then the irradiation with the linear beam 527 is terminated. Then, at least the heads of the rollers 552 are set at a position higher than that of the heads of the rollers 542 using the raising and lowering mechanism 556 to lift the object to be processed 530. Then, the rollers 552 are rotated, and the object to be processed 530 is moved in the −Y direction (see FIG. 19 (B)).

The object to be processed 530 is moved by ½ of the distance B corresponding to the length of the second side of the object to be processed 530, and then at least the heads of the rollers 552 is set at a position lower than that of the heads of the rollers 542 using the raising and lowering mechanism 556, and thus the object to be processed 530 is mounted over the rollers 542. Then, irradiation with the linear beam 527 is started, and the rollers 542 are rotated to move the object to be processed 530 in the −X direction (see FIG. 20(A)).

Figure 20A:
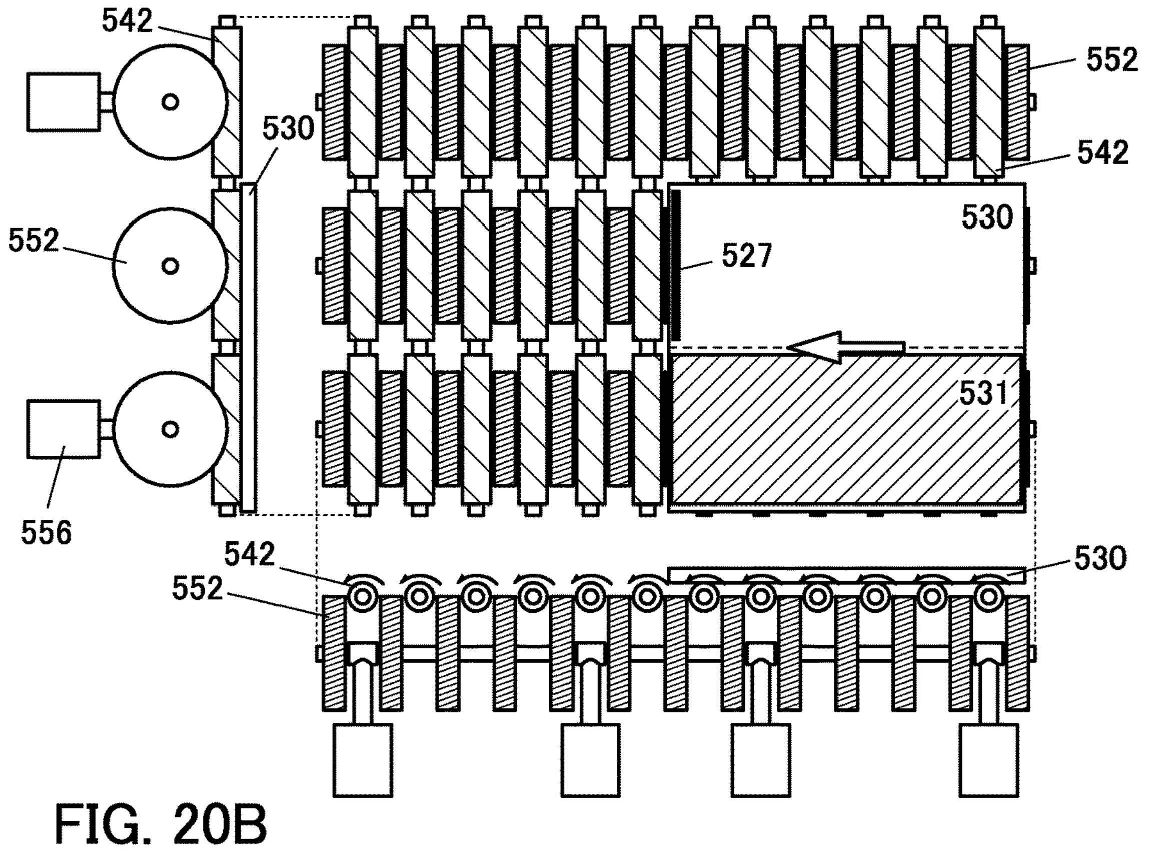
FIGS. 20A-20B Diagrams illustrating a laser processing method.
Figure 20B:
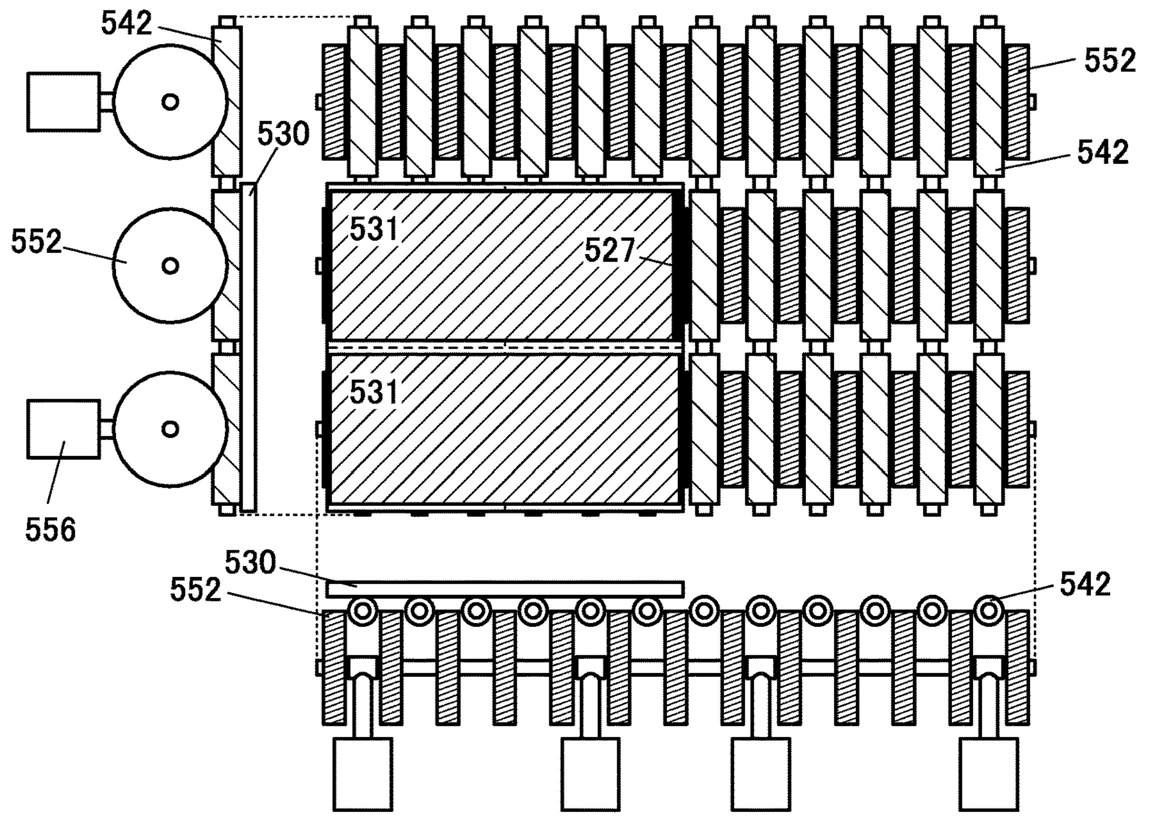

Next, the object to be processed 530 is moved by the distance A, and then the irradiation with the linear beam 527 is terminated (see FIG. 20(B)). Through the above operations, the entire surface of the object to be processed 530 can be irradiated with the linear beam 527.

Note that although the case where the length of the linear beam 527 is approximately ½ of the one side of the object to be processed 530 is described in the above, the basic operation is the same even in the case where the length of the linear beam 527 is shorter. Note that in the case where the length of the linear beam 527 is approximately ⅓ of the length of the one side of the object to be processed 530, the number of times of movement in the −Y direction is two, and the number of times of laser irradiation is three. Furthermore, in the case where the length of the linear beam 527 is approximately ¼ of the length of the one side of the object to be processed 530, the number of times of movement in the −Y direction is three, and the number of times of laser irradiation is four. Moreover, as the length of the linear beam is shorter, the distance of movement in the Y-direction is larger; therefore, the size of the chamber 511 needs to be increased.

Figure 21A:
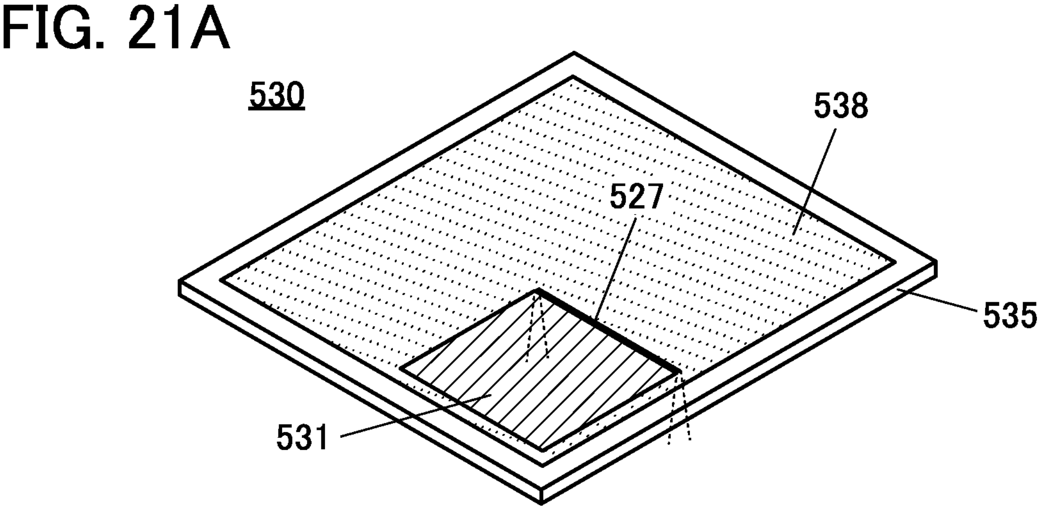
FIGS. 21A-21B Diagrams illustrating structures of an object to be processed.

Next, the object to be processed 530 will be described. As illustrated in FIG. 21(A), the object to be processed 530 can be formed using a flat-plate-like substrate 535 and a layer 538 provided over the substrate 535. The layer 538 can be irradiated with the linear beam 527 through the substrate 535. The substrate 535 is a glass substrate having relatively high transmittance of laser light, or the like and is formed of a material through which the layer 538 can be irradiated with the linear beam 527 having a required energy density. The layer 538 includes a resin layer of polyimide or the like, for example, and is a layer in which the resin layer can be processed by being irradiated with the linear beam 527 having a given intensity or higher.

The resin layer is provided in contact with an entire surface of the substrate 535. Alternatively, it may be provided partly in contact with the substrate 535. By laser processing of the resin layer, the adhesion between the resin layer and the substrate 535 is decreased, so that the layer 538 and the substrate 535 can be separated from each other.

Figure 21B:
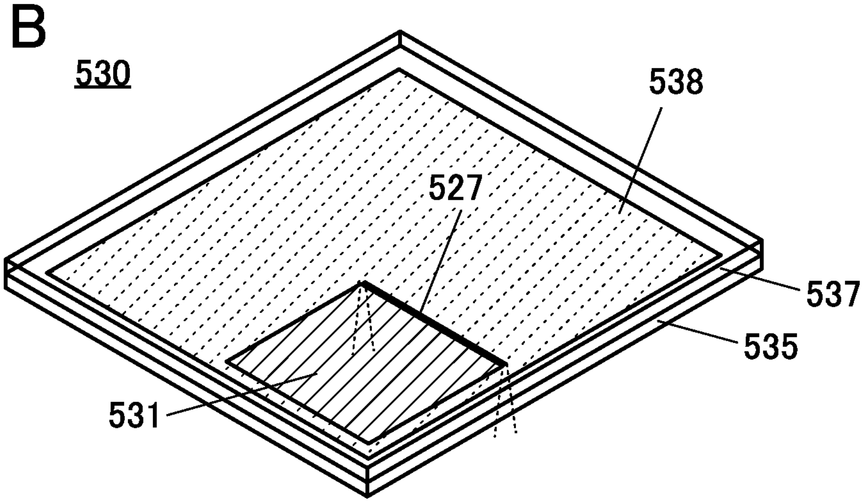

Furthermore, as illustrated in FIG. 21(B), the object to be processed 530 can have a structure including the substrate 535, a substrate 537, and the layer 538 sandwiched between the two substrates.

Figure 22A:
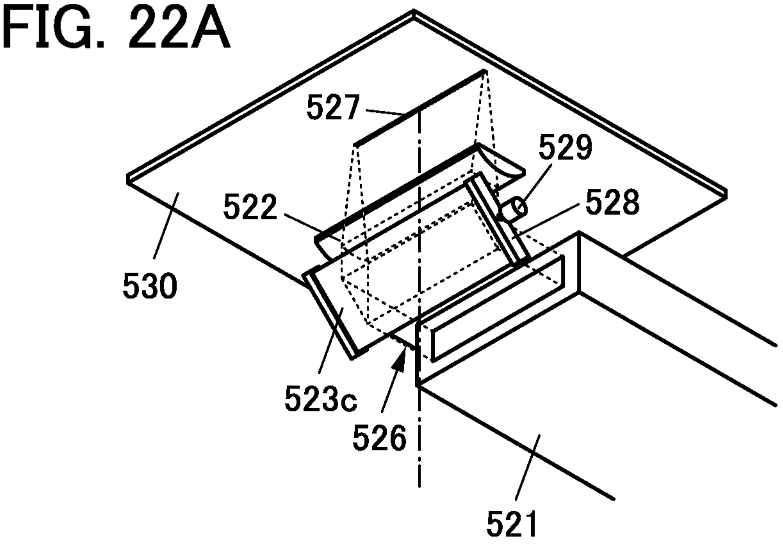
FIGS. 22A-22C Diagrams illustrating modes of laser irradiation.
Figure 22B:
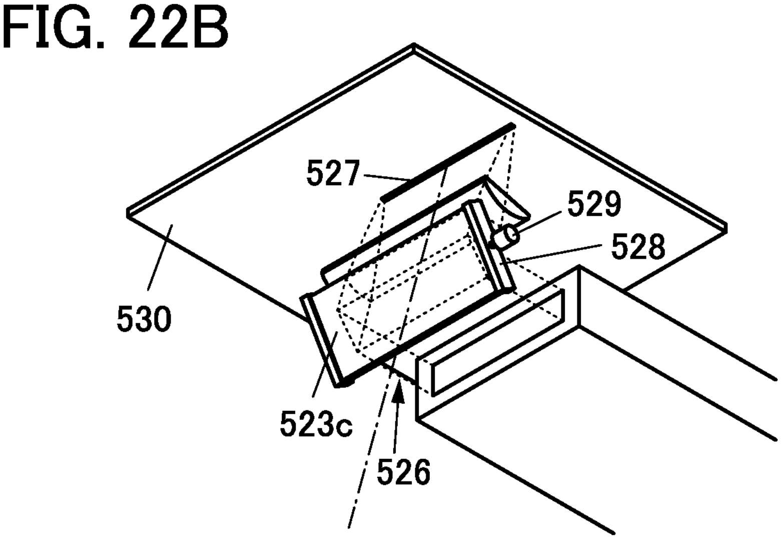

Furthermore, although FIGS. 15(A) and 15(B) illustrate an example in which the mirror 523*c* is provided so that an incident angle of the laser light 526 is approximately 450 as illustrated in FIG. 22(A), the incident angle of the laser light 526 with respect to the mirror 523*c* may be an angle smaller than 450 as illustrated in FIG. 22(B). For example, the incident angle is larger than or equal to 200 and smaller than 45°, preferably larger than or equal to 250 and smaller than or equal to 40, further preferably larger than or equal to 300 and smaller than or equal to 40.

Figure 22C:
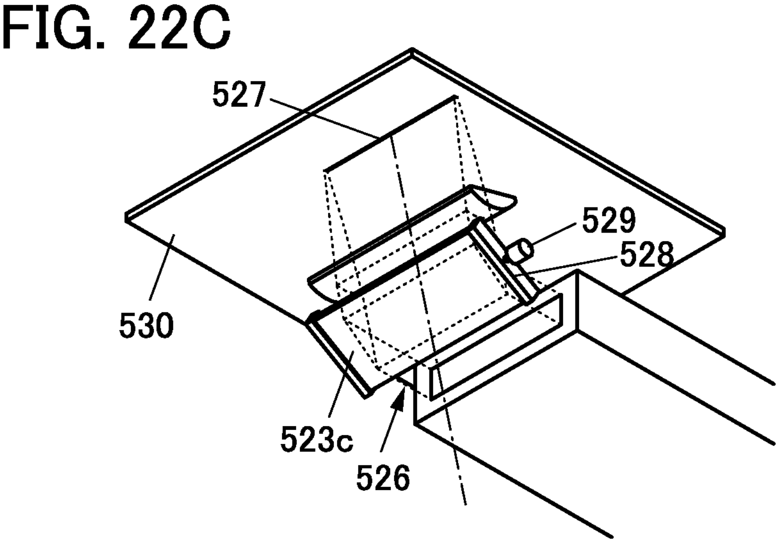

Alternatively, as illustrated in FIG. 22(C), the incident angle of the laser light 526 with respect to the mirror 523*c* may be an angle larger than 45°. For example, the incident angle is larger than 450 and smaller than or equal to 70°, preferably larger than or equal to 500 and smaller than or equal to 65°, further preferably larger than or equal to 500 and smaller than or equal to 60°.

The incident angle of the laser light 526 with respect to the mirror 523*c* is changed as illustrated in FIGS. 22(A) to 22(C), whereby the object to be processed 530 can be obliquely irradiated with the linear beam 527. Therefore, when the object to be processed 530 has a structure illustrated in FIGS. 20(A) and 20(B), and the layer 538 is irradiated with the linear beam through the substrate 535, for example, processing defect caused by the shadow due to a foreign substance attached to the substrate 535 can be suppressed. Furthermore, it is more effective to perform processing at the above angle.

As a laser irradiation method in this case, the object to be processed 530 is irradiated with the linear beam in any two of the modes illustrated in FIGS. 22(A) to 22(C). For example, any one of the modes illustrated in FIGS. 22(A) to 22(C) is selected to perform first laser irradiation on the object to be processed 530, and the mode other than the mode selected for the first laser irradiation is selected to perform second laser irradiation on the region that has been irradiated.

Note that the incident angle of the laser light 526 with respect to the mirror 523*c* can be easily changed by change of the angle of the mirror 523*c*. For example, as illustrated in FIGS. 22(A) to 22(C), a jig 528 provided for the mirror 523*c* is rotated with a motor 529. At this time, a mechanism for vertical moving of the mirror 523*c* to the lens 522 may be used so that a focal point of the linear beam 527 is formed in a desired region.

Figure 23:
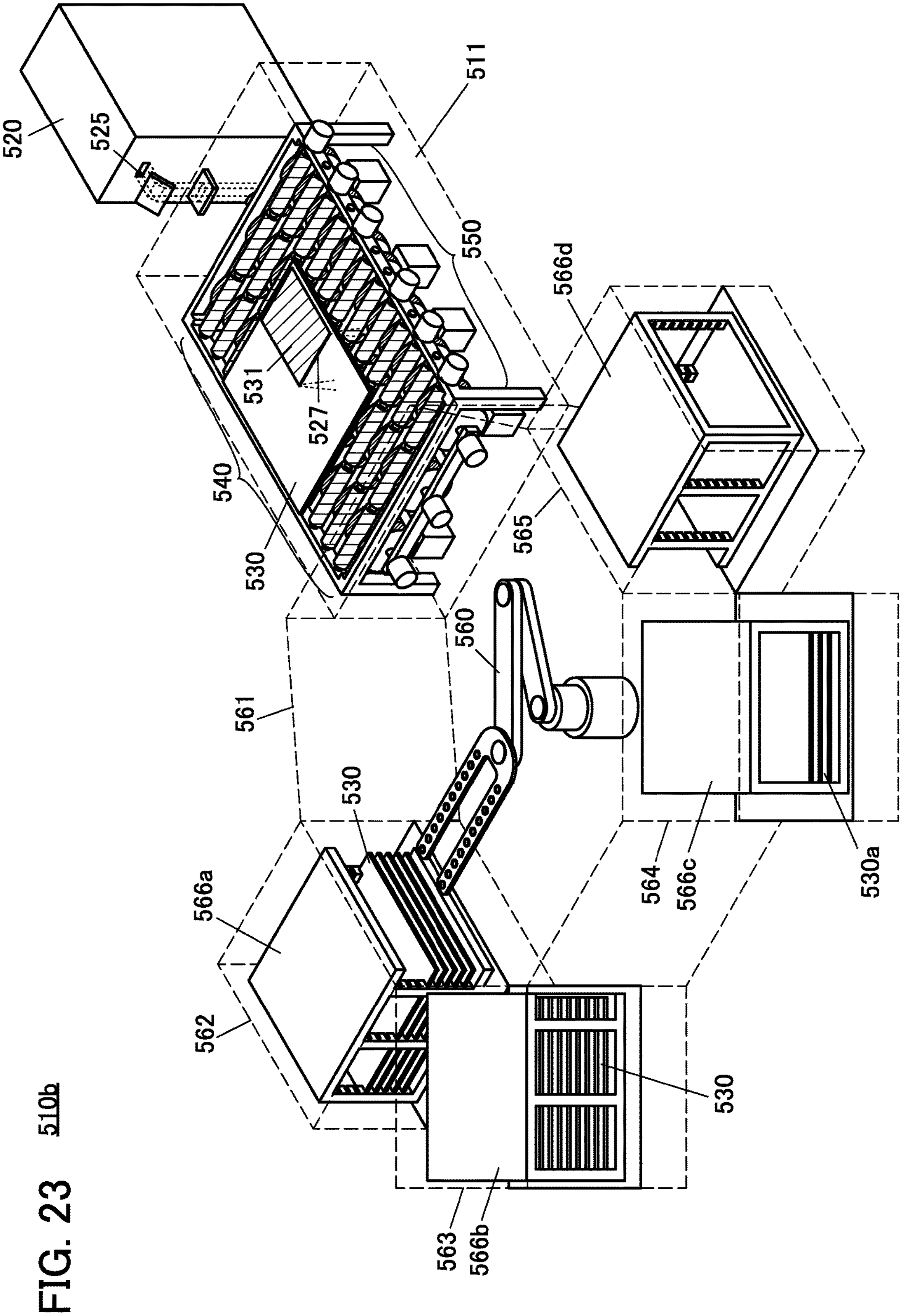
FIG. 23 A diagram illustrating a laser processing apparatus.

FIG. 23 illustrates an example of a structure of the above laser processing apparatus to which an apparatus for carrying out/in the object to be processed 530 is added.

A processing apparatus 510*b* illustrated in FIG. 23 includes a laser processing apparatus, a transfer chamber 561, load chambers 562 and 563, and unload chambers 564 and 565. Note that in FIG. 23, gate valves and the like are omitted and each chamber is simply illustrated. Note that although FIG. 23 illustrates a structure including two load chambers and two unload chambers, a structure including one load chamber and one unload chamber may be employed. Alternatively, a structure may be employed in which one chamber serves as a load chamber and an unload chamber.

The transfer chamber 561 includes a transfer mechanism 560 and a member can be carried out of/in each chamber before and after processing.

The transfer mechanism 560 is an arm-type robot and includes a raising and lowering mechanism, a joint mechanism, an arm, a fork, and the like. The object to be processed 530 and the like can be transferred by a telescopic operation of the arm using the joint mechanism or the like as an axis, an upward/downward operation of the raising and lowering mechanism, and the like.

Furthermore, the object to be processed 530 is supported by the fork with an adsorption mechanism. As the adsorption mechanism, a vacuum suction mechanism can be used, for example. Furthermore, the adsorption mechanism may have a sucker.

The load chambers 562 and 563 include cassettes 566*a* and 566*b* and can store the object to be processed 530 which has not been processed.

The unload chambers 564 and 565 include cassettes 566*c* and 566*d* and can store a member 530*a* that has been processed and has been carried out of the chamber 511 of the laser processing apparatus.

Next, an example of a process using the processing apparatus 510*b* is briefly described. Note that the object to be processed 530 has the mode illustrated in FIG. 21(A), and the purpose is laser processing of the resin provided over the substrate 535.

First, the cassette 566*a* where the object to be processed 530 is stored is set in the load chamber 562, and the object to be processed 530 is transferred to the chamber 511 of the laser processing apparatus by the transfer mechanism 560.

Here, a method for transfer to the chamber 511 will be described with reference to FIGS. 24(A) to 24(D). First, the fork of the transfer mechanism 560 is inserted into the load chamber 562, and the object to be processed 530 is taken out from the cassette 566*a*. At this time, the rollers 552 of the second roller unit 550 are in a state of being lowered (see FIG. 24(A)).

Next, the object to be processed 530 over the fork of the transfer mechanism 560 is transferred to predetermined X and Y positions over the first roller unit 540 and the second roller unit 550 in the chamber 511. Then, the rollers 552 are raised by the raising and lowering mechanisms 556 to lift the object to be processed 530 from the fork of the transfer mechanism 560 (see FIG. 24(B)).

Figure 24A:
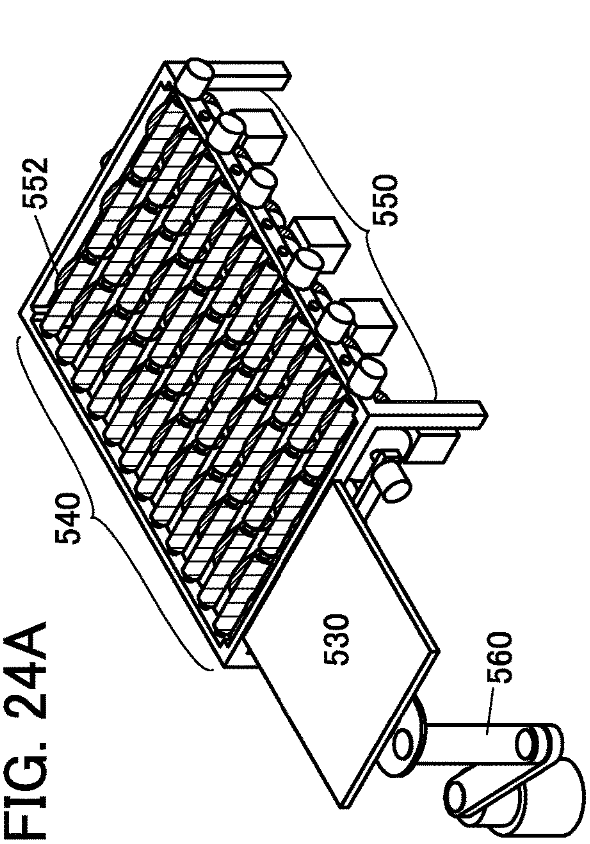
FIGS. 24A-24D Diagrams illustrating a method for transferring an object to be processed.
Figure 24B:
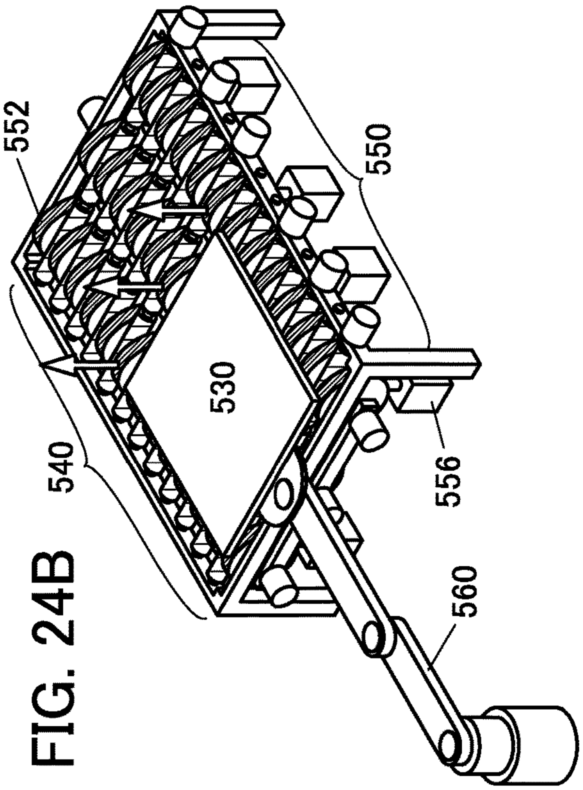
Figure 24C:
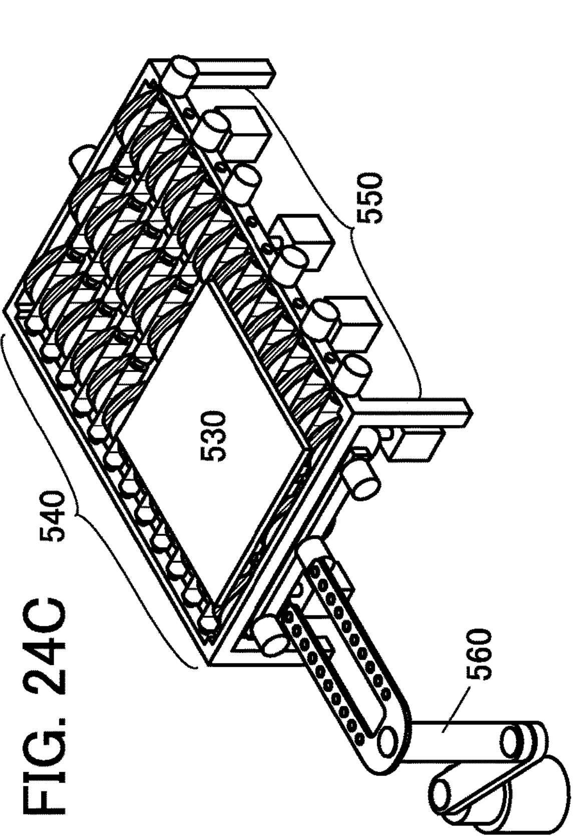
Figure 24D:
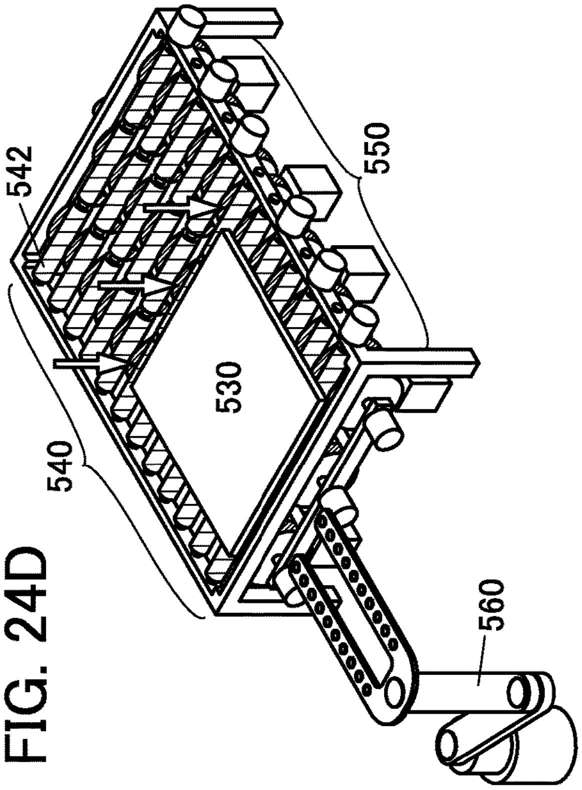

Next, the fork of the transfer mechanism 560 is moved to the outside of the chamber 511 (see FIG. 24(C)).

Then, the rollers 552 are lowered by the raising and lowering mechanisms 556 to set the object to be processed 530 onto the rollers 542. Alternatively, the rollers 552 may be rotated to move the object to be processed 530 to a desired Y position and then may be lowered. Through the above, the object to be processed 530 can be transferred to the chamber 511 (see FIG. 24(D)).

Next, the object to be processed 530 set onto the rollers 552 is moved to desired X and Y positions where laser processing is started, using the rollers 542 or the rollers 552.

Next, by the method described in FIG. 19 and FIG. 20, the object to be processed 530 is subjected to laser processing to form the member 530*a* that has been processed. Then, the member 530*a* is moved to predetermined X and Y positions using the rollers 542 or the rollers 552.

Next, the rollers 552 are raised to lift the member 530*a* from the rollers 542, and the fork of the transfer mechanism 560 is inserted between the rollers 542 and the member 530*a*. Then, the rollers 552 are lowered to place the member 530*a* over the fork.

Next, the member 530*a* placed over the fork of the transfer mechanism 560 is transferred to the outside of the chamber 511, and the member 530*a* is stored in the cassette 566*c* set in the unload chamber 564.

In this manner, in the laser processing apparatus of one embodiment of the present invention, the object to be processed 530 can be carried in and the member 530*a* can be carried out using the rollers for moving the object to be processed 530 and the like. In the carried-in/out method, a lift pin or the like is not used, so that the apparatus can be manufactured at low cost.

Figure 25:
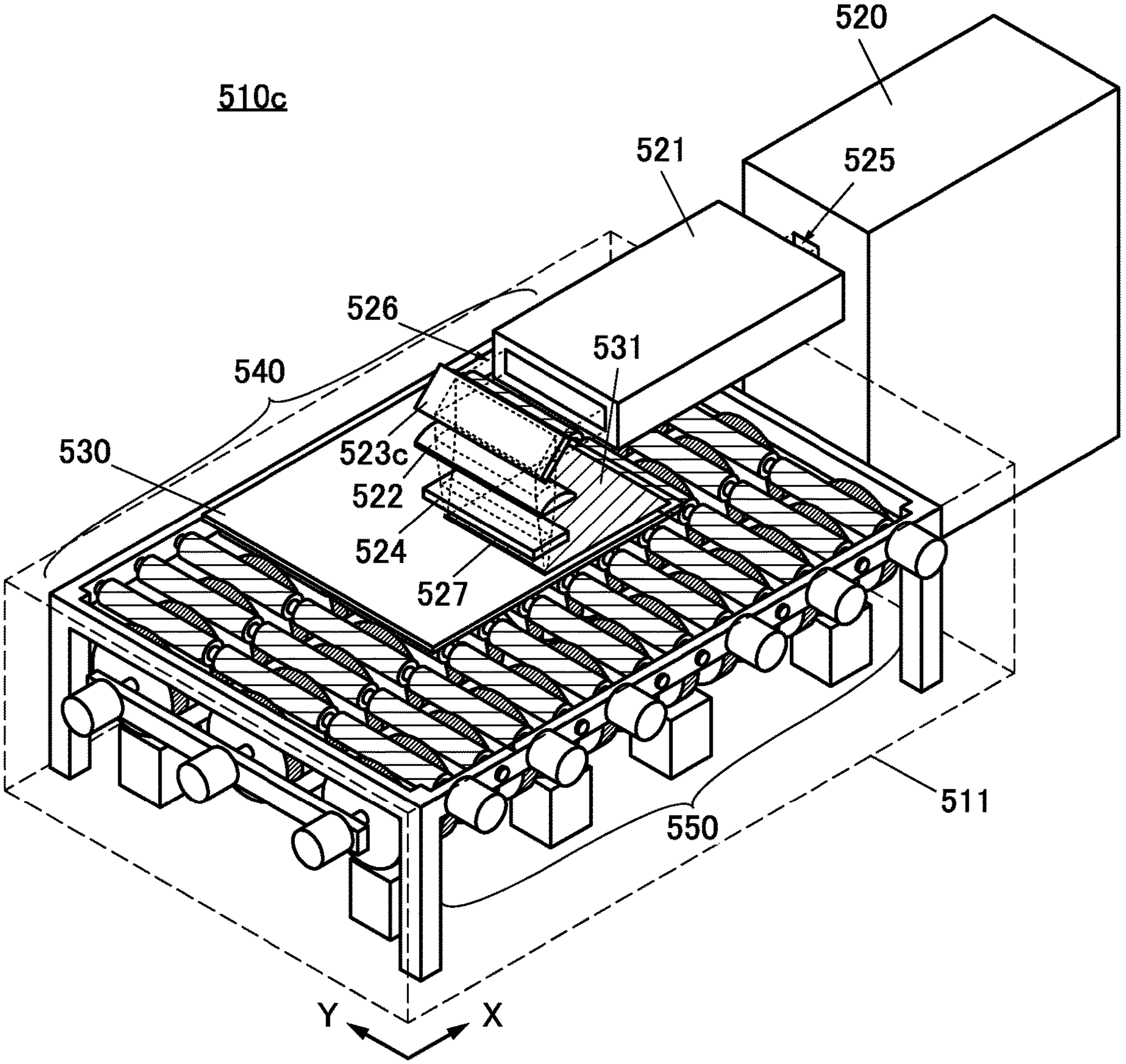
FIG. 25 A diagram illustrating a laser processing apparatus.

Note that the first roller unit 540 and the second roller unit 550 can also be applied to a structure in which irradiation with laser light is performed from the upper side of the object to be processed 530 as illustrated in FIG. 25.

A laser processing apparatus 510*c* illustrated in FIG. 25 has a structure similar to that of the laser processing apparatus 510*a* illustrated in FIGS. 15(A) and 15(B) excluding a structure of part of the laser irradiation mechanism and a structure of part of the second roller unit 550.

In the laser processing apparatus 510*c*, the optical system unit 521 to the lens 522 can be provided above the first roller unit 540 and the second roller unit 550, and thus the mirror 523*a* and the mirror 523*b* illustrated in FIG. 15(B) can be omitted.

Figure 26A:
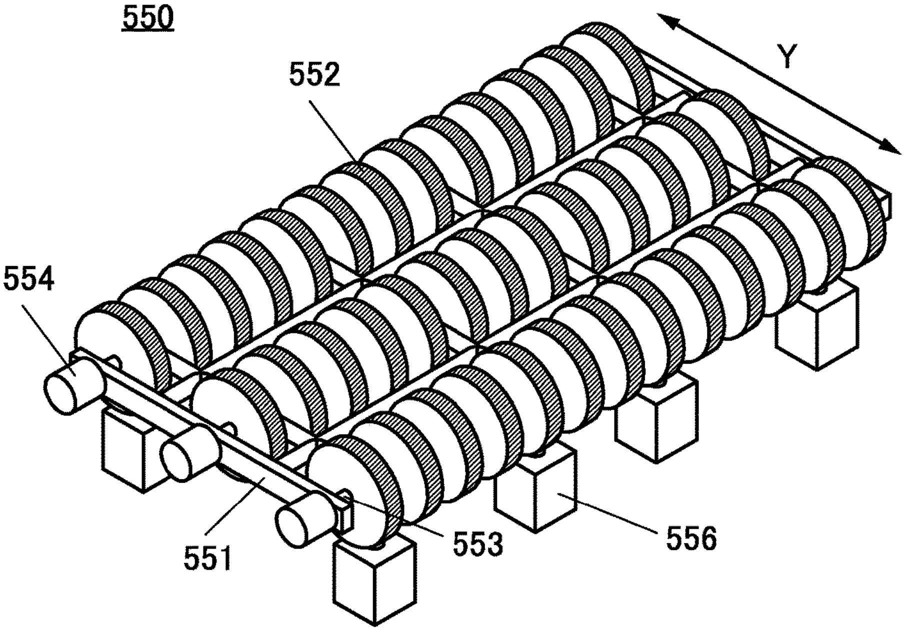
FIGS. 26A-26B Diagrams illustrating a roller unit.
Figure 26B:
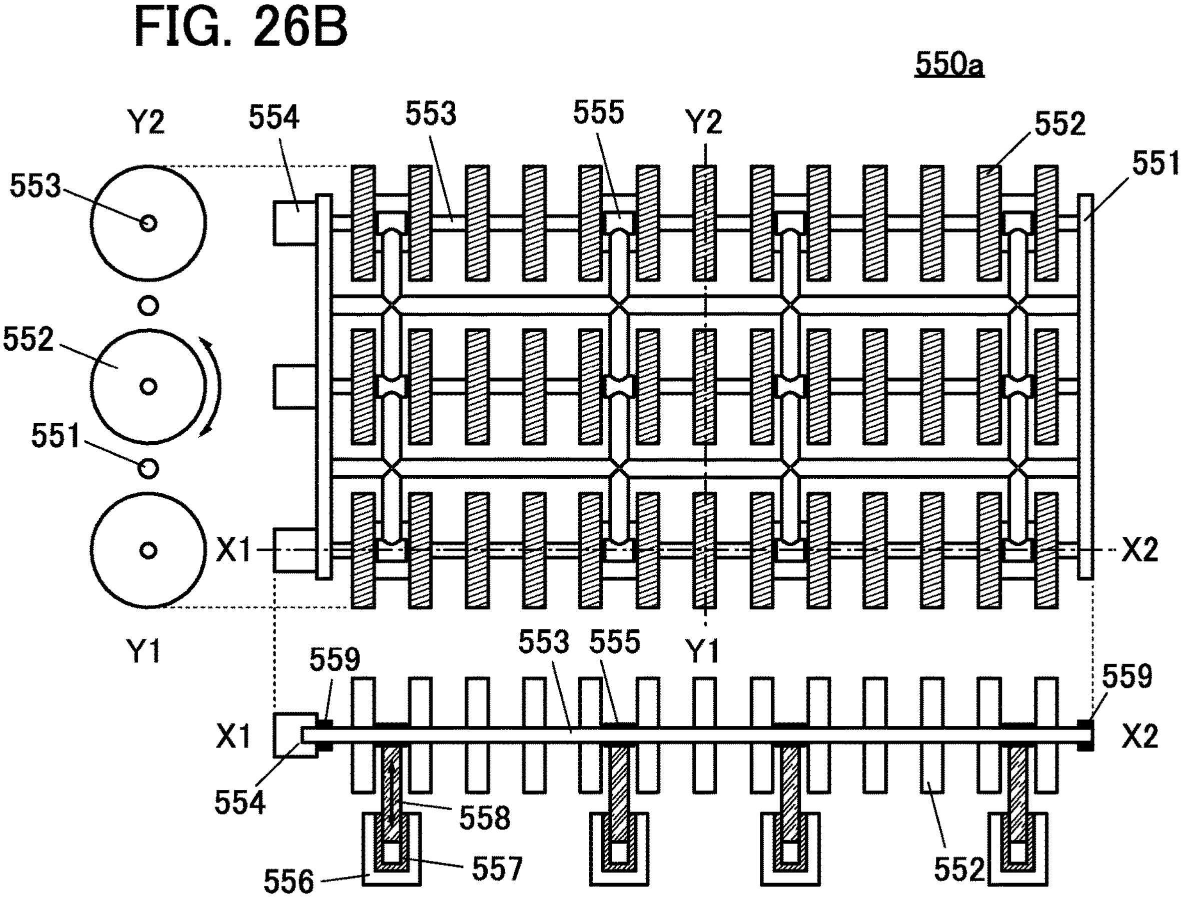

Moreover, an optical path of laser light does not need to be provided in the second roller unit 550 as illustrated in FIG. 26; therefore, the roller 552 in the central portion of the second roller unit 550 can be provided. Accordingly, all the rollers 552 in the center row can be fixed to one rotation axis 553, and thus in the center row in FIG. 26(B), the rollers 552, the rotation axis 553, and the rotation mechanism 554 form one set.

In this embodiment, a structure of the laser processing apparatus has been described as one embodiment of the present invention. Note that the structure in which the first roller unit 540 and the second roller unit 550 included in the laser processing apparatus are combined can be used not only for laser processing but also for other applications.

At least part of this embodiment can be implemented in combination with any of the other embodiments described in this specification as appropriate.

Embodiment 3

In this embodiment, a method for manufacturing a display device that can be manufactured using the laser processing apparatus or the stack processing apparatus of one embodiment of the present invention will be described.

One embodiment of the present invention is a separation method in which a resin layer is formed over a substrate, a transistor including an oxide semiconductor in a channel formation region is formed over the resin layer, the resin layer is irradiated with laser light that is shaped into a linear beam, and the transistor and the substrate are separated.

A metal oxide is used for the channel formation region of the transistor. With the use of a metal oxide, the maximum process temperature can be lower than that in the case of using low-temperature polysilicon (LTPS).

When LTPS is used for the channel formation region of the transistor, the maximum process temperature reaches approximately 500° C. to 550° C. Thus, the resin layer needs to have heat resistance. Furthermore, the resin layer is required to have a larger thickness to relieve the damage to an insulating layer or the like at the periphery of the resin layer in a laser crystallization step. In addition, when the resin layer is irradiated with laser light, a large thickness of the resin layer is required to suppress the degradation of characteristics caused by irradiation of the channel formation region of the completed transistor with laser light.

In contrast, the transistor using a metal oxide does not need heat treatment at high temperatures, and can be formed at a temperature lower than or equal to 350° C., or even lower than or equal to 300° C. Therefore, the resin layer is not required to have high heat resistance. Accordingly, a relatively inexpensive resin whose heat-resistance temperature is low can be used for the resin layer. Furthermore, the transistor using a metal oxide does not need a laser crystallization step. Moreover, the metal oxide has a wide band gap greater than or equal to 2.5 eV and lower than or equal to 3.5 eV, and absorbs a smaller amount of laser light with a specific wavelength than silicon. Thus, there is no problem when the resin layer has a small thickness.

Since the resin layer is not required to have high heat resistance and can be thinned, the manufacturing costs of a device can be significantly reduced. Furthermore, a metal oxide is preferably used, in which case the process can be simplified as compared with the case where LTPS is used.

In one embodiment of the present invention, a transistor or the like is formed at a temperature lower than or equal to the allowable temperature limit of the resin layer. Here, the heat resistance of the resin layer can be measured by, for example, a weight loss percentage due to heat, specifically, the 5% weight loss temperature, or the like. The 5% weight loss temperature of the resin layer is preferably lower than or equal to 450° C., further preferably lower than or equal to 400° C., still further preferably lower than 350° C. For example, a transistor is formed at a temperature lower than or equal to 350° C., or even lower than or equal to 300° C.

In one embodiment of the present invention, a resin layer may be formed using a photosensitive material. With the photosensitive material, a resin layer with a desired shape can be easily formed. For example, a resin layer having an opening or a resin layer having two or more regions with different thicknesses can be easily formed. Accordingly, the resin layer can be prevented from hindering formation of a back gate, an external connection terminal, a through electrode, or the like.

A flexible display device can be manufactured using the separation method of a structure body of one embodiment of the present invention. An example of a manufacturing method of a flexible display device will be described with reference to FIG. 27 and FIG. 28.

Figures 27A, 27B, 27C, 27D:
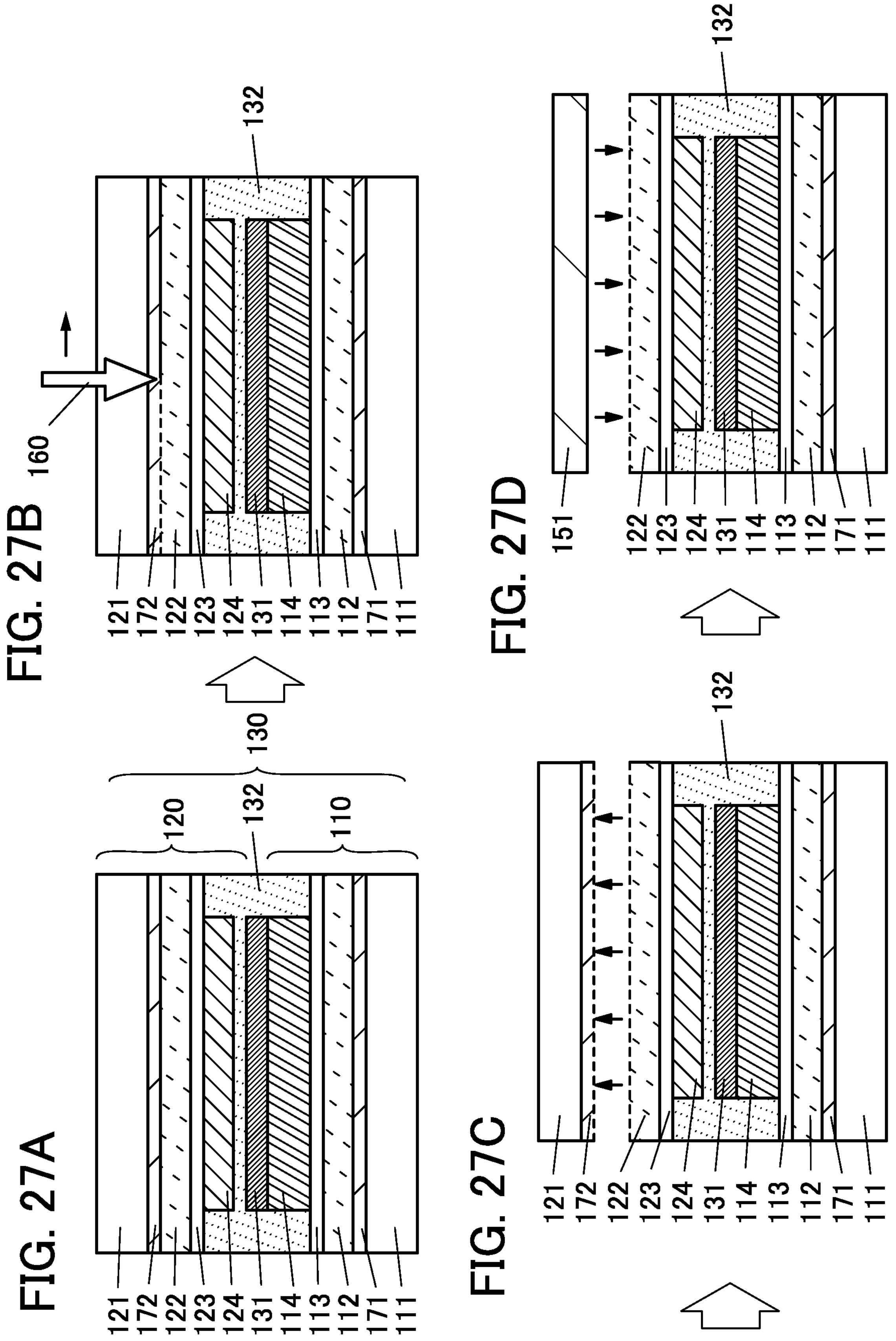
FIGS. 27A-27D Diagrams illustrating an example of a method for manufacturing a flexible device.

First, as illustrated in FIG. 27(A), a stack in which a stack 110 and a stack 120 are attached to each other with an adhesive layer 132 is referred to as a stack 130.

The stack 110 includes, for example, a substrate 111, a separation layer 171, a resin layer 112, an insulating layer 113, a first element layer 114, and a second element layer 131.

The stack 120 includes, for example, a substrate 121, a separation layer 172, a resin layer 122, an insulating layer 123, and a functional layer 124. Here, the stack 130 corresponds to the object to be processed 30 described in Embodiment 1 with reference to FIG. 10(B). Furthermore, the substrate 111 corresponds to the substrate 35, and the substrate 121 corresponds to the substrate 37. Moreover, the separation layer 171, the resin layer 112, the insulating layer 113, the first element layer 114, the second element layer 131, the functional layer 124, the insulating layer 123, the resin layer 122, and the separation layer 172 correspond to the layer 38.

For the substrates 111 and 121, a rigid substrate can be used, and for example, a glass substrate can be used. Since the resin layers 112 and 122 are irradiated with laser light through the substrates 111 and 121 in a later step, the substrates 111 and 121 preferably have high transmittance of the laser light.

For the separation layers 171 and 172, a metal or a metal oxide can be used. As the metal, for example, various metals such as titanium, molybdenum, aluminum, tungsten, and tantalum or an alloy thereof can be used.

Moreover, as the metal oxide, an oxide of any of a variety of metals can be used. For example, titanium oxide, molybdenum oxide, aluminum oxide, tungsten oxide, indium tin oxide, indium zinc oxide, or an In—Ga—Zn oxide, and the like can be given.

For the resin layers 112 and 122, a photosensitive and thermosetting material can be used, for example. Specifically, a resin such as polyimide is preferably used. A structure capable of separation by changing the adhesion between the separation layers 171 and 172 and the resin layers 112 and 122 can be obtained.

For the insulating layers 113 and 123, an inorganic insulating layer can be used, for example.

The first element layer 114 can include, for example, a transistor using an oxide semiconductor in a channel formation region.

The second element layer 131 can include an EL element, for example.

The functional layer 124 can include at least one of a coloring layer such as a color filter, a light-blocking layer such as a black matrix, and a sensor element such as a touch sensor.

Next, a region to be processed (a region including the separation layer 172 and the resin layer 122) is irradiated with laser light 160 from the substrate 121 side as illustrated in FIG. 27(B). A structure change due to heating of the separation layer 172, the resin layer 122, and the interface by the irradiation with the laser light 160 can reduce the adhesion between the both. The irradiation with the laser light 160 is preferably performed with a linear beam, and the laser processing apparatus of one embodiment of the present invention can be used.

Note that since the region to be processed is irradiated with the laser light through the substrate 121, when a foreign substance or the like exists on a surface of the substrate 121, the laser light with which the region to be processed is irradiated is blocked, which may result in local generation of defective separation in a later step. However, by an absorption of laser light by a metal or a metal oxide which is used as the separation layer 172, the adhesion between the separation layer 172 and the resin layer 122 can be reduced in a range wider than the region that is irradiated with the laser light. Accordingly, even in the case where the laser light is blocked by a foreign substance or the like on the surface of the substrate 121, defective separation in a later step can be suppressed.

Next, as illustrated in FIG. 27(C), a stack of the substrate 121 and the separation layer 172 is separated from the stack 130 by a physical means. For example, the separation can be performed by fixing the substrate 111 with a suction stage or the like, and applying physical force such that the substrate 121 side is moved in the upward direction.

Next, as illustrated in FIG. 27(D), the exposed resin layer 122 and a substrate 151 are attached to each other. The substrate 151 preferably has flexibility. For example, the resin layer 122 and the substrate 151 can be attached to each other with an adhesive.

Figure 28B:
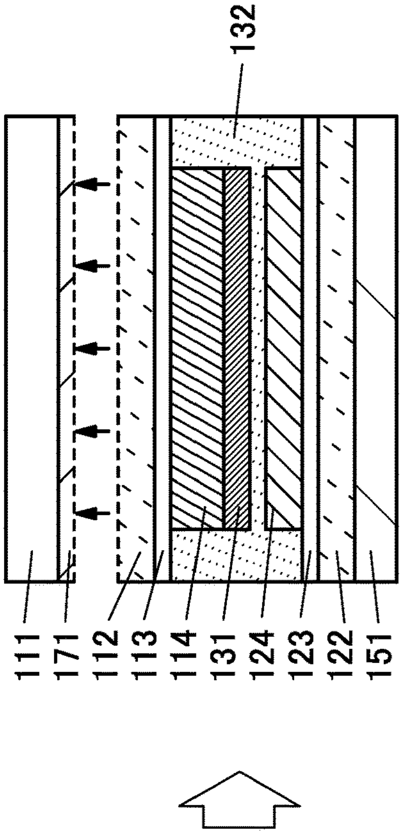
FIGS. 28A-28D Diagrams illustrating an example of a method for manufacturing a flexible device.
Figure 28D:
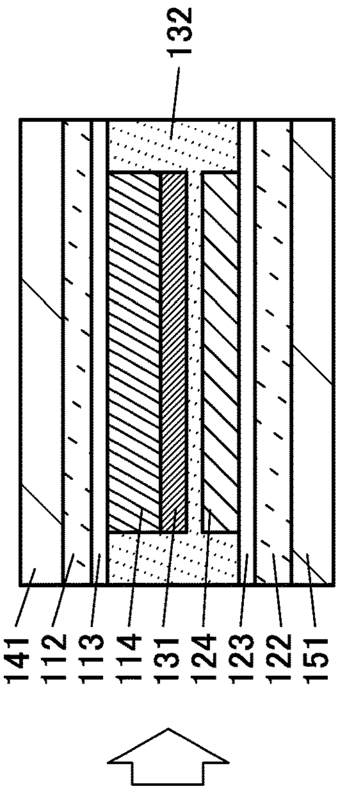
Figure 28A:
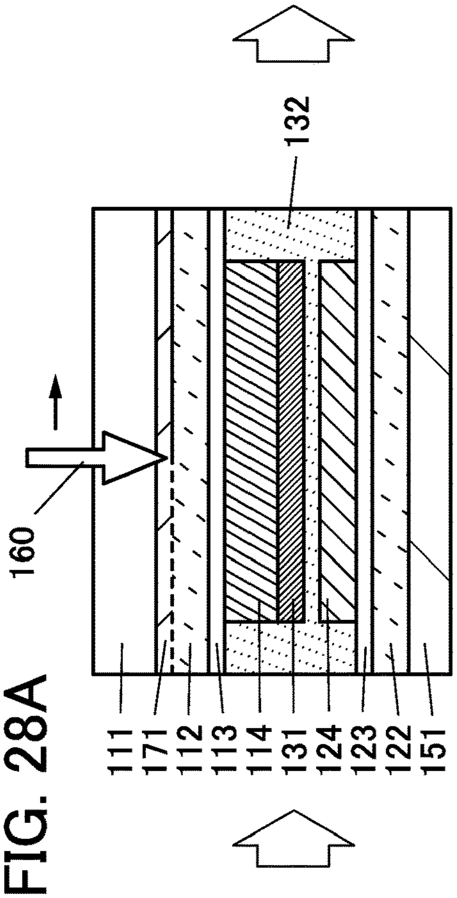

Next, as illustrated in FIG. 28(A), the region to be processed (a region including the separation layer 171 and the resin layer 112) is irradiated with the laser light 160 from the substrate 111 side.

Next, as illustrated in FIG. 28(B), a stack of the substrate 111 and the separation layer 171 is separated from a stack illustrated in FIG. 28(A) by a physical means.

Figure 28C:
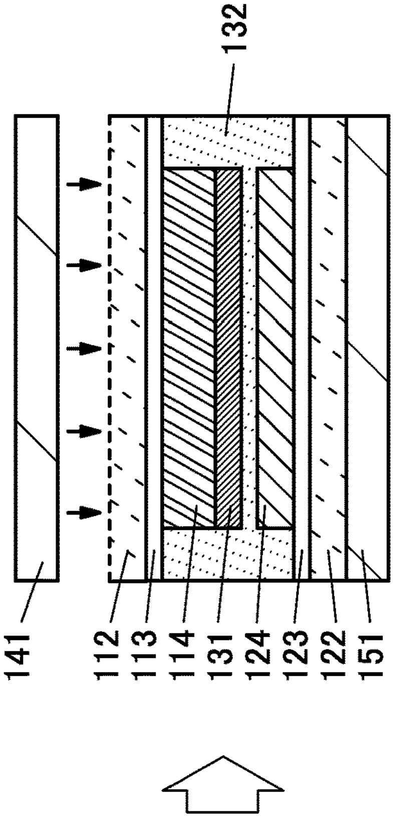

Next, as illustrated in FIG. 28(C), the exposed resin layer 112 and a substrate 141 are attached to each other. The substrate 141 preferably has flexibility.

Note that although a structure in which the resin layers 112 and 122 are left is described in the above step, the resin layers 112 and 122 are preferably removed by ashing treatment in the case where they are not transparent but colored.

Through the above process, a flexible display device 100 illustrated in FIG. 28(D) can be fabricated.

At least part of this embodiment can be implemented in combination with any of the other embodiments described in this specification as appropriate.

Embodiment 4

By using the separation process described in Embodiment 2, a hybrid display that can perform hybrid display can be manufactured relatively easily. In this embodiment, a hybrid display will be described.

Hybrid display is a method for displaying a letter or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display that performs hybrid display is locally observed, a pixel or a subpixel performing display using any one of the plurality of display elements and a pixel or a subpixel performing display using two or more of the plurality of display elements are included in some cases.

Note that in this specification and the like, one satisfying any one or a plurality of expressions of the above-described structures is referred to as hybrid display.

Furthermore, a hybrid display includes a plurality of display elements in one pixel or one subpixel. Note that as the plurality of display elements, for example, reflective elements that reflect light and self-luminous elements that emit light can be given. Note that the reflective element and the self-luminous element can be controlled independently. A hybrid display has a function of displaying a letter and/or an image using one or both of reflected light and self-emitted light in a display portion.

The display device of one embodiment of the present invention can include a pixel provided with a first display element that reflects visible light. Alternatively, the display device can include a pixel provided with a second display element that emits visible light.

Alternatively, the display device can include a pixel provided with the first display element and the second display element.

In this embodiment, a display device including the first display element that reflects visible light and the second display element that emits visible light will be described.

The display device has a function of displaying an image by one or both of first light reflected by the first display element and second light emitted from the second display element.

Alternatively, the display device has a function of expressing grayscales by individually controlling the amount of the first light reflected by the first display element and the amount of the second light emitted from the second display element.

Furthermore, the display device preferably has a structure including a first pixel that expresses grayscales by controlling the amount of reflected light of the first display element and a second pixel that expresses grayscales by controlling the amount of light emitted from the second display element. For example, a plurality of each of the first pixels and the second pixels are arranged in a matrix to form a display portion.

In addition, it is preferable that the first pixels and the second pixels be arranged in a display region with the same number and the same pitch. At this time, the adjacent first and second pixels can be collectively referred to as a pixel unit. Accordingly, as described later, an image displayed only by a plurality of first pixels, an image displayed only by a plurality of second pixels, and an image displayed by both the plurality of first pixels and the plurality of second pixels can be displayed in the same display region.

As the first display element included in the first pixel, an element that performs display by reflecting external light can be used. Such an element does not include a light source, and thus, the power consumption at the time of display can be significantly reduced.

As the first display element, typically, a reflective liquid crystal element can be used. Alternatively, as the first display element, an element or the like using a microcapsule method, an electrophoretic method, an electrowetting method, an Electronic Liquid Powder (registered trademark) method, or the like can be used, other than a shutter type MEMS (Micro Electro Mechanical System) element or an optical interference type MEMS element.

As the second display element included in the second pixel, an element that includes a light source and performs display utilizing light from the light source can be used. It is particularly preferable to use an electroluminescent element in which light emission can be extracted from a light-emitting substance by application of an electric field. Since the luminance and the chromaticity of light emitted from such a pixel are not affected by external light, display with high color reproducibility (a wide color gamut) and high contrast can be performed; that is, vivid display can be performed.

As the second display element, for example, a self-luminous light-emitting element such as an OLED (Organic Light Emitting Diode), an LED (Light Emitting Diode), a QLED (Quantum-dot Light Emitting Diode), or a semiconductor laser can be used. Alternatively, a combination of a backlight that is a light source and a transmissive liquid crystal element that controls the amount of transmitted light from a backlight may be used as the display element included in the second pixel.

The first pixel can have, for example, a structure including a subpixel exhibiting white (W) or subpixels exhibiting light of three colors of red (R), green (G), and blue (B). Moreover, the second pixel can also have, for example, a structure including a subpixel exhibiting white (W) or subpixels exhibiting light of three colors of red (R), green (G), and blue (B). Note that the first pixel and the second pixel may each include subpixels of four colors or more. As the number of kinds of subpixels is increased, the power consumption can be reduced and the color reproducibility can be improved.

In one embodiment of the present invention, a first mode in which an image is displayed by the first pixels, a second mode in which an image is displayed by the second pixels, and a third mode in which an image is displayed by the first pixels and the second pixels can be switched. In addition, as described in Embodiment 1, a different image signal is input to each of the first pixel and the second pixel, so that a composite image can be displayed.

The first mode is a mode in which an image is displayed using light reflected from the first display element. The first mode, which requires no light source, is a driving mode with extremely low power consumption. For example, the first mode is effective in the case where external light has a sufficiently high illuminance and is white light or light near white light. The first mode is a display mode suitable for displaying, for example, text data of a book, a document or the like. Furthermore, since reflected light is used, eye-friendly display can be performed, so that an effect of less eyestrain can be obtained.

The second mode is a mode in which an image is displayed utilizing light emitted from the second display element. Thus, an extremely clear display (with high contrast and high color reproducibility) can be performed regardless of the illuminance and the chromaticity of external light. For example, the second mode is effective when the illuminance of external light is extremely low, e.g., during the night or in a dark room. When display of a bright image is performed under weak external light, a user may feel that the image is too bright. To prevent this, display with reduced luminance is preferably performed in the second mode. Thus, not only a reduction in glare but also low power consumption can be achieved. The second mode is a mode suitable for displaying a clear image, a smooth moving image, and the like.

The third mode is a mode in which display is performed utilizing both reflected light from the first display element and light emitted from the second display element. Specifically, the driving is performed such that light from the first pixel and light from the second pixel adjacent to the first pixel are mixed to express one color. The third mode can perform more vivid display than the first mode, and the power consumption can be lower than that in the second mode. For example, the third mode is effective when the illuminance of external light is relatively low, e.g., under indoor illumination or in the morning or evening, or when the chromaticity of the external light is not white.

A more specific example of one embodiment of the present invention will be described below with reference to drawings.

[Structure Example of Display Device]

Figure 29:
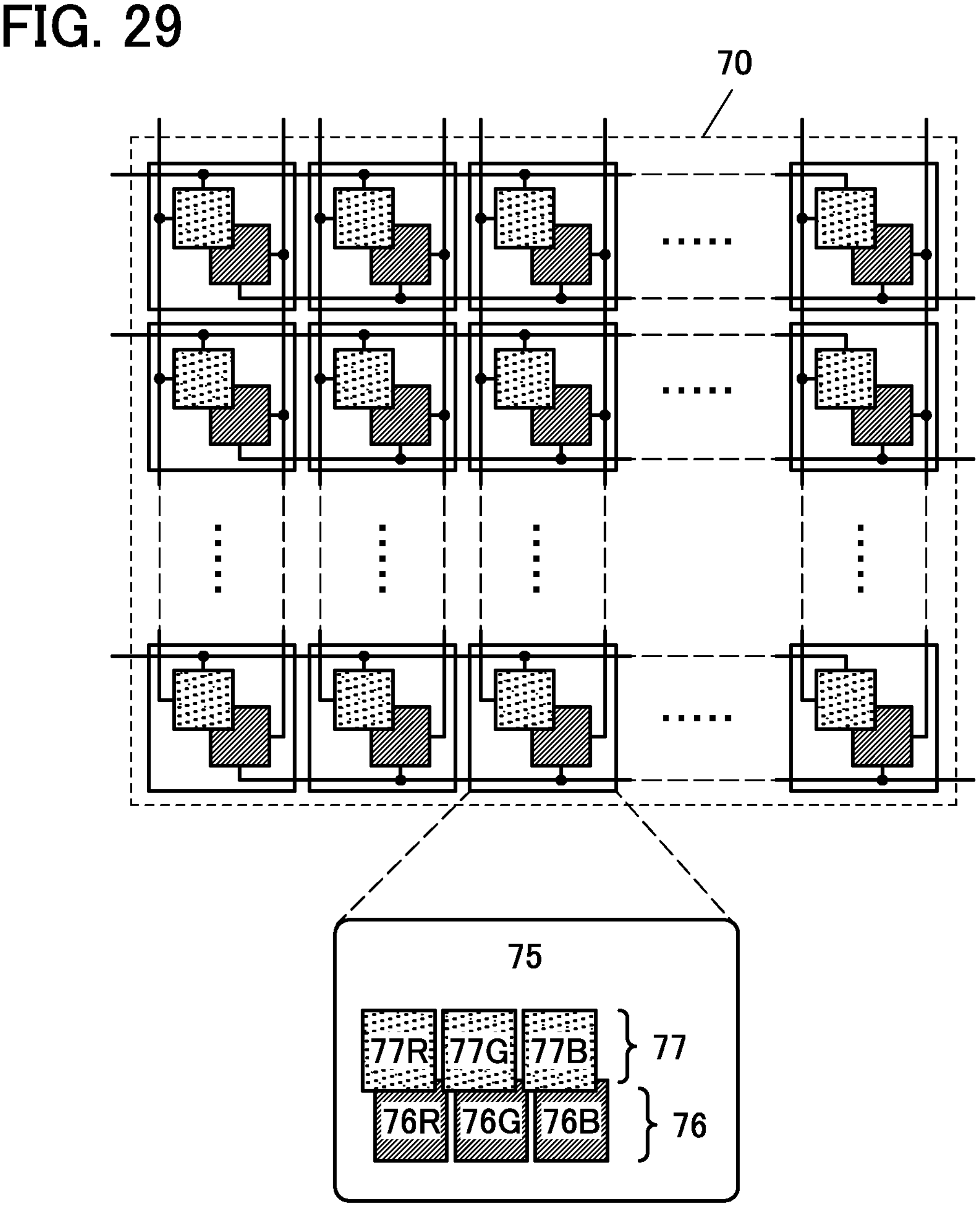
FIG. 29 A diagram illustrating a pixel unit.

FIG. 29 is a diagram illustrating a pixel array 70 included in the display device of one embodiment of the present invention. The pixel array 70 includes a plurality of pixel units 75 arranged in a matrix. The pixel units 75 each include a pixel 76 and a pixel 77.

FIG. 29 illustrates an example of the case where the pixel 76 and the pixel 77 each include display elements corresponding to three colors of red (R), green (G), and blue (B).

The pixel 76 includes a display element 76R corresponding to red (R), a display element 76G corresponding to green (G), and a display element 76B corresponding to blue (B). The display elements 76R, 76G, and 76B are each a second display element utilizing light from a light source.

The pixel 77 includes a display element 77R corresponding to red (R), a display element 77G corresponding to green (G), and a display element 77B corresponding to blue (B). The display elements 77R, 77G, and 77B are each a first display element utilizing reflection of external light.

The above is the description of the structure example of the display device.

[Structure Example of Pixel Unit]

Figure 30A:
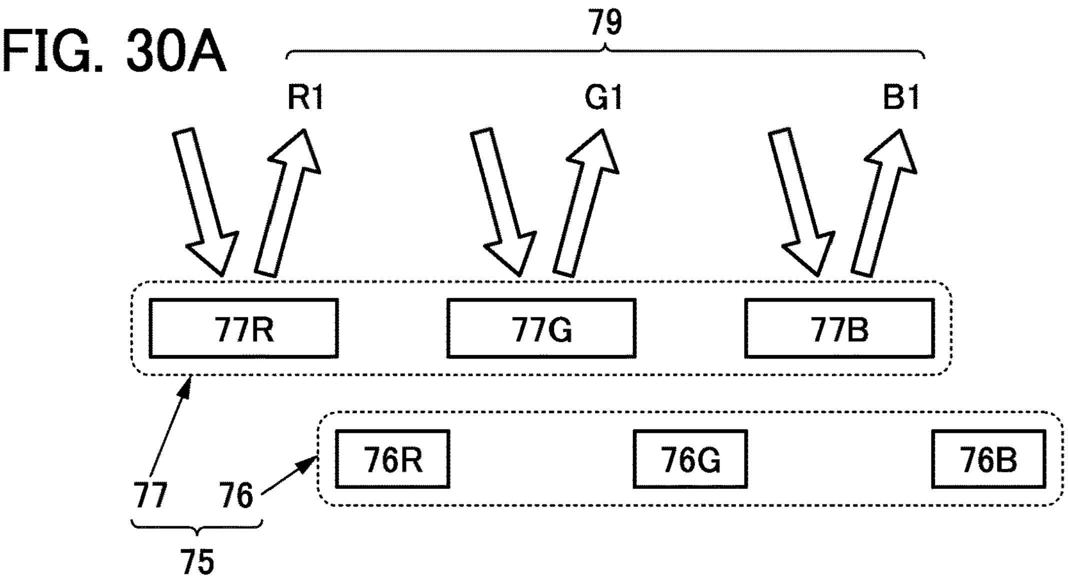
FIGS. 30A-30C Diagrams illustrating a pixel unit
Figure 30B:
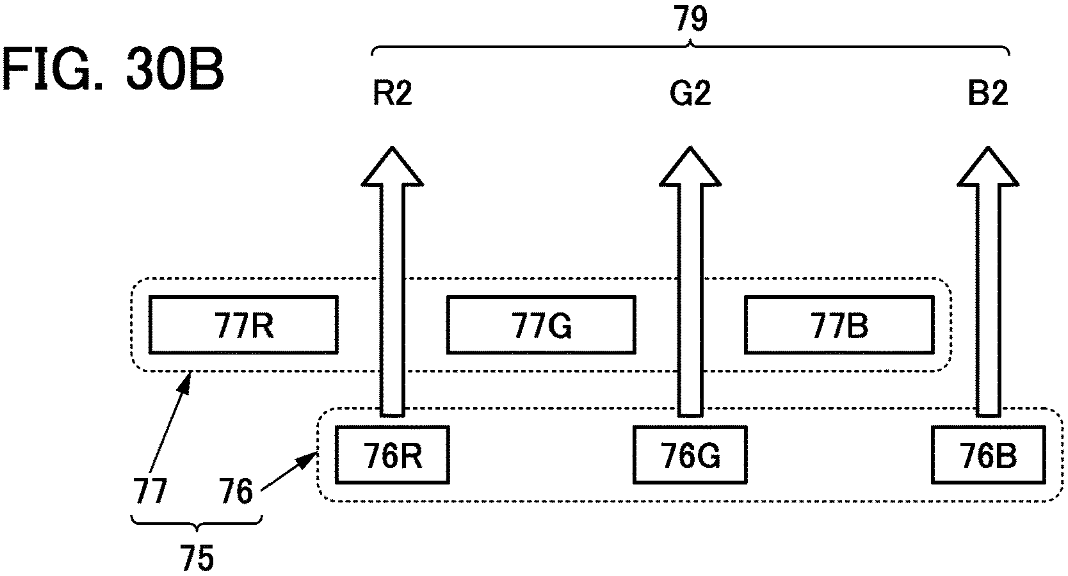
Figure 30C:
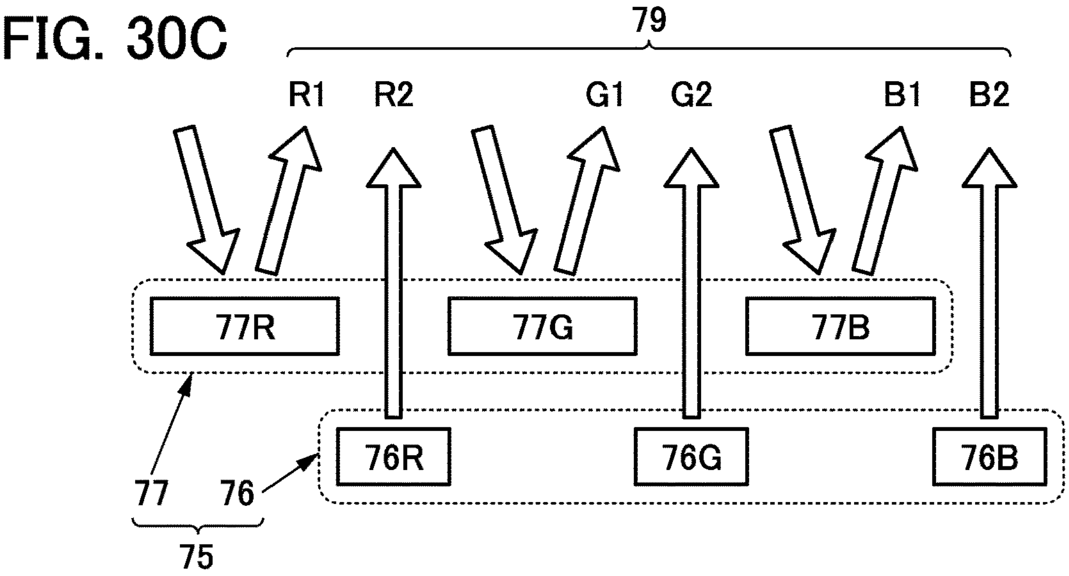

Next, the pixel unit 75 will be described with reference to FIGS. 30(A), 30(B), and 30(C). FIGS. 30(A), 30(B), and 30(C) are schematic views illustrating structure examples of the pixel unit 75.

The pixel 76 includes the display element 76R, the display element 76G, and the display element 76B. The display element 76R includes a light source and emits, to the display surface side, red light R2 with a luminance according to the gray level corresponding to red included in a second gray level which is input to the pixel 76. Similarly, the display element 76G and the display element 76B emit green light G2 and blue light B2, respectively, to the display surface side.

The pixel 77 includes the display element 77R, the display element 77G, and the display element 77B. The display element 77R reflects external light and emits, to the display surface side, red light R1 with a luminance according to the gray level corresponding to red included in a first gray level input to the pixel 77. Similarly, the display element 77G and the display element 77B emit, to the display surface side, green light G1 and blue light B1, respectively.

[First Mode]

FIG. 30(A) illustrates an example of an operation mode in which an image is displayed by driving the display element 77R, the display element 77G, and the display element 77B, which reflect external light. As illustrated in FIG. 30(A), for example, in the case where the illuminance of external light is sufficiently high, the pixel 76 is not driven and only the colors of the light (the light R1, the light G1, and the light B1) from the pixel 77 are mixed, whereby the light 79 of a predetermined color can be emitted from the pixel unit 75 to the display surface side. Thus, driving with extremely low power consumption can be performed.

[Second Mode]

FIG. 30(B) illustrates an example of an operation mode in which an image is displayed by driving the display element 76R, the display element 76G, and the display element 76B. As illustrated in FIG. 30(B), for example, in the case where the illuminance of external light is extremely low, the pixel 77 is not driven and only the colors of the light (the light R2, the light G2, and the light B2) from the pixel 76 are mixed, whereby the light 79 of a predetermined color can be emitted from the pixel unit 75 to the display surface side. Thus, vivid display can be performed. Furthermore, by lowering the luminance when the illuminance of external light is low, a user can be prevented from feeling glare and power consumption can be reduced.

[Third Mode]

FIG. 30(C) illustrates an example of an operation mode in which an image is displayed by driving both of the display element 77R, the display element 77G, and the display element 77B, which reflect external light, and the display element 76R, the display element 76G, and the display element 76B, which emit light. As illustrated in FIG. 30(C), the six colors of the light, i.e., the light R1, the light G1, the light B1, the light R2, the light G2, and the light B2 are mixed, whereby light 79 of a predetermined color can be emitted from the pixel unit 75 to the display surface side.

The above is the description of the structure example of the pixel unit 75.

At least part of this embodiment can be implemented in combination with any of the other embodiments described in this specification as appropriate.

Embodiment 5

A specific structure example of the hybrid display described in Embodiment 4 will be described below. A display panel described below as an example is a display panel which includes both a reflective liquid crystal element and a light-emitting element and can perform display both in a transmissive mode and in a reflective mode.

Structure Examples

FIG. 31(A) is a block diagram illustrating an example of a structure of a display device 400. The display device 400 includes a plurality of pixels 410 arranged in a matrix in a display portion 362. Furthermore, the display device 400 includes a circuit GD and a circuit SD. In addition, the plurality of pixels 410 arranged in a direction R, and a plurality of wirings G1, a plurality of wirings G2, a plurality of wirings ANO, and a plurality of wirings CSCOM, which are electrically connected to the circuit GD are included. Moreover, the plurality of pixels 410 arranged in a direction C, and a plurality of wirings S1 and a plurality of wirings S2 that are electrically connected to the circuit SD are included.

Note that although a structure including one circuit GD and one circuit SD is illustrated here for simplification, the circuit GD and the circuit SD for driving a liquid crystal element and the circuit GD and the circuit SD for driving a light-emitting element may be provided separately.

The pixels 410 includes a reflective liquid crystal element and a light-emitting element. In the pixel 410, the liquid crystal element and the light-emitting element have a portion overlapping with each other.

FIG. 31(B1) illustrates a structure example of a conductive layer 311*b* included in the pixel 410. The conductive layer 311*b* functions as a reflective electrode of the liquid crystal element in the pixel 410. Furthermore, the conductive layer 311*b* is provided with an opening 451.

In FIG. 31(B1), a light-emitting element 360 positioned in a region overlapping with the conductive layer 311*b* is shown by a dashed line. The light-emitting element 360 is provided to overlap with the opening 451 of the conductive layer 311*b*. Thus, light emitted by the light-emitting element 360 is emitted to the display surface side through the opening 451.

In FIG. 31(B1), the pixels 410 adjacent in the direction R are pixels corresponding to different colors. At this time, as illustrated in FIG. 31(B1), the openings 451 in two pixels adjacent in the direction R are preferably provided in different positions in the conductive layers 311*b* so as not to be arranged in a line. This allows two light-emitting elements 360 to be apart from each other, thereby preventing a phenomenon in which light emitted by the light-emitting element 360 enters a coloring layer included in the adjacent pixel 410 (also referred to as crosstalk). Furthermore, since two adjacent light-emitting elements 360 can be arranged apart from each other, a high-resolution display device can be achieved even when EL layers of the light-emitting elements 360 are separately formed with a shadow mask or the like.

Alternatively, arrangement illustrated in FIG. 31(B2) may be employed.

If the value of the ratio of the total area of the opening 451 to the total area of a non-opening portion is too large, display using the liquid crystal element gets dark. In addition, if the value of the ratio of the total area of the opening 451 to the total area of the non-opening portion is too small, display using the light-emitting element 360 gets dark.

Moreover, if the area of the opening 451 provided in the conductive layer 311*b* functioning as a reflective electrode is too small, the efficiency of light which can be extracted from light emitted by the light-emitting element 360 is decreased.

The opening 451 can have, for example, a polygonal, quadrangular, elliptical, circular, or cross shape. Alternatively, the opening 451 may have a stripe shape, a slit shape, or a checkered pattern. Alternatively, the opening 451 may be close to the adjacent pixel. The opening 451 is preferably provided close to another pixel displaying the same color. Thus, crosstalk can be suppressed.

Circuit Configuration Example

Figure 32:
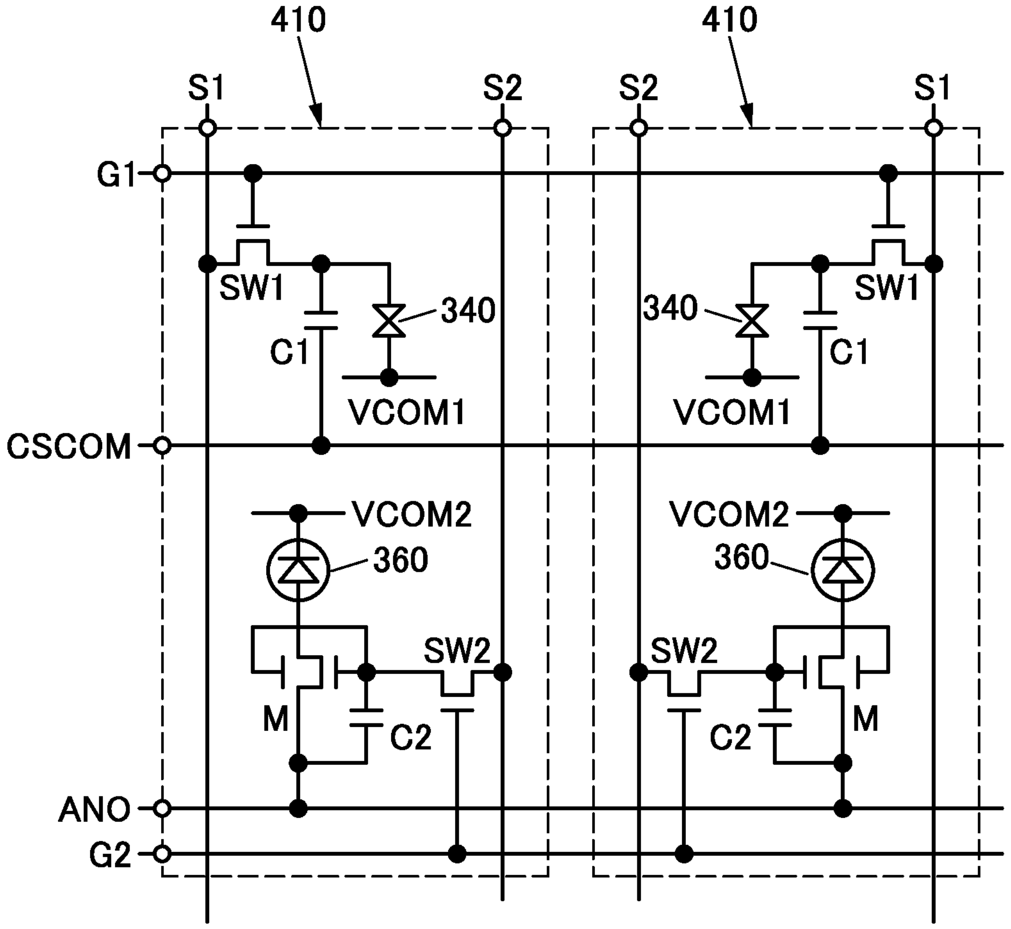
FIG. 32 A diagram illustrating a circuit of a display device.

FIG. 32 is a circuit diagram illustrating a configuration example of the pixel 410. FIG. 32 illustrates two adjacent pixels 410.

The pixel 410 includes a switch SW1, a capacitor C1, a liquid crystal element 340, a switch SW2, a transistor M, a capacitor C2, the light-emitting element 360, and the like. Furthermore, the wiring G1, the wiring G2, the wiring ANO, the wiring CSCOM, the wiring S1, and the wiring S2 are electrically connected to the pixel 410. FIG. 32 also illustrates a wiring VCOM1 electrically connected to the liquid crystal element 340 and a wiring VCOM2 electrically connected to the light-emitting element 360.

FIG. 32 illustrates an example of the case where a transistor is used as each of the switch SW1 and the switch SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

Moreover, a gate of the switch SW2 is connected to the wiring G2. One of a source and a drain is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 32 illustrates an example in which the transistor M includes two gates between which a semiconductor is provided and which are connected to each other. With this, current that can flow through the transistor M can be increased.

The wiring G1 can be supplied with a signal for controlling the on/off state of the switch SW1. A predetermined potential can be supplied to the wiring VCOM1. The wiring S1 can be supplied with a signal for controlling the orientation of liquid crystals of the liquid crystal element 340. A predetermined potential can be supplied to the wiring CSCOM.

The wiring G2 can be supplied with a signal for controlling the on/off state of the switch SW2. The wiring VCOM2 and the wiring ANO can be supplied with potentials that cause a potential difference with which the light-emitting element 360 emits light. The wiring S2 can be supplied with a signal for controlling the conduction state of the transistor M.

For example, in the case where display in the reflective mode is performed, the pixel 410 illustrated in FIG. 32 can be driven with the signals supplied to the wiring G1 and the wiring S1 to perform display with the use of the optical modulation of the liquid crystal element 340. Furthermore, in the case where display in the transmissive mode is performed, the pixel can be driven with the signals supplied to the wiring G2 and the wiring S2, which makes the light-emitting element 360 emit light so as to perform display. In addition, in the case where the driving is performed in both modes, the pixel can be driven with the signals supplied to the wiring G1, the wiring G2, the wiring S1, and the wiring S2.

Figure 33A:
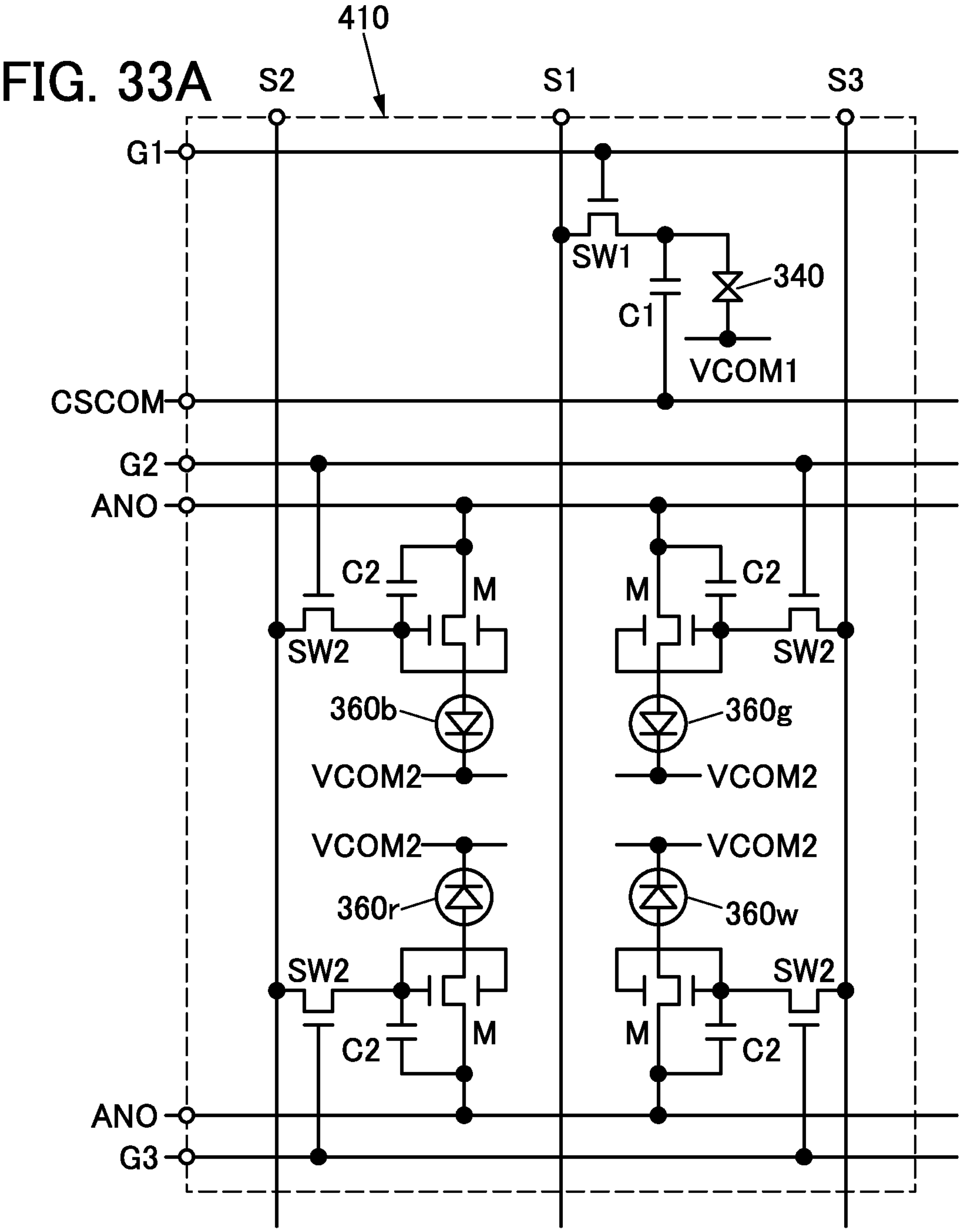
FIGS. 33A-33B A diagram illustrating a circuit of a display device and a top view illustrating a pixel.

Note that although FIG. 32 illustrates the example in which one pixel 410 includes one liquid crystal element 340 and one light-emitting element 360, one embodiment of the present invention is not limited thereto. FIG. 33(A) illustrates an example in which one pixel 410 includes one liquid crystal element 340 and four light-emitting elements 360 (light-emitting elements 360*r*, 360*g*, 360*b*, and 360*w*).

In addition to the example in FIG. 32, the pixel 410 in FIG. 33(A) is connected to a wiring G3 and a wiring S3.

In the example illustrated in FIG. 33(A), respective light-emitting elements exhibiting red (R), green (G), blue (B), and white (W) can be used for the four light-emitting elements 360, for example. A reflective liquid crystal element exhibiting white can be used as the liquid crystal element 340. Thus, in the case of performing display in the reflective mode, white display with high reflectivity can be performed. Moreover, in the case of performing display in the transmissive mode, display with a higher color rendering property can be performed at low power.

Figure 33B:
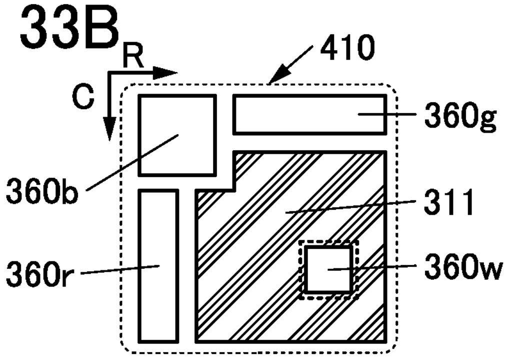

In addition, FIG. 33(B) illustrates a configuration example of the pixel 410. The pixel 410 includes the light-emitting element 360*w* overlapping with the opening of an electrode 311 and the light-emitting element 360*r*, the light-emitting element 360*g*, and the light-emitting element 360*b* which are arranged around the electrode 311. It is preferable that the light-emitting element 360*r*, the light-emitting element 360*g*, and the light-emitting element 360*b* have almost the same light-emitting area.

[Structure Example of Display Panel]

Figure 34:
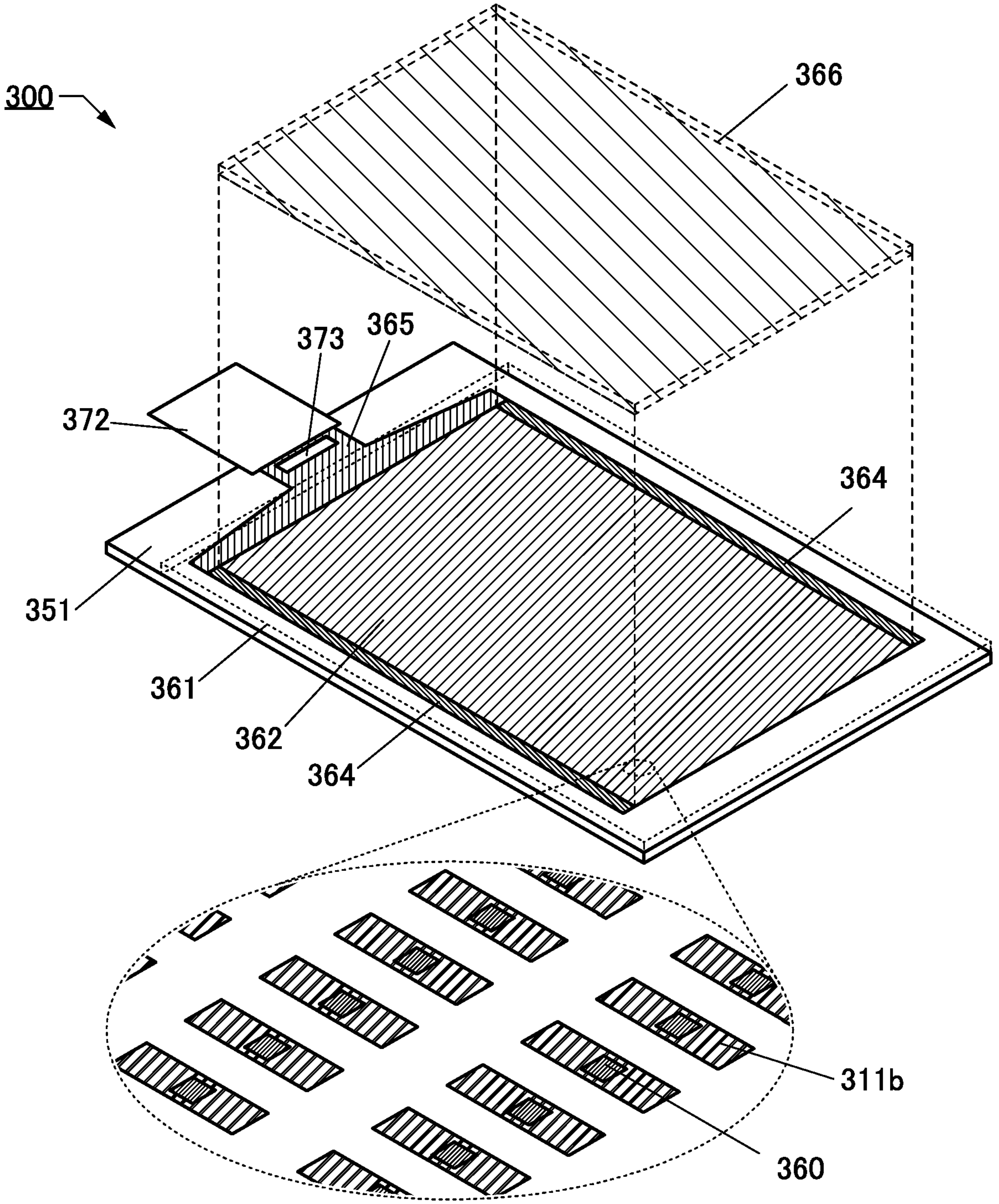
FIG. 34 A diagram illustrating a structure of a display device.

FIG. 34 is a schematic perspective view of a display panel 300 of one embodiment of the present invention. The display panel 300 has a structure in which a substrate 351 and a substrate 361 are attached to each other. In FIG. 34, the substrate 361 is shown by a dashed line.

The display panel 300 includes a display portion 362, a circuit 364, a wiring 365, and the like. The substrate 351 is provided with the circuit 364, the wiring 365, the conductive layer 311*b* that serves as a pixel electrode, and the like. Furthermore, FIG. 34 illustrates an example in which an IC 373 and an FPC 372 are mounted on the substrate 351. Thus, the structure illustrated in FIG. 34 can be referred to as a display module including the display panel 300, the FPC 372, and the IC 373.

As the circuit 364, for example, a circuit functioning as a scan line driver circuit can be used.

The wiring 365 has a function of supplying signals and power to the display portion and the circuit 364. The signal and the power are input to the wiring 365 from the outside through the FPC 372 or from the IC 373.

FIG. 34 illustrates an example in which the IC 373 is provided on the substrate 351 by a COG (Chip On Glass) method or the like. As the IC 373, an IC functioning as a scan line driver circuit, a signal line driver circuit, or the like can be used. Note that a structure in which the IC 373 is not provided may be employed, for example, in the case where the display panel 300 includes circuits functioning as a scan line driver circuit and a signal line driver circuit or in the case where circuits functioning as a scan line driver circuit and a signal line driver circuit are externally provided and signals for driving the display panel 300 are input through the FPC 372. Alternatively, the IC 373 may be mounted on the FPC 372 by a COF (Chip On Film) method or the like.

FIG. 34 illustrates an enlarged view of part of the display portion 362. The conductive layers 311*b* included in a plurality of display elements are arranged in a matrix in the display portion 362. The conductive layer 311*b* has a function of reflecting visible light and serves as a reflective electrode of the liquid crystal element 340 described later.

Furthermore, as illustrated in FIG. 34, the conductive layer 311*b* has an opening. The light-emitting element 360 is positioned closer to the substrate 351 than the conductive layer 311*b* is. Light is emitted from the light-emitting element 360 to the substrate 361 side through the opening of the conductive layer 311*b*.

Furthermore, an input device 366 can be provided over the substrate 361. For example, a structure in which a sheet-like capacitive touch sensor is provided so as to overlap with the display portion 362 is employed. Alternatively, a touch sensor may be provided between the substrate 361 and the substrate 351. In the case where the touch sensor is provided between the substrate 361 and the substrate 351, an optical touch sensor including a photoelectric conversion element as well as a capacitive touch sensor may be used.

Cross-Sectional Structure Example 1

Figure 35:
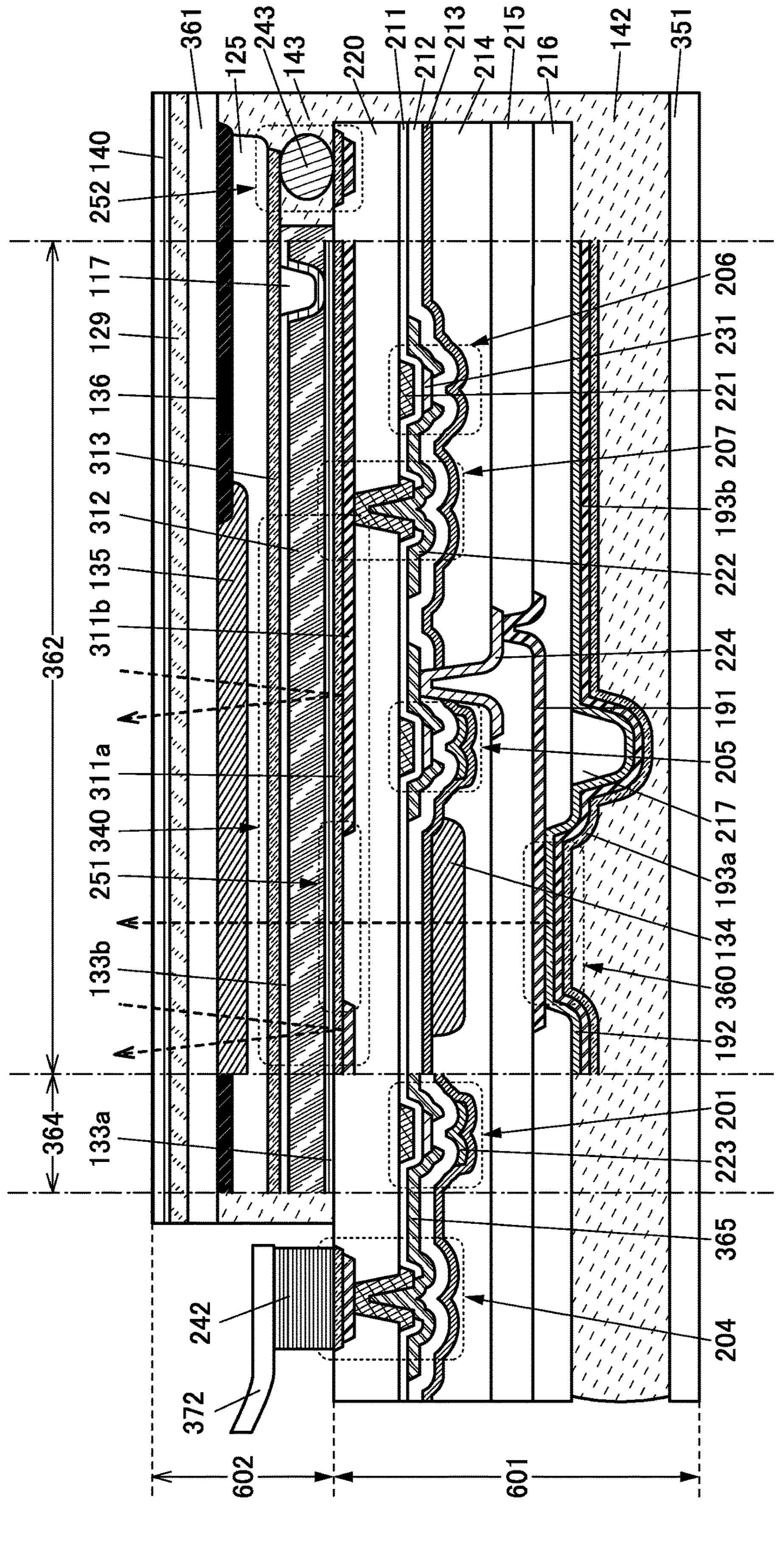
FIG. 35 A diagram illustrating a structure of a display device.

FIG. 35 shows an example of cross sections of a part of a region including the FPC 372, a part of a region including the circuit 364, and a part of a region including the display portion 362 of the display panel exemplified in FIG. 34.

The display panel includes an insulating layer 220 between the substrate 351 and the substrate 361. Moreover, the light-emitting element 360, a transistor 201, a transistor 205, a transistor 206, a coloring layer 134, and the like are included between the substrate 351 and the insulating layer 220. In addition, the liquid crystal element 340, a coloring layer 135, and the like are included between the insulating layer 220 and the substrate 361. The substrate 361 and the insulating layer 220 are bonded to each other with an adhesive layer 143. The substrate 351 and the insulating layer 220 are attached to each other with an adhesive layer 142.

The transistor 206 is electrically connected to the liquid crystal element 340, and the transistor 205 is electrically connected to the light-emitting element 360. Both of the transistor 205 and the transistor 206 are formed on a surface of the insulating layer 220 on the substrate 351 side, and thus they can be formed through the same process.

The substrate 361 is provided with the coloring layer 135, a light-blocking layer 136, an insulating layer 125, a conductive layer 313 functioning as a common electrode of the liquid crystal element 340, an alignment film 133*b*, an insulating layer 117, and the like. The insulating layer 117 functions as a spacer for holding a cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layer 212, the insulating layer 213, and the insulating layer 214 are provided to cover the transistors. Furthermore, the insulating layer 215 is provided to cover the insulating layer 214. The insulating layer 214 and the insulating layer 215 each have a function as a planarization layer. Note that although the case where three layers of the insulating layer 212, the insulating layer 213, and the insulating layer 214 are included as insulating layers that cover the transistors and the like is described here, not being limited to this, four or more layers may be used, or a single layer or two layers may be used. The insulating layer 214 functioning as a planarization layer is not necessarily provided if not needed.

Moreover, the transistor 201, the transistor 205, and the transistor 206 each include a conductive layer 221 part of which functions as a gate, a conductive layer 222 part of which functions as a source and a drain, and a semiconductor layer 231. Here, a plurality of layers obtained by processing the same conductive film is shown with the same hatching pattern.

The liquid crystal element 340 is a reflective liquid crystal element. The liquid crystal element 340 has a stacked-layer structure in which a conductive layer 311*a*, a liquid crystal 312, and the conductive layer 313 are stacked. Moreover, the conductive layer 311*b* that reflects visible light is provided in contact with the substrate 351 side of the conductive layer 311*a*. The conductive layer 311*b* has an opening 251. Furthermore, the conductive layer 311*a* and the conductive layer 313 contain a material transmitting visible light. In addition, an alignment film 133*a* is provided between the liquid crystal 312 and the conductive layer 311*a* and the alignment film 133*b* is provided between the liquid crystal 312 and the conductive layer 313.

A light diffusion plate 129 and a polarizing plate 140 are provided for an outer surface of the substrate 361. As the polarizing plate 140, a linear polarizing plate may be used or a circularly polarizing plate can also be used. As a circularly polarizing plate, for example, a stack of a linear polarizing plate and a quarter-wave retardation plate can be used. With this, reflection of external light can be suppressed. In addition, the light diffusion plate 129 is provided to suppress reflection of external light. The cell gap, alignment, drive voltage, and the like of the liquid crystal element used as the liquid crystal element 340 are adjusted depending on the kind of the polarizing plate so that desirable contrast is obtained.

In the liquid crystal element 340, the conductive layer 311*b* has a function of reflecting visible light, and the conductive layer 313 has a function of transmitting visible light. Light entering from the substrate 361 side is polarized by the polarizing plate 140, passes through the conductive layer 313 and the liquid crystal 312, and is reflected by the conductive layer 311*b*. Then, the light passes through the liquid crystal 312 and the conductive layer 313 again and reaches the polarizing plate 140. In this case, optical modulation of the light can be controlled by controlling the alignment of the liquid crystal with a voltage applied between the conductive layer 311*b* and the conductive layer 313. That is, the intensity of light emitted through the polarizing plate 140 can be controlled. Light other than that in a particular wavelength region is absorbed by the coloring layer 135, so that extracted light is light exhibiting red, for example.

The light-emitting element 360 is a bottom-emission light-emitting element. The light-emitting element 360 has a stacked-layer structure in which a conductive layer 191, an EL layer 192, and a conductive layer 193*b* are stacked in this order from the insulating layer 220 side. In addition, a conductive layer 193*a* is provided to cover the conductive layer 193*b*. The conductive layer 193*b* contains a material reflecting visible light, and the conductive layer 191 and the conductive layer 193*a* contain a material transmitting visible light. Light emitted from the light-emitting element 360 is emitted to the substrate 361 side through the coloring layer 134, the insulating layer 220, the opening 251, the conductive layer 313, and the like.

Here, as illustrated in FIG. 35, the conductive layer 311*a* transmitting visible light is preferably provided for the opening 251. Accordingly, the liquid crystal 312 is aligned in a region overlapping with the opening 251 as well as in the other regions, whereby undesired light leakage caused by an alignment defect of the liquid crystal in the boundary portion of these regions can be suppressed.

An insulating layer 217 is provided over the insulating layer 216 which covers an end portion of the conductive layer 191. The insulating layer 217 has a function as a spacer for preventing the insulating layer 220 and the substrate 351 from getting closer than necessary. In addition, in the case where the EL layer 192 or the conductive layer 193*a* is formed using a shielding mask (metal mask), the insulating layer 217 may have a function of preventing the shielding mask from being in contact with the formation surface. Note that the insulating layer 217 is not necessarily provided if not needed.

One of a source and a drain of the transistor 205 is electrically connected to the conductive layer 191 of the light-emitting element 360 through a conductive layer 224.

One of a source and a drain of the transistor 206 is electrically connected to the conductive layer 311*b* through a connection portion 207. The conductive layer 311*b* and the conductive layer 311*a* are provided in contact with each other, and they are electrically connected to each other. Here, the connection portion 207 is a portion in which the conductive layers provided on both surfaces of the insulating layer 220 are connected through an opening provided in the insulating layer 220.

A connection portion 204 is provided in a region in which the substrate 351 and the substrate 361 do not overlap with each other. The connection portion 204 is electrically connected to the FPC 372 through a connection layer 242. The connection portion 204 has a structure similar to that of the connection portion 207. On the top surface of the connection portion 204, a conductive layer obtained by processing the same conductive film as the conductive layer 311*a* is exposed. Thus, the connection portion 204 and the FPC 372 can be electrically connected to each other through the connection layer 242.

A connection portion 252 is provided in part of a region in which the adhesive layer 143 is provided. In the connection portion 252, the conductive layer obtained by processing the same conductive film as the conductive layer 311*a* is electrically connected to part of the conductive layer 313 with a connector 243. Accordingly, a signal or a potential input from the FPC 372 connected to the substrate 351 side can be supplied to the conductive layer 313 formed on the substrate 361 side through the connection portion 252.

As the connector 243, for example, a conductive particle can be used. As the conductive particle, a particle of an organic resin, silica, or the like whose surface is coated with a metal material can be used. It is preferable to use nickel or gold as the metal material because contact resistance can be reduced. It is also preferable to use a particle coated with layers of two or more kinds of metal materials, such as a particle coated with nickel and further with gold. Moreover, as the connector 243, a material capable of elastic deformation or plastic deformation is preferably used. At this time, as illustrated in FIG. 35, the connector 243 which is the conductive particle has a shape that is vertically crushed in some cases. This increases the contact area between the connector 243 and a conductive layer electrically connected thereto, thereby reducing contact resistance and suppressing occurrence of defects such as disconnection.

The connector 243 is preferably provided so as to be covered with the adhesive layer 143. For example, the connectors 243 are dispersed in the adhesive layer 143 which is not cured yet.

FIG. 35 illustrates an example in which the transistor 201 is provided as an example of the circuit 364.

The structure in which the semiconductor layer 231 where a channel is formed is provided between two gates is used as an example of the transistor 201 and the transistor 205 in FIG. 35. One of the gates is formed using the conductive layer 221, and the other gate is formed using a conductive layer 223 which overlaps with the semiconductor layer 231 with the insulating layer 212 positioned therebetween. Such a structure enables the control of the threshold voltage of the transistor. In this time, the two gates may be connected to each other and supplied with the same signal to operate the transistor. Such a transistor can have higher field-effect mobility and thus have higher on-state current than other transistors. Consequently, a circuit capable of high-speed operation can be manufactured. Furthermore, the area occupied by a circuit portion can be reduced. The use of the transistor having a high on-state current can reduce signal delay in each wiring and can suppress display unevenness even if the number of wirings is increased when the size or resolution of a display panel is increased.

Note that the transistor included in the circuit 364 and the transistor included in the display portion 362 may have the same structure. Furthermore, a plurality of transistors included in the circuit 364 may all have the same structure, or transistors having different structures may be used in combination. Moreover, a plurality of transistors included in the display portion 362 may all have the same structure, or transistors having different structures may be used in combination.

A material through which impurities such as water and hydrogen do not easily diffuse is preferably used for at least one of the insulating layer 212 and the insulating layer 213 which cover each transistor. That is, the insulating layer 212 or the insulating layer 213 can function as a barrier film. Such a structure can effectively suppress diffusion of the impurities into the transistors from the outside, and a highly reliable display panel can be achieved.

The insulating layer 125 is provided on the substrate 361 side to cover the coloring layer 135 and the light-blocking layer 136. The insulating layer 125 may have a function as a planarization layer. The conductive layer 313 can have a substantially flat surface owing to the insulating layer 125, resulting in a uniform alignment state of the liquid crystal 312.

Cross-Sectional Structure Example 2

Figure 36:
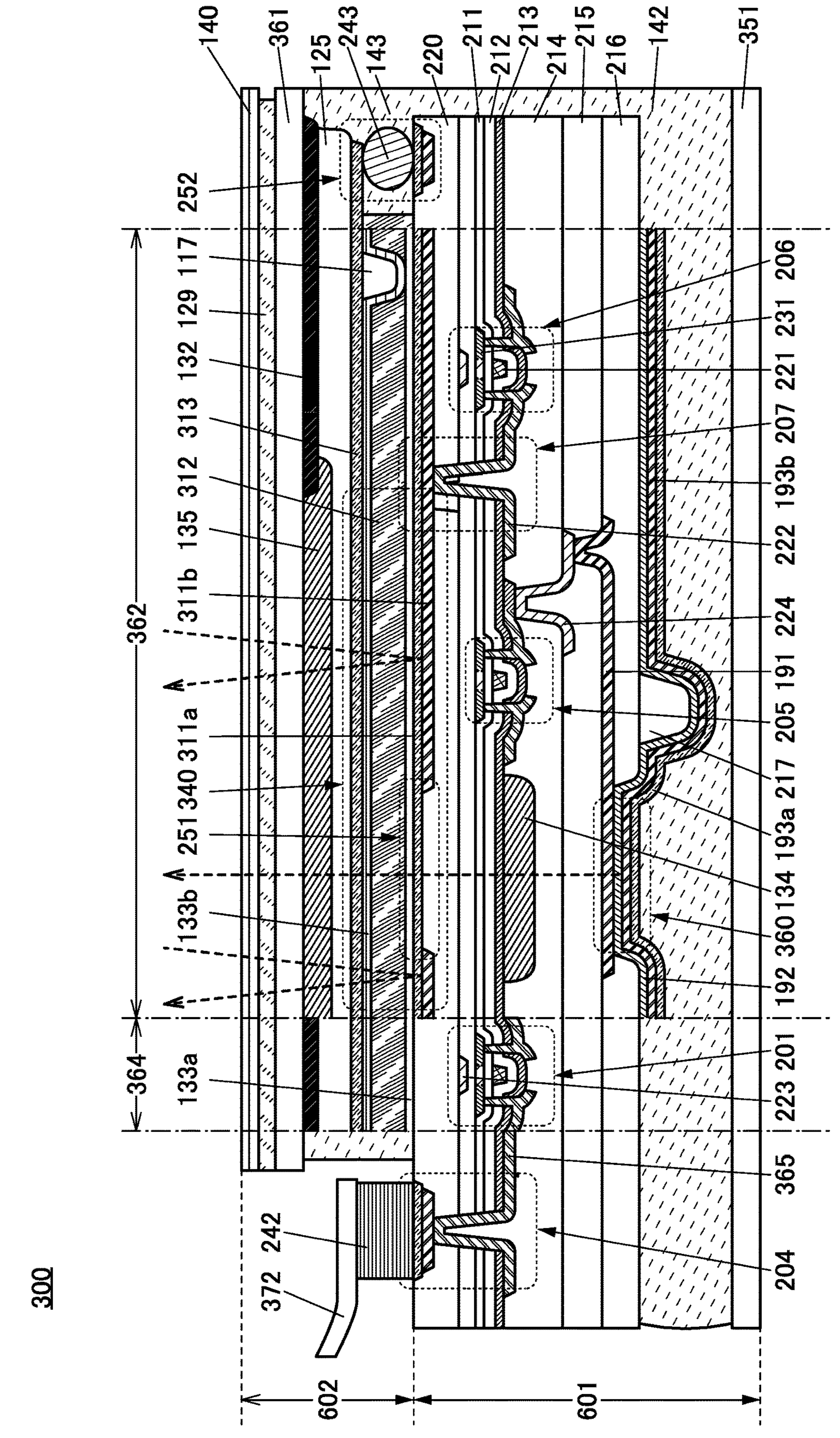
FIG. 36 A diagram illustrating a structure of a display device.

A display panel illustrated in FIG. 36 is an example of the case where a top-gate transistor is used as each transistor in the structure illustrated in FIG. 35. As described above, the use of a top-gate transistor can reduce parasitic capacitance, so that the frame frequency of display can be increased.

A transistor included in the display device of one embodiment of the present invention includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor. For example, a planar transistor may be used, a staggered transistor may be used, or an inverted staggered transistor may be used. In addition, a top-gate transistor or a bottom-gate transistor may be used. Alternatively, gate electrodes may be provided above and below a channel.

There is no particular limitation also on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be suppressed.

Furthermore, as a semiconductor material used for the transistor, a metal oxide whose energy gap is greater than or equal to 2 eV, preferably greater than or equal to 2.5 eV, further preferably greater than or equal to 3 eV can be used. Typically, an oxide semiconductor containing indium, or the like can be used.

A transistor including an oxide semiconductor which has a wider bandgap and a lower carrier density than silicon has a low off-state current; therefore, charge accumulated in a capacitor that is series-connected to the transistor can be retained for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that forms the semiconductor layer is an In-M-Zn-based oxide, it is preferable that the atomic ratio of the metal elements of a sputtering target used to deposit the In-M-Zn oxide satisfy In≥M and Zn≥M. As the atomic ratio of metal elements in such a sputtering target, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like is preferable. Note that the atomic ratio in the formed semiconductor layer varies from the above atomic ratio of metal elements of the sputtering target in a range of ±40%.

Moreover, a metal oxide formed of the above material or the like can function as a light-transmitting conductor by adjusting impurities, oxygen vacancies, and the like. Thus, when the components of the transistor such as the source electrode, the drain electrode, and the gate electrode, in addition to the semiconductor layer, are formed using a light-transmitting conductor, a light-transmitting transistor can be fabricated. The use of the light-transmitting transistor in a pixel of a display device allows light passing through a display element or light emitted from the display element to pass through the transistor; thus, the aperture ratio can be improved.

Alternatively, silicon may be used as a semiconductor in which a channel of a transistor is formed. Although amorphous silicon may be used as silicon, silicon having crystallinity is particularly preferably used. For example, microcrystalline silicon, polycrystalline silicon, single crystal silicon, or the like is preferably used. In particular, polycrystalline silicon can be formed at a lower temperature than single crystal silicon and has higher field-effect mobility and higher reliability than amorphous silicon.

Figure 37A:
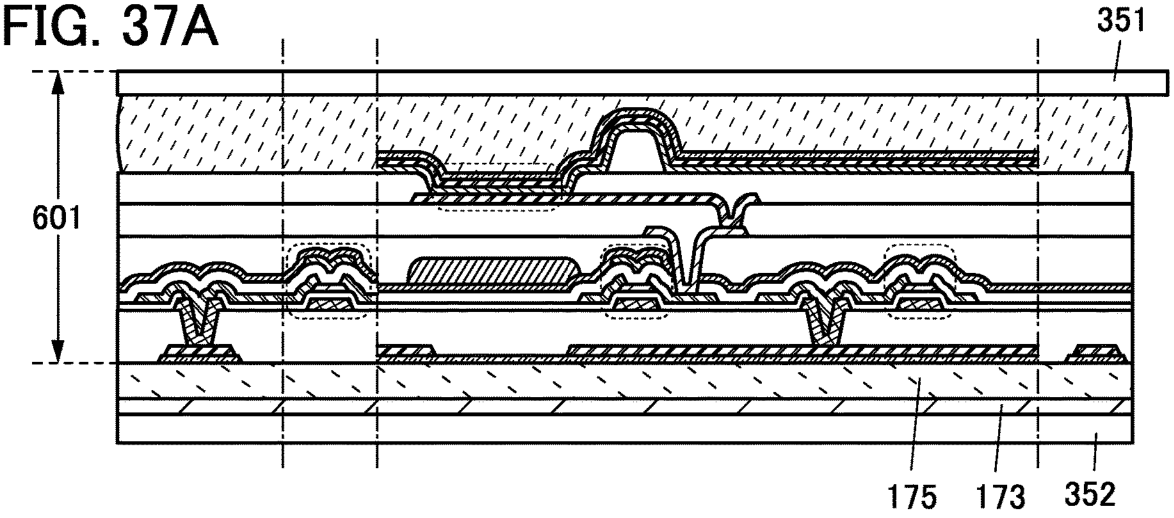
FIGS. 37A-37C Diagrams illustrating a method for manufacturing a display device.

The above-described display panel 300 is broadly divided into a region 601 including the light-emitting element, the transistors, and the like and a region 602 including the liquid crystal element and the like (see FIG. 35 and FIG. 36). A method for manufacturing the display panel 300 will be briefly described below with reference to FIGS. 37(A) to 37(C).

The display panel 300 can be manufactured relatively easily by the separation process described in Embodiment 2. First, a separation layer 173 and a resin layer 175 are provided over a substrate 352, and the region 601 is completed over the resin layer 175 (see FIG. 37(A)).

Figure 37B:
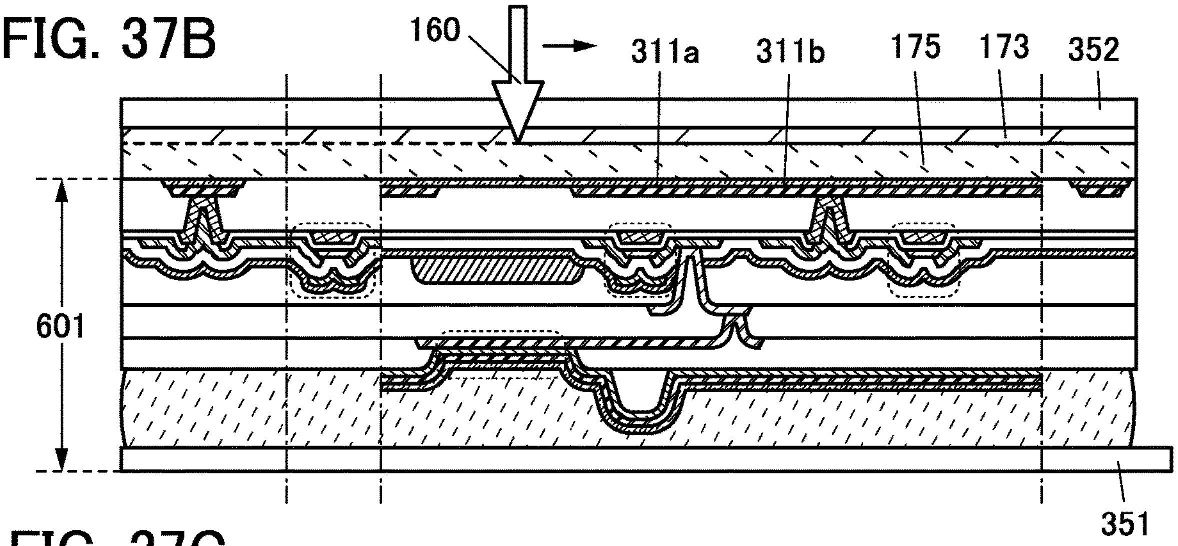
Figure 37C:
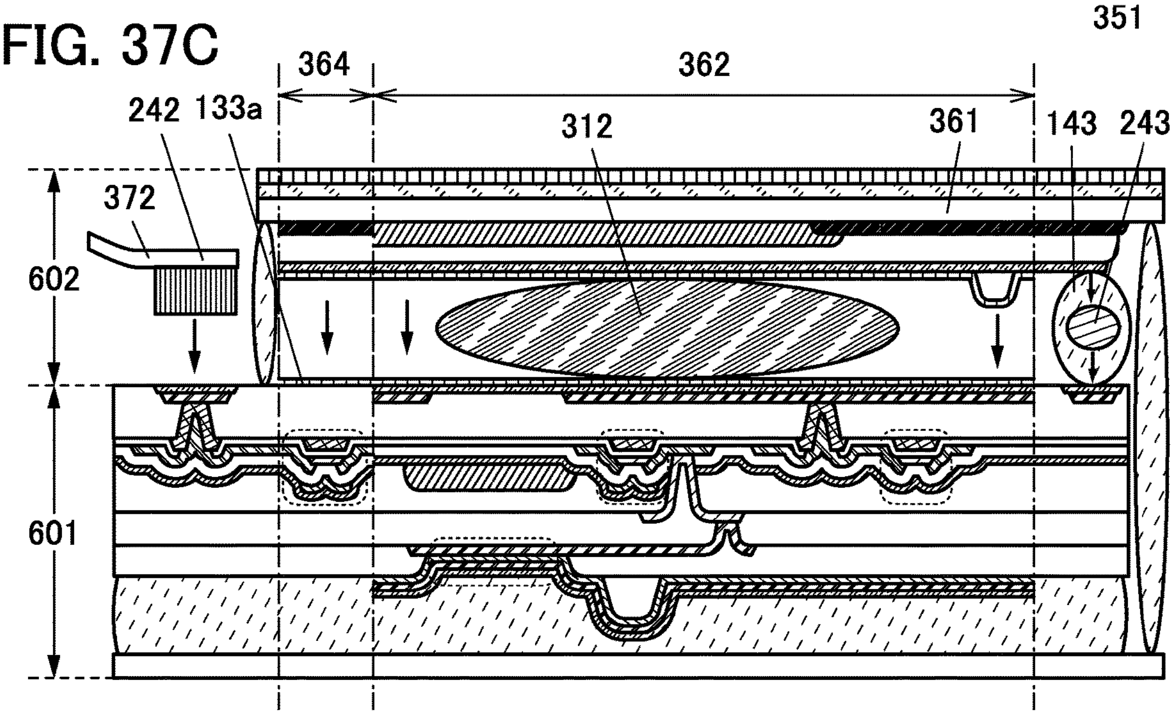

Next, a region to be processed (region including the separation layer 173 and the resin layer 175) is irradiated with the laser light 160 (see FIG. 37(B)), and the substrate 352 and the separation layer 173 are removed.

Next, the resin layer 175 is removed by ashing treatment, so that the conductive layer 311*a* and the like are exposed. Then, the alignment film 133*a* is formed in a region to be the display portion, and the other components of the region 602 that are separately formed are attached with the adhesive layer 143 so that the liquid crystal 312 is sandwiched therebetween (see FIG. 37(C)). Through the above process, the display panel 300 illustrated in FIG. 35 can be completed.

At least part of this embodiment can be implemented in combination with any of the other embodiments described in this specification as appropriate.

Embodiment 6

As electronic devices that can use the display device of one embodiment of the present invention, display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, and the like can be given. Specific examples of these electronic devices are illustrated in FIG. 38.

Figure 38A:
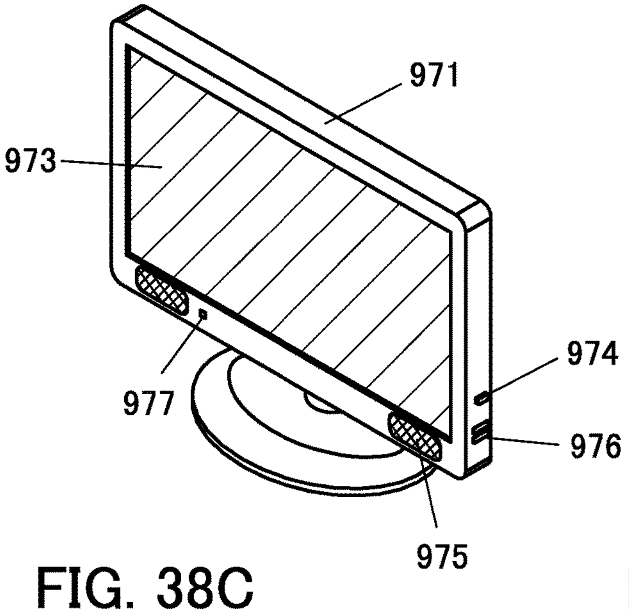
FIGS. 38A-38F Diagrams illustrating electronic devices.

FIG. 38(A) is a television, which includes a housing 971, a display portion 973, an operation key 974, speakers 975, a communication connection terminal 976, an optical sensor 977, and the like. The display portion 973 is provided with a touch sensor, and an input operation can also be performed. The display portion 973 can be formed using the laser processing apparatus or the stack processing apparatus of one embodiment of the present invention.

Figure 38B:
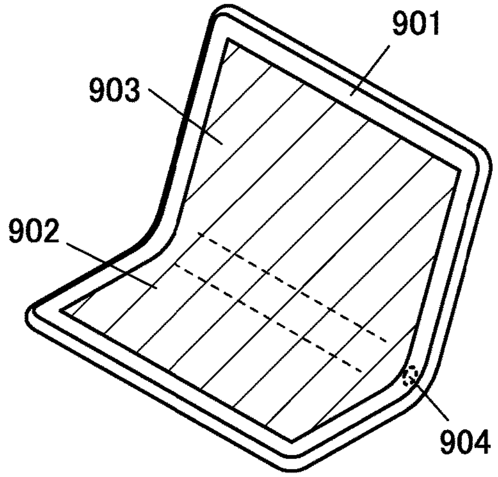

FIG. 38(B) is an information processing terminal, which includes a housing 901, a display portion 902, a display portion 903, a sensor 904, and the like. The display portion 902 and the display portion 903 are formed using one display panel and are flexible. Furthermore, the housing 901 is also flexible, can be used in a bent state as illustrated in the figure, and can also be used in a flat plate-like shape like a tablet terminal. The sensor 904 can sense the shape of the housing 901, and for example, it is possible to switch display on the display portion 902 and the display portion 903 when the housing is bent. The display portion 902 and the display portion 903 can be formed using the laser processing apparatus or the stack processing apparatus of one embodiment of the present invention.

Figure 38C:
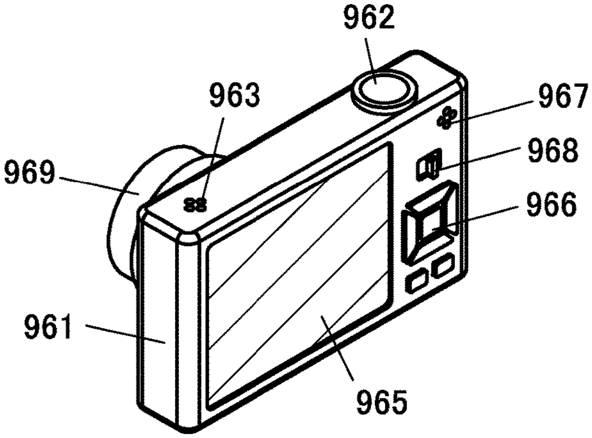

FIG. 38(C) is a digital camera, which includes a housing 961, a shutter button 962, a microphone 963, a speaker 967, a display portion 965, operation keys 966, a zoom lever 968, a lens 969, and the like. The display portion 965 can be formed using the laser processing apparatus or the stack processing apparatus of one embodiment of the present invention.

Figure 38D:
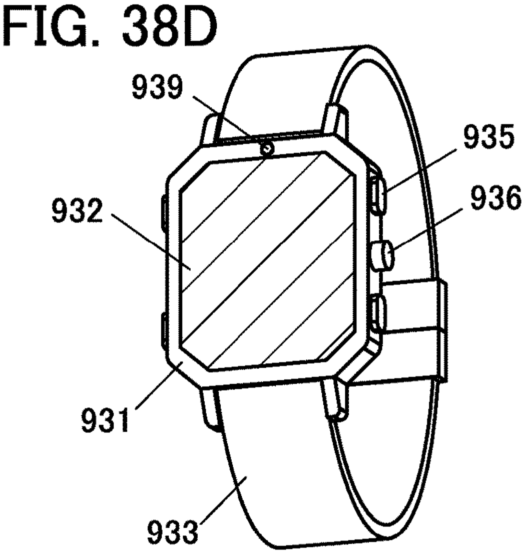

FIG. 38(D) is a wrist-watch-type information terminal, which includes a housing 931, a display portion 932, a wristband 933, an operation button 935, a crown 936, a camera 939, and the like. The display portion 932 may be a touch panel. The display portion 932 can be formed using the laser processing apparatus or the stack processing apparatus of one embodiment of the present invention.

Figure 38E:
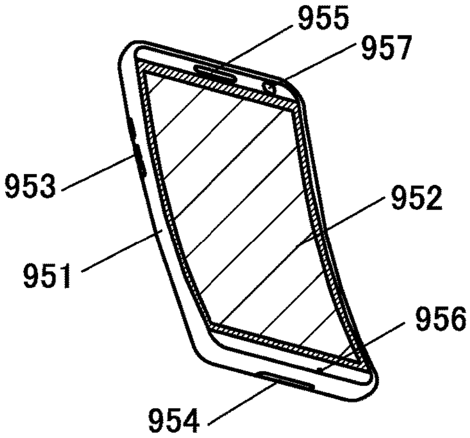

FIG. 38(E) is an example of a cellular phone, which includes a housing 951, a display portion 952, an operation button 953, an external connection port 954, a speaker 955, a microphone 956, a camera 957, and the like. The display portion 952 of the cellular phone includes a touch sensor. A variety of operations such as making a call and inputting text can be performed by touch on the display portion 952 with a finger, a stylus, or the like. The display portion 952 can be formed using the laser processing apparatus or the stack processing apparatus of one embodiment of the present invention.

Figure 38F:
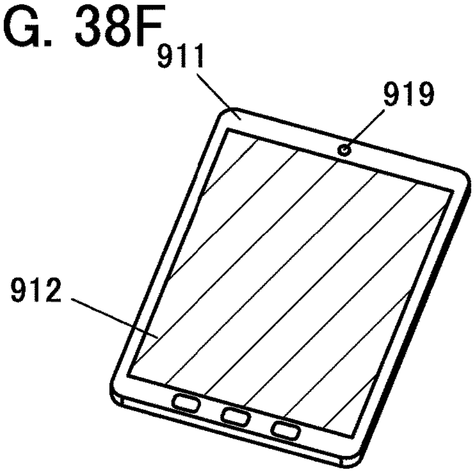

FIG. 38(F) is a portable data terminal, which includes a housing 911, a display portion 912, a camera 919, and the like. Input and output of information can be performed by a touch panel function of the display portion 912. The display portion 932 can be formed using the laser processing apparatus or the stack processing apparatus of one embodiment of the present invention.

At least part of this embodiment can be implemented in combination with any of the other embodiments described in this specification as appropriate.

REFERENCE NUMERALS

10*a* laser processing apparatus
10*b* laser processing apparatus
10*c* laser processing apparatus
10*d* laser processing apparatus
10*e* processing apparatus
11 chamber
12 transfer mechanism
12*b* movable portion
13 transfer mechanism
13*b* movable portion
14 rotation mechanism
14*b* movable portion
15 fixing mechanism
15*b* stage
16 ball screw mechanism
17 light-blocking mechanism
18 shielding plate
19 motor
20 laser oscillator
21 optical system unit
22 mirror
23 lens
24 quartz window
25 laser light
26 laser light
27 linear beam
28 jig
29 motor
30 object to be processed
30*a* member
30*b* member
30*c* member
31 region to be processed
35 substrate
36 structure body
37 substrate
38 layer
40 auxiliary jig
41 frame
42 suction portion
43 opening
45 omission
45*a* cassette
45*b* cassette
46 bearing
47 plasma generation mechanism
48 shower plate
49 stage
51 transfer chamber
52 load/unload chamber
53 unload chamber
54 plasma treatment chamber
60 transfer mechanism
61 raising and lowering mechanism
62 joint mechanism
63 arm
64 arm
65 reversal mechanism
65*a* support portion
65*b* rotation portion
66 fork

67 adsorption mechanism
70 pixel array
75 pixel unit
76 pixel
76B display element
76G display element
76R display element
77 pixel
77B display element
77G display element
77R display element
79 light
100 flexible display device
111 substrate
112 resin layer
113 insulating layer
114 element layer
117 insulating layer
120 stack
121 substrate
122 resin layer
123 insulating layer
124 functional layer
125 insulating layer
129 light diffusion plate
130 stack
131 element layer
132 adhesive layer
133*a* alignment film
133*b* alignment film
134 coloring layer
135 coloring layer
136 light-blocking layer
140 polarizing plate
141 substrate
142 adhesive layer
143 adhesive layer
151 substrate
160 laser light
171 separation layer
172 separation layer
173 separation layer
175 resin layer
191 conductive layer
192 EL layer
193*a* conductive layer
193*b* conductive layer
201 transistor
204 connection portion
205 transistor
206 transistor
207 connection portion
211 insulating layer
212 insulating layer
213 insulating layer
214 insulating layer
215 insulating layer
216 insulating layer
217 insulating layer
220 insulating layer
221 conductive layer
222 conductive layer
223 conductive layer
224 conductive layer
231 semiconductor layer
242 connection layer
243 connector
251 opening
252 connection portion
300 display panel
311 electrode
311*a* conductive layer
311*b* conductive layer
312 liquid crystal
313 conductive layer
340 liquid crystal element
351 substrate
352 substrate
360 light-emitting element
360*b* light-emitting element
360*g* light-emitting element
360*r* light-emitting element
360*w* light-emitting element
361 substrate
362 display portion
364 circuit
365 wiring
366 input device
372 FPC
373 IC
400 display device
410 pixel
451 opening
510*a* laser processing apparatus
510*b* processing apparatus
510*c* laser processing apparatus
511 chamber
520 laser oscillator
521 optical system unit
522 lens
523*a* mirror
523*b* mirror
523*c* mirror
524 quartz window
525 laser light
526 laser light
527 linear beam
528 jig
529 motor
530 object to be processed
530*a* member
531 region to be processed
535 substrate
537 substrate
538 layer
540 roller unit
541 frame
542 roller
542*b* roller
543 rotation axis
543*b* rotation axis
544 rotation mechanism
550 roller unit
551 frame
552 roller
553 rotation axis
554 rotation mechanism
555 bearing
556 raising and lowering mechanism
557 cylinder portion
558 rod portion
559 bearing
560 transfer mechanism
561 transfer chamber

562 load chamber
563 load chamber
564 unload chamber
565 unload chamber
566*a* cassette
566*b* cassette
566*c* cassette
566*d* cassette
601 region
602 region
901 housing
902 display portion
903 display portion
904 sensor
911 housing
912 display portion
919 camera
931 housing
932 display portion
933 wristband
935 button
936 crown
939 camera
951 housing
952 display portion
953 operation button
954 external connection port
955 speaker
956 microphone
957 camera
961 housing
962 shutter button
963 microphone
965 display portion
966 operation key
967 speaker
968 zoom lever
969 lens
971 housing
973 display portion
974 operation key
975 speaker
976 communication connection terminal
977 optical sensor

The invention claimed is:

1. A laser processing apparatus comprising:
a chamber comprising:
a first movement mechanism;
a second movement mechanism over the first movement mechanism;
a rotation mechanism over the second movement mechanism; and
a stage over the rotation mechanism; and
a laser irradiation mechanism,
wherein the first movement mechanism comprises a first movable portion capable of performing reciprocating linear motion in a first direction,
wherein the first movable portion is fixed to the second movement mechanism,
wherein the second movement mechanism comprises a second movable portion capable of performing reciprocating linear motion in a second direction being orthogonal to the first direction,
wherein the second movable portion is fixed to the rotation mechanism,
wherein the rotation mechanism comprises a third movable portion having a center axis of rotation in a perpendicular direction,
wherein the stage has a rectangular top surface having a first side and a second side orthogonal to each other,
wherein the laser irradiation mechanism is configured to perform irradiation with a linear beam on the stage,
wherein a direction of a short axis of the linear beam is parallel to the first direction,
wherein a direction of a long axis of the linear beam is parallel to the second direction,
wherein the center axis of the third movable portion and a center of the top surface of the stage overlap with each other,
wherein a length of the long axis of the linear beam is smaller than a length of the first side and a length of the second side,
wherein a movable range of the first movable portion is ½ or less of the length of the first side, and
wherein a movable range of the second movable portion is ½ or less of the length of the second side.

2. The laser processing apparatus according to claim 1, wherein the movable range of the second movable portion is ¼ of the length of the second side.

3. The laser processing apparatus according to claim 1,
wherein the movable range of the first movable portion is ½ of the length of the first side, and
wherein the movable range of the second movable portion is ¼ of the length of the second side.

4. The laser processing apparatus according to claim 1,
wherein the movable range of the first movable portion is ½ of the length of the first side, and
wherein the movable range of the second movable portion is ½ of the length of the second side.

5. The laser processing apparatus according to claim 1, wherein a floor area of the chamber is less than 3.2 times as large as an area of the stage.

6. A laser processing apparatus comprising:
a chamber comprising:
a first movement mechanism;
a second movement mechanism over the first movement mechanism;
a rotation mechanism over the second movement mechanism; and
a stage over the rotation mechanism; and
a laser irradiation mechanism,
wherein the first movement mechanism comprises a first movable portion capable of performing reciprocating linear motion in a first direction,
wherein the first movable portion is fixed to the second movement mechanism,
wherein the second movement mechanism comprises a second movable portion capable of performing reciprocating linear motion in a second direction being orthogonal to the first direction,
wherein the second movable portion is fixed to the rotation mechanism,
wherein the rotation mechanism comprises a third movable portion having a center axis of rotation in a perpendicular direction,
wherein the stage has a rectangular top surface having a first side and a second side orthogonal to each other,
wherein the laser irradiation mechanism is configured to perform irradiation with a linear beam on the stage,
wherein a direction of a short axis of the linear beam is parallel to the first direction, wherein a direction of a long axis of the linear beam is parallel to the second direction, wherein the center axis of the third movable portion and a center of the top surface of the stage overlap with each other, wherein a length of the long axis of the linear beam is smaller than a length of the first side and a length of the second side, wherein a movable range of the first movable portion is larger of one of ½ or less of the length of the first side and ½ or less of the length of the second side, and wherein a movable range of the second movable portion is larger of one of ½ or less of the length of the first side and ½ or less of the length of the second side.

7. The laser processing apparatus according to claim 6, wherein the movable range of the second movable portion is larger of one of ¼ of the length of the first side and ¼ of the length of the second side.

8. The laser processing apparatus according to claim 6, wherein the movable range of the first movable portion is larger of one of ½ of the length of the first side and ½ of the length of the second side, and wherein the movable range of the second movable portion is larger of one of ¼ of the length of the first side and ¼ of the length of the second side.

9. The laser processing apparatus according to claim 6, wherein a floor area of the chamber is less than 3.2 times as large as an area of the stage.

10. A laser processing apparatus comprising:

a chamber comprising:

a first movement mechanism;

a rotation mechanism over the first movement mechanism; and a stage over the rotation mechanism; and a laser irradiation mechanism, wherein the first movement mechanism comprises a first movable portion capable of performing reciprocating linear motion in a first direction, wherein the first movable portion is fixed to the rotation mechanism, wherein the rotation mechanism comprises a second movable portion having a center axis of rotation in a perpendicular direction, wherein the stage has a rectangular top surface having a first side and a second side orthogonal to each other, wherein the laser irradiation mechanism is configured to perform irradiation with a linear beam on the stage, wherein a direction of a short axis of the linear beam is parallel to the first direction, wherein a direction of a long axis of the linear beam is a second direction being orthogonal to the first direction, wherein the center axis of the second movable portion and a center of the top surface of the stage overlap with each other, wherein a length of the long axis of the linear beam is smaller than a length of the first side and a length of the second side, and wherein a movable range of the first movable portion is larger of one of ½ or less of the length of the first side and ½ or less of the length of the second side.

11. The laser processing apparatus according to claim 10, wherein the movable range of the first movable portion is larger of one of ½ of the length of the first side and ½ of the length of the second side.

12. The laser processing apparatus according to claim 10, wherein a floor area of the chamber is less than 3.2 times as large as an area of the stage.

* * * * *